(12) United States Patent
Nakajima et al.

(10) Patent No.: US 9,912,274 B2
(45) Date of Patent: Mar. 6, 2018

(54) AC ROTATING MACHINE CONTROL DEVICE AND ELECTRIC POWER STEERING DEVICE EQUIPPED WITH SAME

(71) Applicant: Mitsubishi Electric Corporation, Tokyo (JP)

(72) Inventors: Shunsuke Nakajima, Tokyo (JP); Yuya Tsuchimoto, Tokyo (JP); Isao Kezobo, Tokyo (JP); Yoshihiko Kimpara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/109,525

(22) PCT Filed: Apr. 29, 2014

(86) PCT No.: PCT/JP2014/061922
§ 371 (c)(1),
(2) Date: Jul. 1, 2016

(87) PCT Pub. No.: WO2015/166546
PCT Pub. Date: Nov. 5, 2015

(65) Prior Publication Data
US 2016/0329849 A1    Nov. 10, 2016

(51) Int. Cl.
*H02K 17/32* (2006.01)
*H02P 21/00* (2016.01)
(Continued)

(52) U.S. Cl.
CPC .............. *H02P 21/18* (2016.02); *B62D 5/046* (2013.01); *B62D 5/049* (2013.01); *B62D 5/0484* (2013.01);
(Continued)

(58) Field of Classification Search
None
See application file for complete search history.

(56) References Cited

U.S. PATENT DOCUMENTS 8,791,659 B2 * 7/2014 Namikawa ............... H02P 6/00
318/400.01
2008/0035411 A1   2/2008 Yamashita et al.
(Continued)

FOREIGN PATENT DOCUMENTS

EP    2 282 401 A1    2/2011
EP    2 924 874 A1    9/2015
(Continued)

OTHER PUBLICATIONS

International Search Report of PCT/JP2014/061922 dated Jul. 22, 2014.
(Continued)

*Primary Examiner* — Bentsu Ro
*Assistant Examiner* — Zemenay Truneh
(74) *Attorney, Agent, or Firm* — Sughrue Mion, PLLC; Richard C. Turner

(57) ABSTRACT

This AC rotating machine control device includes: power limiting means 6 for limiting drive power supplied for driving the AC rotating machine; and power feed means 10 for, when sensor abnormality determination means 3 determines that the rotational position sensor is abnormal, on the basis of the estimated rotational position, supplying the AC rotating machine with power obtained by adding rotational position estimation power supplied for the rotational position estimation means 9 to estimate the rotational position, to the drive power limited by the power limiting means, wherein the power limiting means 6 limits drive current at least during a predetermined period since the sensor abnormality determination means 3 determines that the abnormal-
(Continued)

ity occurs until estimated error of the estimated rotational position falls within a predetermined range.

17 Claims, 18 Drawing Sheets

(51) Int. Cl.
*H02P 21/18* (2016.01)
*G01R 23/00* (2006.01)
*H02P 6/16* (2016.01)
*H02P 29/032* (2016.01)
*B62D 5/04* (2006.01)
*H02P 6/00* (2016.01)

(52) U.S. Cl.
CPC ............... *G01R 23/00* (2013.01); *H02P 6/16* (2013.01); *H02P 29/032* (2016.02); *H02P 6/00* (2013.01)

(56) References Cited

U.S. PATENT DOCUMENTS

| 2011/0035114 A1 | 2/2011 | Yoneda et al. |
| 2013/0249454 A1 | 9/2013 | Mori et al. |
| 2015/0249409 A1 | 9/2015 | Nakajima et al. |

FOREIGN PATENT DOCUMENTS

| JP | 2001-112282 A | 4/2001 |
| JP | 2008-37399 A | 2/2008 |
| JP | 2013-59258 A | 3/2013 |
| JP | 5286357 B2 | 9/2013 |
| JP | 2013-201828 A | 10/2013 |

OTHER PUBLICATIONS

European Search Report dated Dec. 7, 2017 in Patent Application No. 14890602.7.

\* cited by examiner

AC ROTATING MACHINE CONTROL DEVICE AND ELECTRIC POWER STEERING DEVICE EQUIPPED WITH SAME

CROSS REFERENCE TO RELATED APPLICATIONS

This application is a National Stage of International Application No. PCT/JP2014/061922 filed Apr. 29, 2014, the contents of which are incorporated herein by reference in their entirety.

TECHNICAL FIELD

The present invention relates to an AC rotating machine control device for continuing to drive an AC rotating machine when a rotational position sensor is abnormal, and an electric power steering device including the AC rotating machine control device.

BACKGROUND ART

Generally, in control of an AC rotating machine, in order to supply current with an appropriate phase corresponding to the rotational position of a rotor, a rotational position sensor such as an encoder, a resolver, or a Hall element is needed.

Therefore, when the rotational position sensor is abnormal, the AC rotating machine cannot be controlled, and thus it is necessary to stop an AC rotating machine.

From this viewpoint, the following technology is proposed. When the rotational position sensor is abnormal, the rotational position of the rotor is estimated without using the rotational position sensor, and a rotational position signal (hereinafter, referred to as a control angle) for controlling the AC rotating machine is switched to the estimated rotational position, thus continuing control of the AC rotating machine even when the position sensor is abnormal.

For example, in a conventional AC rotating machine control device described in Patent Document 1, when a rotational position sensor is abnormal, high-frequency limitation voltage for estimating the rotational position is applied to windings of an AC rotating machine, and on the basis of the corresponding current detected value from the AC rotating machine, the AC rotating machine is controlled without using a rotational position sensor.

Since a certain time is needed for estimating the rotational position, in a rotational position uncertain period which arises in shifting to sensorless control in which the AC rotating machine is controlled on the basis of the estimated rotational position, a rotational position obtained from an output signal of the rotational position sensor immediately before the shifting to sensorless control is used for the sensorless control during a period immediately after the shifting to sensorless control, thus solving the problem.

Here, abnormalities in the rotational position sensor include abnormality of the rotational position sensor itself, and disconnection abnormality of a signal line or a feed line of the rotational position sensor.

CITATION LIST

Patent Document

Patent Document 1: Japanese Laid-Open Patent Publication No. 2013-59258

SUMMARY OF THE INVENTION

Problems to be Solved by the Invention

In the conventional AC rotating machine control device described in Patent Document 1, power for estimating the rotational position is supplied to the AC rotating machine, and the estimated rotational position is calculated on the basis of response thereto from the AC rotating machine. Therefore, a certain time is needed for estimating the rotational position, and a rotational position uncertain period arises in shifting to sensorless control in which the AC rotating machine is controlled on the basis of the estimated rotational position.

Therefore, in the conventional invention, the rotational position obtained from an output signal of the rotational position sensor immediately before shifting to sensorless control is used for the sensorless control during a period immediately after the shifting to sensorless control.

However, in the case where the AC rotating machine rotates in the rotational position uncertain period, since the rotational position immediately before the rotational position sensor signal becomes abnormal is different from the actual rotational position of the AC rotating machine, during the period, there is an uncertain error between the control angle used in control of the AC rotating machine, and the actual rotational position, and the error is up to 180 degrees.

In addition, since abnormality of the rotational position sensor abruptly occurs, it cannot always be said that the AC rotating machine is not rotating when the abnormality occurs.

That is, even in the case where the rotational position obtained from an output signal of the rotational position sensor immediately before the rotational position sensor becomes abnormal is used for the control angle, a period since the AC rotating machine control device has determined that the rotational position sensor is abnormal until the rotational position is estimated is still a rotational position uncertain period, and during this period, the AC rotating machine cannot be controlled using an appropriate control angle.

Further, it takes some time since the rotational position sensor has actually become abnormal until the AC rotating machine control device determines that the rotational position sensor is abnormal. Therefore, the rotational position uncertain period is prolonged by this time.

Meanwhile, before and after occurrence of abnormality of the rotational position sensor, the usage purpose of the AC rotating machine does not change and the same function is required. Therefore, as represented by the conventional AC rotating machine control device described in Patent Document 1, current on the torque axis supplied to the AC rotating machine at the time of shifting to sensorless control is continuous from that immediately before the shifting to sensorless control. Therefore, in the case where torque axis current is fed to the AC rotating machine immediately before the rotational position sensor becomes abnormal, and an error between the control angle and the actual rotational position at the time of shifting to sensorless control is 90 degrees or greater, reverse torque occurs which acts in the direction opposite to desire torque.

Here, the magnitude of the reverse torque increases as an error between the control angle and the actual rotational position increases, and the magnitude of the reverse torque increases as current in the AC rotating machine increases.

The reverse torque continues during a period since estimation of the rotational position is started until the estimated rotational position in which the error is at least not greater than 90 degrees is calculated, in addition to the rotational position uncertain period.

The reverse torque causes the AC rotating machine to perform unintended operation, thus hampering smooth shifting to sensorless control.

In the case where the AC rotating machine control device calculates a torque axis current command using a status amount according to the speed or output torque of the AC rotating machine, the hamper due to the reverse torque further increases.

For example, in a general electric power steering device, if steering torque from a driver increases, a torque command to the AC rotating machine increases, and the direction of the torque command is the same as the steering torque.

Therefore, if such reverse torque occurs in the state in which a driver increases turn of a steering wheel, the steering torque for increasing turn of the steering wheel by the driver is further increased due to the reverse torque, and as a result, the torque command further increases. Thus, a negative chain arises in which the reverse torque increases and continues. Therefore, a strange feeling to the driver increases.

In the case where error between the control angle and the actual rotational position at the time of shifting to sensorless control is great, desired voltages on two rotational axes are applied in wrong directions different from the actual rotational axes of the AC rotating machine, whereby unintended current occurs in the AC rotating machine. This current increases as the voltages on two rotational axes increase.

Therefore, in the case where error between the control angle and the actual rotational position is great, the current in the AC rotating machine is great, and induced voltage in the AC rotating machine, i.e., the rotation speed is great, overcurrent occurs, whereby the AC rotating machine or a drive circuit for the AC rotating machine may fail.

When the AC rotating machine or the drive circuit of the AC rotating machine fails, the AC rotating machine needs to be stopped, and therefore it is impossible to shift to sensorless control and continue to drive the AC rotating machine.

The present invention has been made to solve the above problem, and an object of the present invention is to, in an AC rotating machine control device that continues to drive the AC rotating machine on the basis of an estimated rotational position when the rotational position sensor is abnormal, reduce reverse torque or prevent failure of the AC rotating machine and a drive circuit for the AC rotating machine due to overcurrent, at the time of shifting to sensorless control in which the AC rotating machine is controlled on the basis of the estimated rotational position.

Solution to the Problems

An AC rotating machine control device according to the present invention includes: an AC rotating machine; a rotational position sensor for detecting a rotational position of the AC rotating machine; sensor abnormality determination means for performing determination as to abnormality of the rotational position sensor; rotational position estimation means for calculating an estimated rotational position of the AC rotating machine when the rotational position sensor is determined to be abnormal; power limiting means for limiting drive power supplied for driving the AC rotating machine; and power feed means for, when the sensor abnormality determination means determines that the rotational position sensor is abnormal, on the basis of the estimated rotational position, supplying the AC rotating machine with power obtained by adding rotational position estimation power supplied for the rotational position estimation means to estimate the rotational position, to the drive power limited by the power limiting means, wherein the power limiting means limits the drive power at least during a predetermined period since the sensor abnormality determination means determines that the abnormality occurs until estimated error of the estimated rotational position falls within a predetermined range.

Another AC rotating machine control device according to the present invention includes: an AC rotating machine; a rotational position sensor for detecting a rotational position of the AC rotating machine; sensor abnormality determination means for performing determination as to abnormality of the rotational position sensor; rotational position estimation means for calculating an estimated rotational position of the AC rotating machine when the rotational position sensor is determined to be abnormal; power limiting means for limiting drive power supplied for driving the AC rotating machine; and power feed means for, when the sensor abnormality determination means determines that the rotational position sensor is abnormal, on the basis of the estimated rotational position, supplying the AC rotating machine with power obtained by adding rotational position estimation power supplied for the rotational position estimation means to estimate the rotational position, to the drive power limited by the power limiting means, wherein, after the sensor abnormality determination means detects the abnormality, the power limiting means starts to limit the drive power by a time when the sensor abnormality determination means determines that the abnormality occurs, and limits the drive power at least during a predetermined period that allows estimated error of the estimated rotational position to fall within a predetermined range.

Another AC rotating machine control device according to the present invention includes: an AC rotating machine; a rotational position sensor for detecting a rotational position of the AC rotating machine; sensor abnormality determination means for performing determination as to abnormality of the rotational position sensor; rotational position estimation means for calculating an estimated rotational position of the AC rotating machine when the rotational position sensor is determined to be abnormal; power limiting means for limiting drive power supplied for driving the AC rotating machine; induced voltage acquiring means for acquiring induced voltage of the AC rotating machine; and power feed means for, when the sensor abnormality determination means determines that the rotational position sensor is abnormal, on the basis of the estimated rotational position, supplying the AC rotating machine with the drive power limited by the power limiting means, wherein the power limiting means limits the drive power since the sensor abnormality determination means determines that the abnormality occurs at least until the induced voltage of the AC rotating machine becomes equal to or smaller than a predetermined value.

Another AC rotating machine control device according to the present invention includes: an AC rotating machine; a rotational position sensor for detecting a rotational position of the AC rotating machine; sensor abnormality detection means for determining that the rotational position sensor is abnormal, when abnormality of the rotational position sensor has been continuously detected for a predetermined determination period; rotational position estimation means for calculating an estimated rotational position of the AC rotating machine when the rotational position sensor is determined to be abnormal; power limiting means for limiting drive power supplied for driving the AC rotating machine; induced voltage acquiring means for acquiring induced voltage of the AC rotating machine; and power feed means for, when the sensor abnormality determination means determines that the rotational position sensor is abnormal, on the basis of the estimated rotational position, supplying the AC rotating machine with the drive power limited by the power limiting means, wherein, after the sensor abnormality determination means detects the abnormality, the power limiting means starts to limit the drive power by a time when the sensor abnormality determination means determines that the abnormality occurs, and limits the drive power at least until the induced voltage of the AC rotating machine becomes equal to or smaller than a predetermined value.

Effect of the Invention

According to the present invention, in the AC rotating machine control device and the electric power steering device including the AC rotating machine control device which continue to drive the AC rotating machine on the basis of the estimated rotational position when the rotational position sensor is abnormal, at the time of shifting to sensorless control in which the AC rotating machine is controlled on the basis of the estimated rotational position, the drive power for the AC rotating machine is limited at least until a predetermined period for allowing estimated error of the estimated rotational position to fall within a predetermined range elapses. Therefore, while the magnitude of torque required for the AC rotating machine equally before and after occurrence of abnormality is intentionally reduced, the period of the reduction is minimized, and reverse torque acting in the direction opposite to desired torque of the AC rotating machine can be eliminated or failure of the AC rotating machine or the drive circuit for the AC rotating machine due to overcurrent can be prevented, thus providing a significant effect that could not be obtained conventionally.

In addition, according to the present invention, in the AC rotating machine control device and the electric power steering device including the AC rotating machine control device which continue to drive the AC rotating machine on the basis of the estimated rotational position when the rotational position sensor is abnormal, at the time of shifting to sensorless control in which the AC rotating machine is controlled on the basis of the estimated rotational position, the drive power for the AC rotating machine is limited at least until induced voltage of the AC rotating machine becomes equal to or smaller than a predetermined value. Therefore, failure of the AC rotating machine or the drive circuit for the AC rotating machine due to overcurrent can be prevented, thus providing a significant effect that could not be obtained conventionally.

DESCRIPTION OF EMBODIMENTS

Embodiment 1

Figure 1:
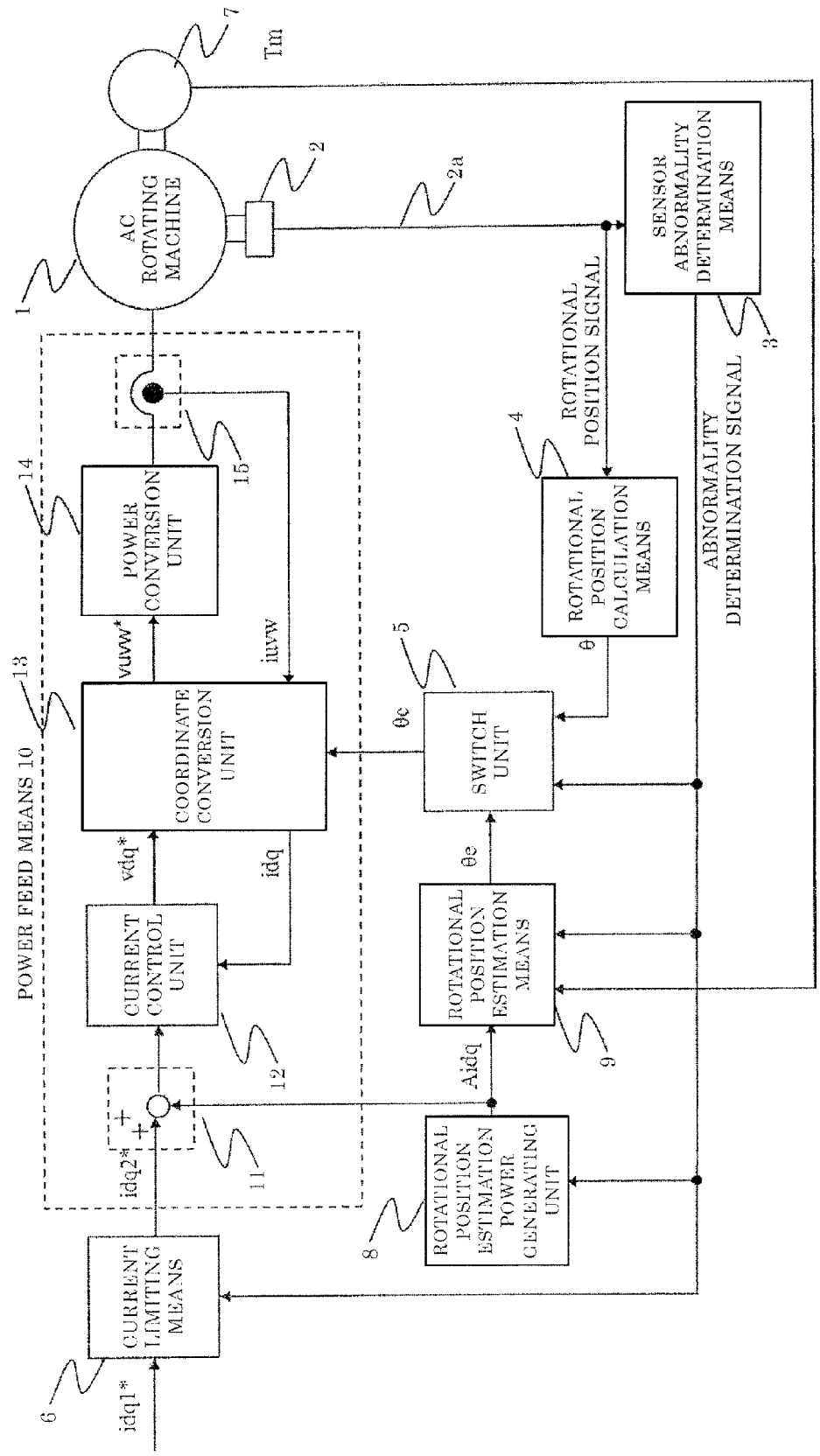
FIG. 1 is a diagram showing the entire configuration of an AC rotating machine control device in embodiment 1 of the present invention.

FIG. 1 is a diagram showing the entire configuration of an AC rotating machine control device in embodiment 1 of the present invention.

The first axis of the two rotational axes of an AC rotating machine 1 is set in the direction of the same phase as a rotor magnetic flux of the AC rotating machine 1, and the second axis of the two rotational axes is set in the direction orthogonal to the first axis of the two rotational axes. The first axis is referred to as d-axis and the second axis is referred to as q-axis.

In FIG. 1, the AC rotating machine 1 has three-phase windings (U phase, V phase, W phase) and is driven by AC voltage applied to the windings.

Instead of being composed of three-phase windings, the AC rotating machine 1 may be composed of a different number of windings from the three-phase windings.

A rotational position sensor 2 detects the rotational position of the AC rotating machine 1, and outputs a rotational position signal containing rotational position information to sensor abnormality determination means 3 and rotational position calculation means 4 via a signal line 2a.

On the basis of the rotational position signal, the sensor abnormality determination means 3 detects abnormality of the rotational position sensor 2, and if the abnormality has been continuously detected for a predetermined period, determines that the rotational position sensor 2 is abnormal. The sensor abnormality determination means 3 stores an abnormality detection status of the rotational position sensor 2 and an abnormality determination result, in an abnormality determination signal, and outputs the abnormality determination signal to a switch unit 5, current limiting means 6, a rotational position estimation power generating unit 8, and rotational position estimation means 9.

The abnormality determination signal indicates normality if the rotational position sensor 2 is not determined to be abnormal, and indicates abnormality if the rotational position sensor 2 is determined to be abnormal.

The predetermined period for the sensor abnormality determination means 3 to determine that the rotational position sensor 2 is abnormal is provided in order to prevent the rotational position sensor from being erroneously determined to be abnormal due to noise in the rotational position signal or the like even though the rotational position sensor 2 is normal. The predetermined period is set to such a period that is long enough to allow abnormality of the rotational position sensor 2 to be definitely determined without being erroneously determined, and that is short enough to, when abnormality actually occurs in the rotational position sensor 2, allow the influence of the abnormality to fall within a tolerable range.

Here, the sensor abnormality determination means may be configured to determine that the rotational position sensor 2 is abnormal if the accumulated number of times abnormality is detected is equal to or larger than a predetermined number of times. The method for determining that the rotational position sensor 2 is abnormal when abnormality is detected is not limited.

For example, a signal indicating a period since abnormality of the rotational position sensor 2 is detected until the rotational position sensor 2 is determined to be abnormal may be included, or a signal indicating a time when abnormality of the rotational position sensor 2 is detected may be included.

The sensor abnormality determination means 3 may determine abnormality of the rotational position sensor 2 by a known method. For example, in the case where the rotational position sensor 2 is a resolver, by monitoring a signal introduced to a signal line of the resolver, abnormality of the resolver, disconnection abnormality of the signal line, and ground abnormality of the signal line can be detected.

More specifically, the signal line 2a between the resolver and the AC rotating machine control device may be connected to a power supply potential via a pull-up resistor, or may be connected to a ground potential via a pull-down resistor.

In this case, if the signal line 2a is disconnected, a signal (sine signal or cosine signal) from the resolver is no longer introduced to the signal line 2a, and instead, the signal line 2a is fixed at the power supply potential or the ground potential.

Accordingly, the sensor abnormality determination means 3 can determine whether the resolver is abnormal (including abnormality of the signal line), by determining whether the signal line 2a is fixed at the power supply potential or the ground potential.

Here, another method may be used for determination as to abnormality of the rotational position sensor 2. The rotational position sensor 2 may be other than a resolver.

The rotational position calculation means 4 may calculate a rotational position θ on the basis of the rotational position signal outputted from the rotational position sensor 2.

On the basis of the abnormality determination signal, the switch unit 5 selects an estimated rotational position θe if the abnormality determination signal indicates abnormality, or selects the rotational position θ if the abnormality determination signal indicates normality, and then outputs the selected one as a control angle θc.

The current limiting means 6 limits current commands idq1* on d-q axes, thereby eliminating reverse torque and preventing overcurrent at the time of shifting to sensorless control in which the AC rotating machine 1 is controlled on the basis of the estimated rotational position when the rotational position sensor 2 has become abnormal.

Specifically, on the basis of the abnormality determination signal, the current limiting means 6 limits the magnitudes of current commands id1* and iq1* (hereinafter, collectively referred to as idq1*) on d-q axes which are current commands for driving the AC rotating machine 1, by a d-q axis current limiting value idqlim which is set at a positive value or zero, and outputs the resultant commands as current commands id2* and iq2* (hereinafter, collectively referred to as idq2*) on d-q axes.

Specifically, if the absolute value of the current command id1* on d-axis is greater than the d-q axis current limiting value idqlim, the sign of the current command id2* on d-axis becomes the same as that of the current command id1* on d-axis, and the magnitude thereof becomes the same as the d-q axis current limiting value idqlim.

On the other hand, if the absolute value of the current command id1* on d-axis is equal to or smaller than the d-q axis current limiting value idqlim, the current command id2* on d-axis is the same as the current command id1* on d-axis.

The current command iq2* on q-axis is calculated on the basis of the current command iq1* on q-axis and the d-q axis current limiting value idqlim, as in the current command id2* on d-axis.

In the case where the limitation is not needed, the d-q axis current limiting value idqlim is set to be greater than the rated current of the AC rotating machine 1.

The method for limiting the current commands idq1* on d-q axes by the current limiting means 6, i.e., the method for setting the d-q axis current limiting value idqlim will be described later.

Here, although the magnitudes of the current commands id1* and iq1* on d-q axes are limited by the d-q axis current limiting value idqlim set at a positive value or zero, the current commands id1* and iq1* on d-q axes may be limited by a current limiting value set at a positive or negative value. The method for limiting the current commands id1* and iq1* on d-q axes is not limited.

The torque detection means 7 detects output torque Tm of the AC rotating machine 1 and outputs the output torque Tm to the rotational position estimation means 9.

If the abnormality determination signal indicates abnormality, the rotational position estimation power generating unit 8 generates high-frequency currents Aid and Aiq (hereinafter, collectively referred to as Aidq) on d-q axes, and outputs the same to the rotational position estimation means 9 and power feed means 10.

If the abnormality determination signal indicates normality, the high-frequency currents Aidq on d-q axes are set at zero.

However, in the case where sound, vibration, and the like due to the high-frequency current being superimposed are tolerated when the rotational position sensor 2 is not abnormal, the high-frequency current may be outputted even when the rotational position sensor 2 is not abnormal.

Here, the high-frequency currents Aidq on d-q axes are sinewaves having the same amplitude and frequency and orthogonal to each other, as represented by Mathematical 1.

In Mathematical 1, A denotes the amplitude of a high-frequency wave, wh denotes the angular frequency of the high-frequency wave, and t denotes time.

$$Aid = A\cos(wh \times t)$$
$$Aiq = A\sin(wh \times t) \quad \text{[Mathematical 1]}$$

The high-frequency currents Aidq on d-q axes are supplied for calculating the estimated rotational position θe in the rotational position estimation means 9. The high-frequency amplitude A is set to such a value that an influence on operation of the AC rotating machine 1 due to the current commands idq1* on d-q axes is sufficiently small.

In order that an output torque high-frequency wave Tmhf which is a high-frequency component, i.e., an angular frequency wh component, of the output torque Tm is to be based on only the superimposed high-frequency currents Aidq on d-q axes, the angular frequency wh is set to a value sufficiently greater than a frequency component contained in the current commands idq1* on d-q axes before high-frequency wave addition.

In the present embodiment 1, the high-frequency currents Aid and Aiq on d-q axes are sinewaves orthogonal to each other. However, the high-frequency currents Aidq on d-q axes may have a different waveform such as a trapezoidal wave, a rectangular wave, a triangular wave, or a saw-tooth wave, and the type of the waveform is not limited.

If the abnormality determination signal indicates abnormality, the rotational position estimation means 9 calculates the estimated rotational position θe on the basis of response in the output torque Tm with respect to the high-frequency currents Aidq on d-q axes.

The power feed means 10 is composed of a high-frequency superimposing unit 11, a current control unit 12, a coordinate conversion unit 13, a power conversion unit 14, and a current detection unit 15. On the basis of the current commands idq2* on d-q axes, the high-frequency currents aidqh* on d-q axes, and the control angle θc, the power feed means 10 applies, to the AC rotating machine 1, such three-phase AC voltages as to cause d-axis current and q-axis current supplied to the AC rotating machine 1 to respectively coincide with values obtained by adding the high-frequency currents Aidq on d-q axes to the current commands idq2* on d-q axes.

Next, the internal configuration of the power feed means 10 will be described.

The high-frequency superimposing unit 11 adds the high-frequency currents Aid and Aiq on d-q axes to the current commands id2* and iq2* on d-q axes, and outputs the resultant values as high-frequency superimposed current commands id3* and iq3* (hereinafter, collectively referred to as idq3*) on d-q axes.

On the basis of the high-frequency superimposed current commands id3* and iq3* on d-q axes and the detected currents id and iq on d-q axes, the current control unit 12 calculates such voltage commands vd* and vq* (hereinafter, collectively referred to as vdq*) on d-q axes as to cause the detected currents id and iq on d-q axes to respectively coincide with the high-frequency superimposed current commands id3* and iq3* on d-q axes.

On the basis of the control angle θc, the coordinate conversion unit 13 performs coordinate conversion of three-phase detected currents iu, iv, iw (hereinafter, collectively referred to as iuvw) into the detected currents idq on d-q axes, and outputs the detected currents idq to the current control unit 12. In addition, on the basis of the control angle θc, the coordinate conversion unit 13 converts the voltage commands vdq* on d-q axes to three-phase voltage commands vu*, vv*, vw* (hereinafter, collectively referred to as vuvw*), and outputs the three-phase voltage commands to the power conversion unit 14.

The power conversion unit 14 applies three-phase AC voltages based on the three-phase AC voltage commands vuvw*, to the AC rotating machine 1.

The current detection unit 15 detects three-phase detected currents iuvw supplied from the power conversion unit 14 to the AC rotating machine 1.

Thus, on the basis of the current commands idq2* on d-q axes, the high-frequency currents Aidq on d-q axes, and the control angle θc, the power feed means 10 applies the three-phase AC voltages vuvw* to the AC rotating machine 1 so as to supply the high-frequency superimposed current commands idq3* on d-q axes to the AC rotating machine 1.

Here, in the case where there is error in the control angle θc relative to the rotational position of the AC rotating machine 1, error occurs in the coordinate conversion, and therefore the high-frequency superimposed current commands idq3* on d-q axes are supplied on orthogonal coordinate axes that are rotated by an amount corresponding to the error in the control angle θc from the actual d-q axes of the AC rotating machine 1.

Figure 2:
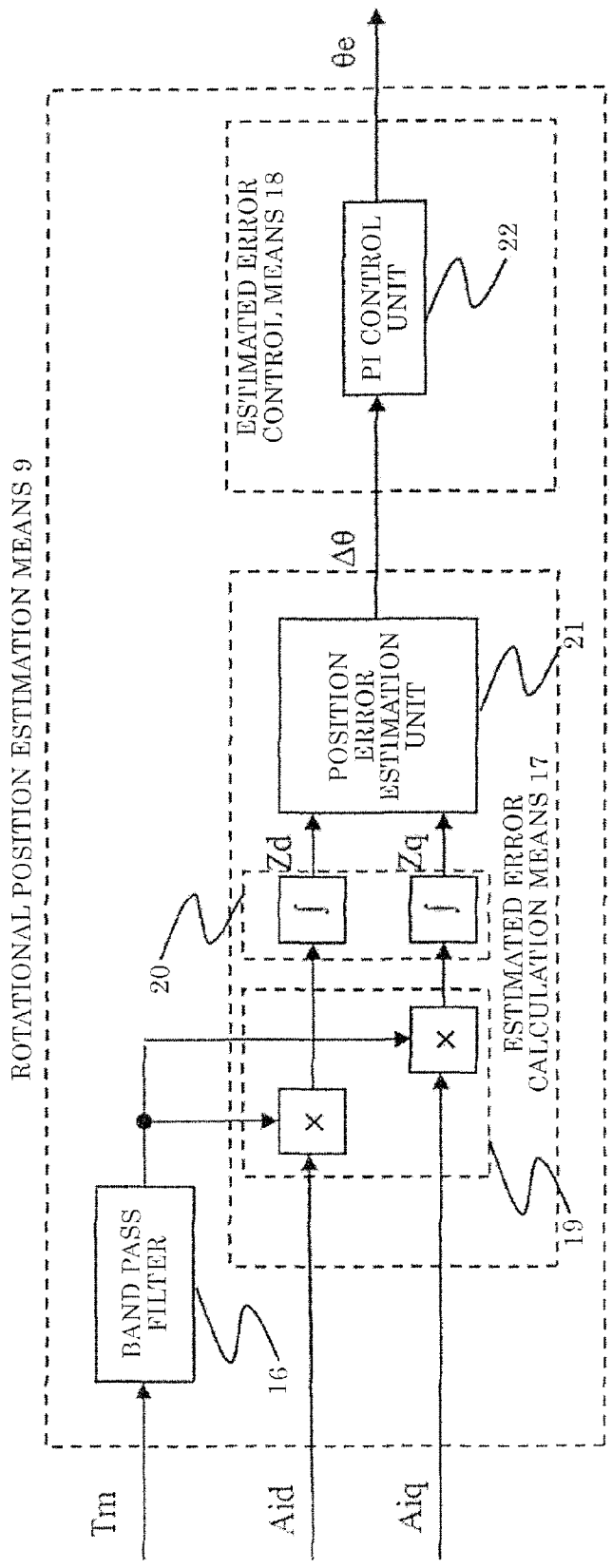
FIG. 2 is a diagram showing the configuration of rotational position estimation means 9 in embodiment 1 of the present invention.

FIG. 2 is a diagram showing the configuration of the rotational position estimation means 9. Hereinafter, the internal configuration of the rotational position estimation means 9 will be described.

A band pass filter 16 extracts only a signal having a frequency near that of the high-frequency currents Aidq on d-q axes, from the output torque Tm outputted from the torque detection means 7, and outputs the extracted signal as the output torque high-frequency wave Tmhf.

On the basis of the high-frequency currents Aidq on d-q axes and the output torque high-frequency wave Tmhf, estimated error calculation means 17 calculates the rotational position estimated error Δθ which is a positional difference between the actual d-q axes based on the actual rotational position of the AC rotating machine 1, and estimated d-q axes based on the estimated rotational position θe.

Here, the estimated error calculation means 17 is composed of a multiplication unit 19, an integration unit 20, and a position error estimation unit 21. The multiplication unit 19 multiplies each of the high-frequency currents Aid and Aiq on d-q axes by the output torque high-frequency wave Tmhf, and outputs the resultant products Pd and Pq on d-q axes. The integration unit 20 integrates the products Pd and Pq on d-q axes with respect to time over an interval corresponding to one cycle of the high-frequency currents Aidq on d-q axes, and outputs correlation values Zd and Zq on d-q axes. The position error estimation unit 21 calculates the arc tangent of a value obtained by dividing the correlation value Zd on d-axis by the correlation value Zq on q-axis, and outputs the arc tangent as the rotational position estimated error $\Delta\theta$.

Estimated error control means 18 is composed of a PI control unit 22, and calculates such an estimated rotational position $\theta$e as to cause the rotational position estimated error $\Delta\theta$ to be zero.

Although the estimated error control means 18 calculates the estimated rotational position $\theta$e by the PI control unit 22, the estimated error control means 18 may calculate the estimated rotational position by, for example, adding the rotational position estimated error $\Delta\theta$ to the previous calculated value of the estimated rotational position to correct the previous calculated value. The method for the calculation is not limited.

Thus, the rotational position estimation means 9 calculates the estimated rotational position $\theta$e of the AC rotating machine 1 on the basis of the output torque Tm outputted from the torque detection means 7 and the high-frequency currents Aidq on d-q axes supplied from the power feed means 10 to the AC rotating machine 1.

With the configuration as described above, when the rotational position sensor is abnormal, the AC rotating machine control device supplies high-frequency power to the AC rotating machine, estimates the rotational position of the AC rotating machine on the basis of a high-frequency component contained in output torque of the AC rotating machine and a high-frequency component corresponding to the high-frequency power, and controls the AC rotating machine on the basis of the rotational position, wherein the current commands idq1* on d-q axes which correspond to drive power for the AC rotating machine are limited, thereby eliminating reverse torque or overcurrent at the time of shifting to sensorless control in which the AC rotating machine is controlled on the basis of the estimated rotational position when abnormality has occurred in the rotational position sensor.

Hereinafter, the principle of estimation of the rotational position of the AC rotating machine 1 by the rotational position estimation means 9 when the abnormality determination signal indicates abnormality under the above configuration will be described.

As described above, when the abnormality determination signal indicates abnormality, the power feed means 10 supplies power to the AC rotating machine 1 on the basis of the estimated rotational position $\theta$e estimated by the rotational position estimation means 9. Thus, the high-frequency currents Aidq on d-q axes are to be respectively supplied on the estimated d-q axes of the AC rotating machine 1.

Figure 3:
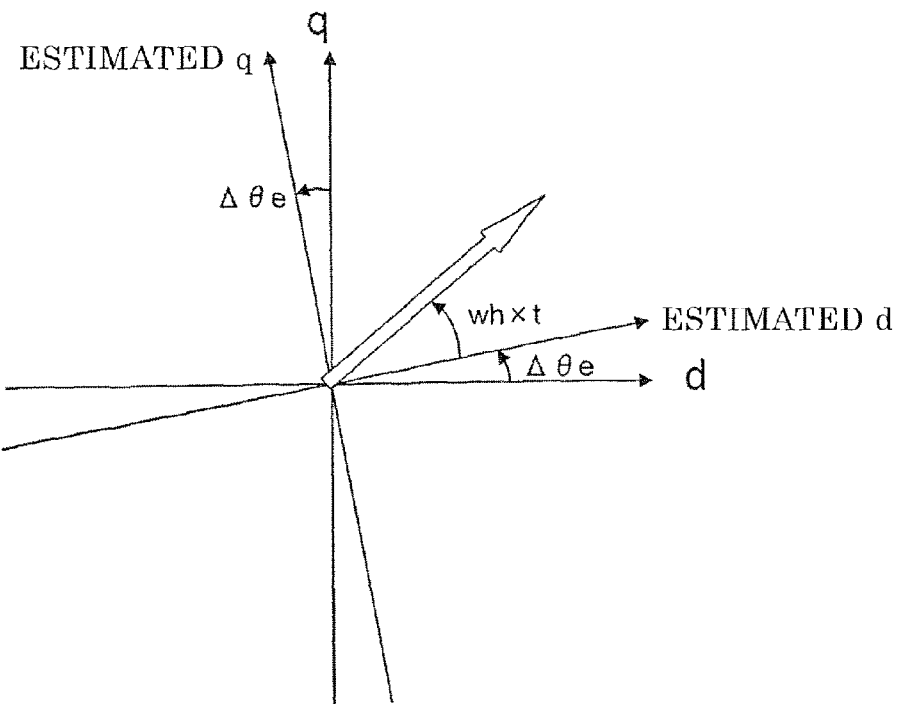
FIG. 3 is a diagram showing a phase relationship among a combined vector of high-frequency currents Aid and Aiq on d-q axes, estimated d-q axes on which high-frequency currents Aid and Aiq on d-q axes are supplied, and the actual d-q axes, in embodiment 1 of the present invention.

FIG. 3 shows a phase relationship among a combined vector of the high-frequency currents Aid and Aiq on d-q axes supplied on the estimated d-q axes, the estimated d-q axes on which the high-frequency currents Aidq on d-q axes are supplied, and the actual d-q axes based on the actual rotational position of the AC rotating machine 1, in which a phase difference between the estimated d-q axes and the actual d-q axes is defined as a rotational position error $\Delta\theta$e.

As is found from FIG. 2, high-frequency currents Aidr and Aiqr (hereinafter, collectively referred to as Aidqr) supplied on the actual d-q axes are represented by Mathematical 2.

$Aidr = A\cos(wh \times t + \Delta\theta e)$ $Aiqr = A\sin(wh \times t + \Delta\theta e)$      Mathematical 2

Therefore, output torque Tm' of the AC rotating machine 1 based on the high-frequency currents Aidq on d-q axes is represented by Mathematical 3.

Here, Pm, $\phi$, Ld, and Lq in Mathematical 3 are values indicating the characteristics of the AC rotating machine 1. Pm denotes a pole pair number, $\phi$ denotes an induced voltage constant, and Ld and Lq respectively denote a d-axis component and a q-axis component of an inductance.

$$\begin{aligned} Tm' &= Pm\phi Aiqr + Pm(Ld - Lq)AidrAiqr \quad \text{[Mathematical 3]}\\ &= Pm\phi A\sin(wh \times t + \Delta\theta e) +\\ &\quad Pm(Ld - Lq)A\cos(wh \times t +\\ &\quad \Delta\theta e)A\sin(wh \times t + \Delta\theta e)\\ &= APm\phi\sin(wh \times t + \Delta\theta e) + A^2 Pm(Ld - Lq)\\ &\quad \sin(2wh \times t + 2\Delta\theta e) \end{aligned}$$

Since the angular frequency wh of the high-frequency currents Aidq on d-q axes is sufficiently greater than frequency components contained in the current commands id1* and iq1* on d-q axes before high-frequency wave addition, the output torque high-frequency wave Tmhf calculated by the band pass filter 16 is based on only the high-frequency currents Aid and Aiq on d-q axes.

Therefore, the output torque high-frequency wave Tmhf outputted from the band pass filter 16 which extracts a component near the frequency of the high-frequency currents Aid and Aiq on d-q axes, i.e., the angular frequency wh, from the output torque Tm, is represented by Mathematical 4.

$Tmhf = APm\phi \sin(wh \times t + \Delta\theta e)$      Mathematical 4

As is found from Mathematical 1 and Mathematical 4, a phase difference between the high-frequency current Aiq on q-axis and the output torque high-frequency wave Tmhf is the rotational position error $\Delta\theta$e.

That is, by superimposing the high-frequency currents Aid and Aiq on d-q axes onto the estimated d-q axes and calculating the phase difference between the high-frequency current Aiq on q-axis and the output torque high-frequency wave Tmhf, the rotational position estimated error $\Delta\theta$e can be calculated.

Therefore, in the rotational position estimation means 9, by the band pass filter 16, only a component near the angular frequency wh of the output torque is extracted to calculate the output torque high-frequency wave Tmhf, and by the estimated error calculation means 17, the phase difference between the output torque high-frequency wave Tmhf and the high-frequency current Aiq on q-axis is calculated on the basis of a cross-correlation function between the output torque high-frequency wave Tmhf and each of the high-frequency currents Aid and Aiq on d-q axes superimposed on the estimated d-q axes, and is outputted as the rotational position estimated error $\Delta\theta$.

Hereinafter, a process for calculating the rotational position estimated error $\Delta\theta$ in the estimated error calculation means 17 will be described.

First, as shown in Mathematical 5, by the multiplication unit 19, a product of the output torque high-frequency wave Tmfh represented by Mathematical 4 and the high-frequency current Aid on d-axis represented by Mathematical 1 is calculated, and then, by the integration unit 20, is integrated with respect to time, thereby calculating the cross-correlation function between the output torque high-frequency wave Tmfh and the high-frequency current Aid on d-axis and calculating a correlation value Zd on d-axis.

Here, in the rotational position estimation means 9, the rotational position error Δθe in Mathematical 1 and Mathematical 4 is treated as the rotational position estimated error Δθ, and the rotational position error Δθe in Mathematical 1 and Mathematical 4 is replaced with the rotational position estimated error Δθ.

$$Zd = \int_{t1}^{t2} Aid \times Tmhf \, dt \qquad \text{[Mathematical 5]}$$
$$= \int_{t1}^{t2} A\cos(wh \times t) \times$$
$$APm\phi \sin(wh \times t + \Delta\theta) \, dt$$
$$= \frac{\pi}{wh} A^2 Pm\phi \sin\Delta\theta$$

In order to properly calculate the correlation between the output torque high-frequency wave Tmfh and the high-frequency current Aid on d-axis, the integration interval in the integration unit 20 needs to be an integer multiple of the cycle of the high-frequency currents Aid and Aiq on d-q axes. In the present embodiment 1, in order to improve response of the correlation value Zd on d-axis with respect to variation in the output torque high-frequency wave Tmfh, the integration interval is set to one cycle of the high-frequency currents Aid and Aiq on d-q axes, t2 in Mathematical 5 is set to the present time as of integration calculation, and t1 is set as shown by Mathematical 6.

$$t1 = t2 - \frac{2\pi}{wh} \qquad \text{[Mathematical 6]}$$

Similarly, as shown by Mathematical 7, by the multiplication unit 19 and the integration unit 20, the cross-correlation function between the output torque high-frequency wave Tmfh and the high-frequency current Aiq on q-axis is calculated and the correlation value Zq on q-axis is calculated.

$$Zq = \int_{t1}^{t2} Aiq \times Tmhf \, dt \qquad \text{[Mathematical 7]}$$
$$= \int_{t1}^{t2} A\sin(wh \times t) \times$$
$$APm\phi \sin(wh \times t + \Delta\theta) \, dt$$
$$= \frac{\pi}{wh} A^2 Pm\phi \cos\Delta\theta$$

Subsequently, as shown by Mathematical 8, by the position error estimation unit 21, the correlation value Zd on d-axis is divided by the q-axis correlation value Zq, and the arc tangent of the resultant value is calculated, whereby the rotational position estimated error Δθ can be calculated.

$$\arctan\left(\frac{Zd}{Zq}\right) = \arctan\left(\frac{\frac{\pi}{wh} A^2 Pm\phi \sin\Delta\theta}{\frac{\pi}{wh} A^2 Pm\phi \cos\Delta\theta}\right) \qquad \text{[Mathematical 8]}$$
$$= \arctan(\tan\Delta\theta)$$
$$= \Delta\theta$$

By the above principle, the estimated error calculation means 17 calculates the phase difference between the output torque high-frequency wave Tmhf and the high-frequency current Aiq on q-axis on the basis of the output torque high-frequency wave Tmhf and the high-frequency currents Aid and Aiq on d-q axes, and outputs the phase difference as the rotational position estimated error Δθ.

Further, in the rotational position estimation means 9, by the PI control unit 22 in the estimated error control means 18, the rotational position estimated error Δθ outputted from the estimated error calculation means 17 is subjected to calculation shown by Mathematical 9, and the calculation result is outputted as the estimated rotational position θe to the power feed means 10 via the switch unit 5.

In Mathematical 9, s is Laplace operator, and KP and KI are constants. KP and KI need to be set so that the PI control unit 22 calculates such an estimated rotational position θe as to cause the rotational position estimated error Δθ to be zero.

$$\theta e = KP\Delta\theta + KI\frac{\Delta\theta}{s} \qquad \text{[Mathematical 9]}$$

Thus, by the rotational position estimation means 9, the rotational position of the rotor can be estimated on the basis of: the output torque high-frequency wave Tmhf caused by supplying the high-frequency currents Aidq on d-q axes onto the estimated d-q axes of the AC rotating machine 1; and the high-frequency currents Aidq on d-q axes, without using a position sensor.

Here, the output torque high-frequency wave Tmhf of the AC rotating machine 1 according to the high-frequency currents Aidq on d-q axes occurs without being influenced by the rotation rate of the AC rotating machine 1. Therefore, the rotational position estimation means 9 can estimate the rotational position of the AC rotating machine 1 irrespective of the rotation rate of the AC rotating machine 1, and thus, particularly, during low-speed rotation or in a stopped state, the rotational position θ can be estimated with high accuracy.

Even in the case where the AC rotating machine 1 is non-salient, that is, the inductances Ld and Lq of the AC rotating machine 1 coincide with each other, the output torque high-frequency wave Tmhf derived from the output torque Tm' represented by Mathematical 3 is obviously the same as that represented by Mathematical 4.

Therefore, the rotational position estimation means 9 can estimate the rotational position of the AC rotating machine 1 irrespective of whether or not the AC rotating machine 1 has saliency.

Further, since the output torque high-frequency wave Tmhf of the AC rotating machine 1 according to the high-frequency currents Aidq on d-q axes arises irrespective of whether or not magnetic saturation occurs in the AC rotating machine 1, the rotational position estimation means 9 can estimate the rotational position of the AC rotating machine 1 irrespective of whether or not magnetic saturation occurs in the AC rotating machine 1.

The current control unit 12 operates so that the detected currents id and iq on d-q axes respectively coincide with the high-frequency superimposed current commands id3* and iq3* on d-q axes. Therefore, the high-frequency superimposed current commands id3* and iq3* on d-q axes are equal to the detected currents id and iq on d-q axes.

Therefore, instead of calculating the estimated rotational position θe on the basis of the high-frequency currents Aid and Aiq on d-q axes which are current commands, the rotational position estimation means 9 may extract an angular frequency wh component from the detected currents idq on d-q axes which are detected currents, to calculate high-frequency detected currents on d-q axes, and may calculate the estimated rotational position θe on the basis of the high-frequency detected currents on d-q axes, whereby the same effect can be obtained.

However, the calculation amount increases by an amount corresponding to the calculation of the angular frequency wh component of the detected currents id and iq on d-q axes. Therefore, the case where the rotational position estimation means 9 calculates the rotational position θ on the basis of the high-frequency currents Aidq on d-q axes which are current commands as in the present embodiment 1 has a greater advantage in the calculation processing load.

Although the high-frequency power to be superimposed by the power feed means 10 and the high-frequency power used in calculation by the rotational position estimation means 9 are currents, these high-frequency powers may be voltages.

In this case, instead of adding the high-frequency currents Aid and Aiq on d-q axes to the current commands id2* and iq2* on d-q axes, the power feed means 10 may add high-frequency voltages Avd and Avq on d-q axes to the voltage commands vd* and vq* on d-q axes, and the rotational position estimation means 9 may calculate the rotational position θ on the basis of the high-frequency voltages Avd and Avq on d-q axes instead of the high-frequency currents Aid and Aiq on d-q axes.

However, although the phase of the high-frequency current on q-axis always coincides with the phase of the output torque high-frequency wave, as for the voltage on q-axis, a voltage component due to a d-axis direction interlinkage magnetic flux increases as the rotation rate of the AC rotating machine 1 increases. Therefore, as the rotation rate of the AC rotating machine 1 increases, the phase difference between the high-frequency voltage on q-axis and the output torque high-frequency wave increases, and error based on the phase difference arises in the rotational position θ calculated by the rotational position estimation means 9.

Therefore, as in the present embodiment 1, the configuration in which the high-frequency power to be superimposed by the power conversion unit 14 and the high-frequency power used in calculation by the rotational position estimation means are currents, allows calculation of the rotational position θ with higher accuracy, and thus is more effective.

Although the high-frequency power to be superimposed by the power feed means 10 and the high-frequency wave used in calculation by the rotational position estimation means 9 are powers in the d-axis direction and the q-axis direction, powers in any coordinate system may be used to calculate the estimated rotational position θe.

That is, for example, the power feed means 10 may be configured to superimpose an α-axis high-frequency current Ai α corresponding to an α-axis direction and a α-axis high-frequency current Ai β corresponding to a β-axis direction, on α-β axes in a coordinate system at rest with respect to the AC rotating machine 1.

Then, the rotational position estimation means 9 can calculate the estimated rotational position θe on the basis of the output torque Tm, the α-axis high-frequency current Ai α, and the β-axis high-frequency current Ai β.

In this case, the rotational position estimation power generating unit 8 generates the α-β axis high-frequency currents Ai α and Ai β which are sinewaves having the same amplitude A and frequency wh and orthogonal to each other, the power feed means 10 performs coordinate conversion of the α-β axis high-frequency currents Ai α and Ai β into high-frequency currents Aid and Aiq on d-q axes, using the control angle θc outputted from the switch unit 5, and the high-frequency superimposing unit 11 adds the high-frequency currents Aid and Aiq to the current commands id2* and iq2* on d-q axes.

In the rotational position estimation means 9, the phase difference between the α-β axes in a coordinate system at rest and the actual d-q axes can be calculated by performing the same calculation as in the estimated error calculation means 17.

Here, the phase difference between the α-β axes in a coordinate system at rest and the actual d-q axes is nothing other than the estimated rotational position θe itself.

That is, in this case, calculation corresponding to that in the estimated error control means 18 is not needed, and the estimated rotational position θe can be calculated by only the same calculation as in the estimated error calculation means 17.

For example, the power feed means 10 may be configured to superimpose u-phase high-frequency voltage Avu, v-phase high-frequency voltage Avv, and w-phase high-frequency voltage Avw having phase differences from each other by 120 degrees, on a u-phase voltage command vu*, a v-phase voltage command vv*, and a w-phase voltage command vw* in a coordinate system at rest with respect to the AC rotating machine 1.

Then, the rotational position estimation means 9 can calculate the estimated rotational position θe in the same manner on the basis of the output torque Tm, the u-phase high-frequency voltage Avu, the v-phase high-frequency voltage Avv, and the w-phase high-frequency voltage Avw.

In this case, as in the d-axis correlation value Zd shown by Mathematical 5, the estimated error calculation means 17 calculates the cross-correlation function between the output torque high-frequency wave Tmhf and each of the u-phase high-frequency voltage Avu, the v-phase high-frequency voltage Avv, and the w-phase high-frequency voltage Avw, thereby calculating a u-phase correlation value Zu, a v-phase correlation value Zv, and a w-phase correlation value Zw.

Further, the u-phase correlation value Zu, the v-phase correlation value Zv, and the w-phase correlation value Zw are converted to an α-axis correlation value Z α and a β-axis correlation value Zβ on α-β axes in an orthogonal coordinate system at rest, the α-axis correlation value Z α is divided by the β-axis correlation value Z β, and the arc tangent of the divided value (Z α/Z β) is calculated, whereby the estimated rotational position θe which is the phase difference between the α-β axes in a coordinate system at rest and the actual d-q axes can be calculated.

Although the rotational position estimation means 9 calculates the rotational position estimated error Δθ on the basis of the high-frequency currents Aidq on d-q axes having the angular frequency wh, and the output torque high-frequency wave Tmhf, as is found from Mathematical 3, the rotational position estimated error Δθ may be calculated from the correlation between a frequency component twice as high as the angular frequency wh of the output torque Tm', and two sinewaves having a frequency twice as high as the angular frequency wh and orthogonal to each other.

In this case, the band pass filter 16 may extract a frequency component twice as high as the angular frequency wh from the output torque, and the estimated error calculation means 17 may calculate the rotational position estimated error Δθ on the basis of the angular frequency component twice as high as the angular frequency wh, of the output torque, and two sinewaves having a frequency twice as high as the angular frequency wh and orthogonal to each other, instead of the output torque high-frequency wave Tmhf and the high-frequency currents Aidq on d-q axes.

Subsequently, the method for the current limiting means 6 to limit the current commands idq1* on d-q axes in the above configuration will be described.

As described above, the sensor abnormality determination means 3 detects abnormality of the rotational position sensor 2 on the basis of the rotational position signal, and if the abnormality has been continuously detected for a predetermined period, determines that the rotational position sensor 2 is abnormal.

After the sensor abnormality inversion means 3 determines that the rotational position sensor 2 is abnormal, until the rotational position estimation means 9 calculates the estimated rotational position θe, it is necessary to perform a series of processes in which the power feed means 10 supplies the high-frequency currents Aidq on d-q axes to the AC rotating machine 1, the corresponding output torque of the AC rotating machine 1 is detected by the torque detection means 7, and calculation is performed on the basis thereof.

Therefore, the period since abnormality occurs in the rotational position sensor 2 until the rotational position estimation means 9 calculates the estimated rotational position θe is a rotational position uncertain period, and in this period, error of the control angle θc relative to the actual rotational position of the AC rotating machine 1 is up to 180 degrees.

In order for the rotational position estimation means 9 to calculate the estimated rotational position θe, it is necessary to extract a component near the angular frequency wh which is a frequency component corresponding to the high-frequency currents Aidq on d-q axes, from the output torque Tm, by the band pass filter 16.

Immediately after the high-frequency currents Aidq on d-q axes are supplied to the AC rotating machine 1 by the power feed means 10, that is, immediately after the high-frequency torque arises, it takes some time until the band pass filter 16 accurately extracts the angular frequency wh component from the output torque.

Therefore, it takes a predetermined time depending on the characteristics of the band pass filter 16 since the power feed means 10 starts to supply the high-frequency currents Aidq on d-q axes until the rotational position estimation means 9 calculates the estimated rotational position θe with high accuracy.

Further, since the rotational position estimation means 9 calculates such an estimated rotational position θe as to cause the rotational position estimated error Δθ to be zero by the PI control unit 22 in the estimated error control means 18, it takes some time depending on the characteristics of the PI control unit 22 to cause the rotational position estimated error Δθ to converge to zero.

This time is prolonged as error of the control angle θc at the time when the rotational position estimation means 9 starts to calculate the estimated rotational position θe, relative to the actual rotational position of the AC rotating machine 1, increases.

At the time when the rotational position estimation means 9 starts to calculate the estimated rotational position θe, the rotational position is uncertain, and therefore it takes time for converging error of up to 180 degrees.

That is, after the rotational position estimation means 9 starts to calculate the estimated rotational position θe, it takes a predetermined time depending on the characteristics of the rotational position estimation means 9 until the rotational position estimation means 9 calculates the estimated rotational position θe in which error relative to the actual rotational position is 90 degrees or smaller so as not to cause reverse torque.

Therefore, in the period since abnormality occurs in the rotational position sensor 2 until the rotational position estimation means 9 calculates the estimated rotational position θe in which error relative to the actual rotational position is 90 degrees or smaller, if the current commands idq1* on d-q axes that are not zero are supplied to the AC rotating machine 1, reverse torque can occur.

Further, if the current commands idq1* on d-q axes during this period are great, and induced voltage, i.e., the rotation speed of the AC rotating machine 1 is great, overcurrent can occur.

Accordingly, as shown below, the current limiting means 6 limits the current commands idq1* on d-q axes, thereby eliminating reverse torque and preventing overcurrent at the time of shifting to sensorless control.

Figure 4:
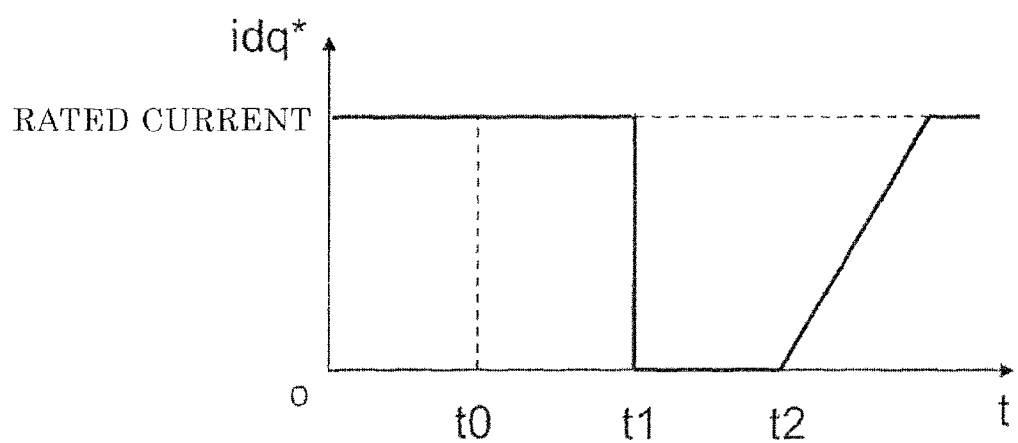
FIG. 4 is a diagram showing change in a d-q axis current limiting value idqlim in embodiment 1 of the present invention.

FIG. 4 shows the d-q axis current limiting value idqlim which is a limit value for limiting the current commands idq1* on d-q axes.

In FIG. 4, the horizontal axis indicates time, and the vertical axis indicates the d-q axis current limiting value idqlim.

In addition, t0 denotes the time at which the sensor abnormality determination means 3 detects abnormality of the rotational position sensor 2, t1 denotes the time at which the sensor abnormality determination means 3 determines that the rotational position sensor 2 is abnormal, that is, the time at which the abnormality determination signal switches from normality to abnormality, and t2 denotes the time at which a sufficient period has elapsed so that error of the estimated rotational position θe calculated by the rotational position estimation means 9 relative to the actual rotational position becomes 90 degrees or smaller.

As is found from FIG. 4, the d-q axis current limiting value idqlim is set to the rated current until time t1.

That is, the current commands idq1* on d-q axes are not limited until the time t1.

Here, a period from time t0 to time t1 is a period in which the sensor abnormality determination means 3 has detected abnormality of the rotational position sensor 2 but has not determined that the rotational position sensor 2 is abnormal, that is, abnormality of the rotational position sensor 2 has not definitely been determined.

That is, there is a case where, although the sensor abnormality determination means 3 has detected abnormality of the rotational position sensor 2, it cannot be definitely determined that the rotational position sensor 2 is actually abnormal. In such a case, if the current commands idq1* on d-q axes are set to be limited during a period from time t0 to time t1, current supplied to the AC rotating machine 1 varies to cause torque variation even though the rotational position sensor 2 is not abnormal.

Therefore, in the AC rotating machine control device in the present embodiment 1, the current commands idq1* on d-q axes are not limited during a period from time t0 to time t1.

At time t1, the d-q axis current limiting value idqlim is set to zero.

Since time t1 is the time at which the abnormality determination signal switches from normality to abnormality, time t1 can be recognized from the abnormality determination signal.

At time t1, the d-q axis current limiting value idqlim is sharply reduced from the rated current to zero, thereby swiftly reducing reverse assist and overcurrent. The d-q axis current limiting value idqlim is set to zero during a period from time t1 to time t2.

Here, time t2 is recognized as a time at which a predetermined period Δt12 has elapsed since time t1.

Time t2 is a sufficient time by which error of the estimated rotational position θe calculated by the rotational position estimation means 9 relative to the actual rotational position becomes 90 degrees or smaller. Therefore, the predetermined period Δt12 can be set in advance to a value calculated by the calculation expression represented by Mathematical 10.

$$\Delta t12 = \text{(period since rotational position estimation power is supplied until estimated rotational position is calculated)} + \text{(period since rotational position estimation is started until error converges within 90 degrees)} \quad \text{Mathematical 10}$$

In the AC rotating machine control device in the present embodiment 1, the (period since rotational position estimation power is supplied until estimated rotational position is calculated) is the longest time taken until: the high-frequency currents Aidq on d-q axes are supplied to the AC rotating machine 1 by the power feed means 10; the corresponding output torque of the AC rotating machine 1 is detected by the torque detection means 7; and then the estimated rotational position θe is calculated by the rotational position estimation means 9.

The time taken for each calculation, and the period since the high-frequency currents Aidq on d-q axes are supplied to the AC rotating machine 1 until the torque detection means 7 performs the corresponding detection, may be measured or calculated in advance.

The longest time may be set in consideration of hardware variation such as detection time variation due to the individual difference, characteristics, or aging of the torque detection means 7.

The (period since rotational position estimation is started until error converges within 90 degrees) is the longest time taken since the rotational position estimation means 9 starts to calculate the estimated rotational position θe on the basis of the rotational position signal until error between the estimated rotational position θe and the rotational position converges within 90 degrees. This period mainly depends on the response time for high-frequency wave extraction by the band pass filter 16, and on convergence response of rotational position estimated error in the PI control unit 22. In this case, considering the worst case where error between the estimated rotational position θe and the actual rotational position of the AC rotating machine is 180 degrees when the rotational position estimation means 9 starts to calculate the estimated rotational position θe, the time taken until the error of the estimated rotational position θe decreases to 90 degrees may be measured or calculated in advance.

The d-q axis current limiting value idqlim is set so as to gradually increase with time from time t2, and finally reaches the rated current.

Therefore, torque of the AC rotating machine 1 does not sharply change, and problems such as impact to a load device of the AC rotating machine 1, resonance of the AC rotating machine 1 and the load device, or hunting, due to sharp change in torque can be prevented.

However, if the slope is mild, return to the torque originally required for the AC rotating machine 1 is delayed. Therefore, the slope may be designed depending on the usage purpose of the AC rotating machine 1.

Thus, in the AC rotating machine control device having the current limiting means 6, the current commands idq1* on d-q axes which are drive power for the AC rotating machine are limited, thereby eliminating reverse torque or preventing overcurrent at the time of switching to sensorless control in which the power feed means 10 supplies power to the AC rotating machine on the basis of the estimated rotational position θe when abnormality has occurred in the rotational position sensor 2.

That is, the AC rotating machine control device in embodiment 1 of the present invention includes: an AC rotating machine; a rotational position sensor for detecting a rotational position of the AC rotating machine; sensor abnormality detection means for, when abnormality of the rotational position sensor has been continuously detected for a predetermined determination period, determining that the rotational position sensor is abnormal; rotational position estimation means for calculating an estimated rotational position of the AC rotating machine when the rotational position sensor is determined to be abnormal; power limiting means for limiting drive power supplied for driving the AC rotating machine; and power feed means for, when the sensor abnormality determination means determines that the rotational position sensor is abnormal, on the basis of the estimated rotational position, supplying the AC rotating machine with power obtained by adding rotational position estimation power supplied for the rotational position estimation means to estimate the rotational position, to the drive power limited by the power limiting means. After the sensor abnormality determination means detects the abnormality, the power limiting means starts to limit the drive power by a time when the sensor abnormality determination means determines that the abnormality occurs, and limits the drive power at least during a predetermined period that allows estimated error of the estimated rotational position to fall within a predetermined range.

Therefore, while the magnitude of torque required for the AC rotating machine equally before and after occurrence of abnormality is intentionally reduced, the period of the reduction is minimized, and reverse torque acting in the direction opposite to desired torque of the AC rotating machine can be eliminated or failure of the AC rotating machine or the drive circuit for the AC rotating machine due to overcurrent can be prevented, thus providing a significant effect that could not be obtained conventionally. Further, the AC rotating machine control device includes torque detection means for detecting output torque of the AC rotating machine, wherein the rotational position estimation power is high-frequency power, the rotational position estimation means calculates the estimated rotational position on the basis of a high-frequency component contained in the output torque and a high-frequency component corresponding to the high-frequency power. It takes some time since supply of the rotational position estimation power is started until the rotational position estimation means calculates an estimated rotational position having such small error as not to cause reverse torque or overcurrent. Therefore, the feature that, while the magnitude of torque required for the AC rotating machine equally before and after occurrence of abnormality is intentionally reduced, the period of the reduction is minimized, and reverse torque acting in the direction opposite to desired torque of the AC rotating machine is eliminated or failure of the AC rotating machine or the drive circuit for the AC rotating machine due to overcurrent is prevented, provides a further significant effect.

Further, the power limiting means limits the drive power so as to be sharply reduced to a predetermined limiting value. Therefore, reverse torque and overcurrent due to an estimated position having great error and due to large current can be swiftly reduced.

Further, the power limiting means limits the drive power so as to be gradually increased with time from the predetermined limiting value. Therefore, it is possible to prevent problems such as impact to a load device of the AC rotating machine, resonance of the AC rotating machine and the load device, and hunting, due to sharp change in torque when the drive power limited for eliminating reverse torque or preventing overcurrent is restored.

In the present embodiment 1, the sensor abnormality determination means 3 detects abnormality of the rotational position sensor 2 on the basis of the rotational position signal, and if the abnormality has been continuously detected for a predetermined period, determines that the rotational position sensor 2 is abnormal. However, on the basis of the rotational position signal, the sensor abnormality determination means 3 may determine that the rotational position sensor 2 is abnormal immediately when abnormality of the rotational position sensor is detected.

That is, the AC rotating machine control device includes: an AC rotating machine; a rotational position sensor for detecting a rotational position of the AC rotating machine; sensor abnormality determination means for performing determination as to abnormality of the rotational position sensor; rotational position estimation means for calculating an estimated rotational position of the AC rotating machine when the rotational position sensor is determined to be abnormal; power limiting means for limiting drive power supplied for driving the AC rotating machine; and power feed means for, when the sensor abnormality determination means determines that the rotational position sensor is abnormal, on the basis of the estimated rotational position, supplying the AC rotating machine with power obtained by adding rotational position estimation power supplied for the rotational position estimation means to estimate the rotational position, to the drive power limited by the power limiting means. The power limiting means limits the drive power at least during a predetermined period since the sensor abnormality determination means determines that the abnormality occurs until estimated error of the estimated rotational position falls within a predetermined range. Also in this case, as in the AC rotating machine control device in the present embodiment 1, while the magnitude of torque required for the AC rotating machine equally before and after occurrence of abnormality is intentionally reduced, the period of the reduction is minimized, and reverse torque acting in the direction opposite to desired torque of the AC rotating machine can be eliminated or failure of the AC rotating machine or the drive circuit for the AC rotating machine due to overcurrent can be prevented, thus providing a significant effect that could not be obtained conventionally.

The rotational position estimation means 9 calculates the estimated rotational position θe on the basis of response in the output torque Tm when the high-frequency current is supplied to the AC rotating machine 1. However, another rotational position estimation power may be supplied and the estimated rotational position θe may be calculated in another manner. The method therefor is not limited.

Time t2 is a sufficient time by which error of the estimated rotational position θe calculated by the rotational position estimation means 9 relative to the actual rotational position becomes 90 degrees or smaller, and the predetermined period Δt12 is composed of the (period since rotational position estimation is started until error converges within 90 degrees). However, time t2 may be a sufficient time by which error of the estimated rotational position θe calculated by the rotational position estimation means 9 relative to the actual rotational position becomes an arbitrary predetermined error or smaller, and the predetermined period Δt12 may be composed of a (period since rotational position estimation is started until error converges within arbitrary predetermined error).

In the case where error of the control angle θc is equal to or smaller than 90 degrees, torque of the AC rotating machine 1 becomes smaller than desired torque as the error increases, and in the case where the error is 90 to 180 degrees, reverse torque opposite to desired torque increases as the error increases.

Therefore, if not only reverse torque but also torque reduction cannot be tolerated, the predetermined error may be determined in accordance with such error between the control angle θc and the actual rotational position as to cause intolerable torque.

If reverse torque is tolerable to a certain extent, the predetermined error may be determined in accordance with such error between the control angle θc and the actual rotational position as to cause tolerable reverse torque.

In this case, the (period since rotational position estimation is started until error converges within predetermined error) is the longest time taken since the rotational position estimation means 9 starts to calculate the estimated rotational position θe on the basis of the rotational position signal until error between the estimated rotational position θe and the rotational position converges within the predetermined error. Considering the worst case where error between the estimated rotational position θe and the actual rotational position of the AC rotating machine is 180 degrees when the rotational position estimation means 9 starts to calculate the estimated rotational position θe, the time taken until the error of the estimated rotational position θe reduces to the predetermined error may be measured or calculated in advance.

The d-q axis current limiting value idqlim which is a limiting value for limiting the current commands idq1* on d-q axes in the current limiting means 6 is set so as to gradually increase with time from time t2. However, in the case where influence due to sharp change in torque is not a problem and it is desired to restore torque as early as possible, the d-q axis current limiting value idqlim may be set so as to sharply increase from time t2.

The (period since rotational position estimation power is supplied until estimated rotational position is calculated) and the (period since rotational position estimation is started until error converges within 90 degrees) which compose the predetermined period Δt12 during which the d-q axis current limiting value idqlim which is a limiting value for limiting the current commands idq1* on d-q axes in the current limiting means 6 is set to zero, are set to the respective longest times that can be taken. However, depending on a condition, the longest time that can be taken in the condition may be set in a switched manner.

Regarding the predetermined period $\Delta t12$ during which the d-q axis current limiting value idqlim is set to zero in the present embodiment 1, the (period since rotational position estimation power is supplied until estimated rotational position is calculated) which composes the predetermined period $\Delta t12$ can vary depending on, for example, the temperature characteristics of the torque detection means.

Therefore, for example, the temperature of the torque detection means may be detected, and depending on the temperature, the longest time of the (period since rotational position estimation power is supplied until estimated rotational position is calculated) at the temperature may be set in a switched manner.

Figure 5:
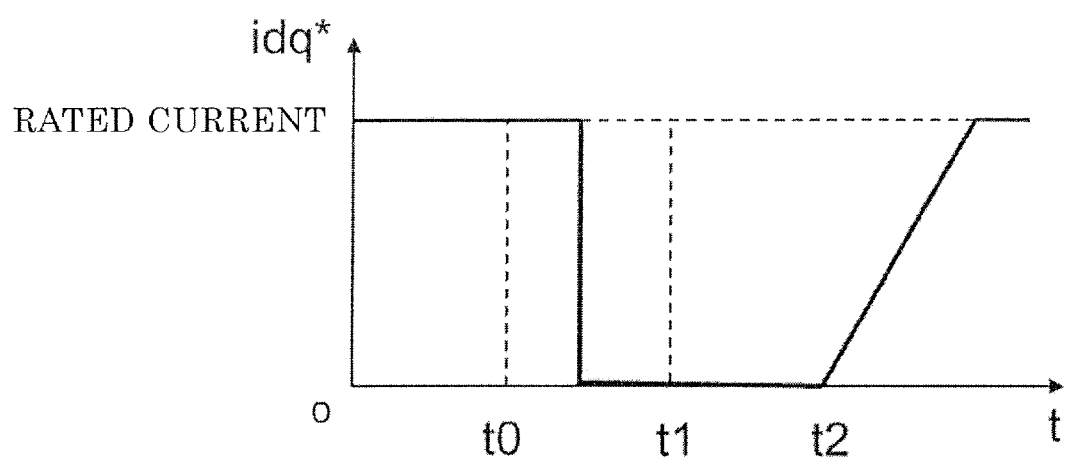
FIG. 5 is a diagram showing change in the d-q axis current limiting value idqlim in embodiment 1 of the present invention.

The d-q axis current limiting value idqlim which is a limiting value for limiting the current commands idq1* on d-q axes in the current limiting means 6 is set as shown in FIG. 4. However, as shown in FIG. 5, the d-q axis current limiting value idqlim may be set so as to perform limitation to zero between time t0 and time t1.

In this case, the sensor abnormality determination means 3 needs to output not only presence/absence of abnormality of the rotational position sensor 2 but also an abnormality detection status of the rotational position sensor 2, specifically, the duration of abnormality detection of the rotational position sensor 2.

Thus, by performing limitation to zero between time t0 and time t1, it becomes possible to eliminate reverse torque and overcurrent in the period since abnormality actually occurs in the rotational position sensor until the sensor abnormality inversion means determines that the rotational position sensor is abnormal.

However, in the case where the sensor abnormality determination means detects abnormality of the rotational position sensor but actually the rotational position sensor is not abnormal and abnormality is erroneously detected, current supplied to the AC rotating machine varies to cause torque variation even though the rotational position sensor is normal.

Figure 6:
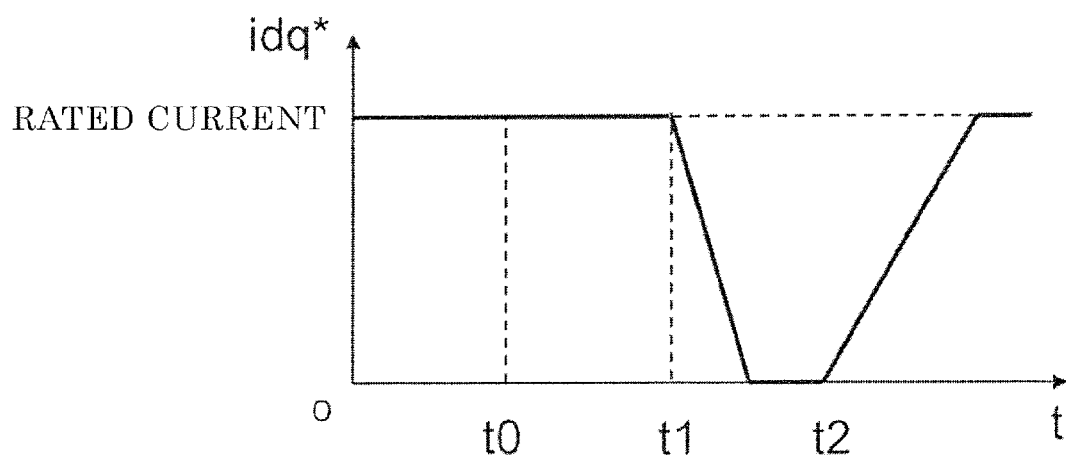
FIG. 6 is a diagram showing change in the d-q axis current limiting value idqlim in embodiment 1 of the present invention.

The d-q axis current limiting value idqlim which is a limiting value for limiting the current commands idq1* on d-q axes in the current limiting means 6 may be set so as to gradually decrease with time from the start of limitation as shown in FIG. 6.

That is, the power limiting means may limit the drive power so as to be gradually decreased with time to a predetermined limiting value. In this case, sharp change in torque of the AC rotating machine 1 can be suppressed, whereby problems such as impact to a load device of the AC rotating machine 1, resonance of the AC rotating machine 1 and the load device, or hunting, due to sharp change in torque can be prevented.

However, in the case where error of the control angle relative to the actual rotational position of the AC rotating machine 1 is great, reverse torque and overcurrent increase as the slope of the decrease becomes milder.

Figure 7:
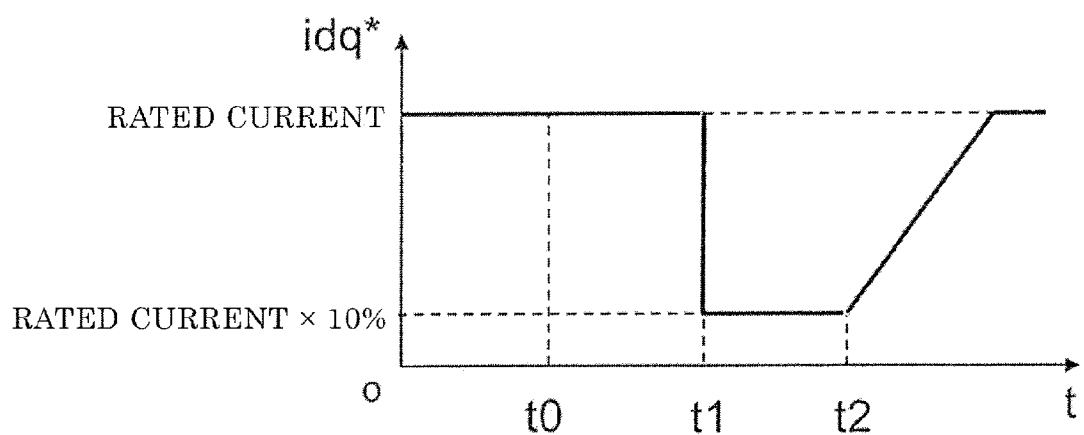
FIG. 7 is a diagram showing change in the d-q axis current limiting value idqlim in embodiment 1 of the present invention.

The d-q axis current limiting value idqlim which is a limiting value for limiting the current commands idq1* on d-q axes in the current limiting means 6 may be set so as to perform limitation to a value other than zero as shown in FIG. 7.

By limiting power supplied to the AC rotating machine 1 at the time of switching to sensorless control in which the power feed means 10 supplies power to the AC rotating machine 1 on the basis of the estimated rotational position θe when abnormality has occurred in the rotational position sensor 2, if error of the control angle relative to the actual rotational position of the AC rotating machine 1 is great during this period, reverse torque can be reduced and overcurrent can be prevented. Meanwhile, if error of the control angle is small, power to be originally supplied to the AC rotating machine 1 is limited, whereby the functionality deteriorates. Thus, there is a trade-off relationship.

Therefore, depending on usage purpose and performance of the AC rotating machine 1, the limiting value may be arbitrarily set within a tolerable range of reverse torque and a tolerable range of current.

The current limiting means 6 limits the current commands idq1* on d-q axes, to prevent reverse torque and overcurrent of the AC rotating machine 1. However, current commands on arbitrary coordinate axes rotating or at rest with respect to the AC rotating machine may be limited, or current commands for U, V, W phases in a coordinate system at rest with respect to the AC rotating machine may be limited. Thus, the current commands to be limited by the current limiting means may be on any coordinate axes.

In such a case, by limiting currents on coordinate axes as in the current command limiting manner by the current limiting means 6 in the present embodiment 1, reverse torque and overcurrent can be prevented irrespective of the coordinate axes of the current commands to be limited, and the same effect can be obtained.

However, the rotational position estimation power needs to be added to the current that has been limited by the current limiting means.

Embodiment 2

In embodiment 1, the rotational position estimation means 9 calculates the estimated rotational position θe on the basis of response in the output torque Tm when high-frequency current is supplied to the AC rotating machine 1. However, the estimated rotational position θe may be calculated by another method.

Specifically, the estimated rotational position θe may be calculated on the basis of a high-frequency component contained in detected current of the AC rotating machine when high-frequency power is supplied to the AC rotating machine.

In the present embodiment 2, in the case where high-frequency current is supplied to the AC rotating machine having saliency, in an AC rotating machine control device having known rotational position estimation means (for example, disclosed in Japanese Patent Publication No. 5069306) which is different from the rotational position estimation means 9 and which calculates the estimated rotational position θe on the basis of response in current due to difference in components on two rotating axes of the inductance of the AC rotating machine, the method for eliminating reverse torque or preventing overcurrent at the time of switching to sensorless control will be described.

Figure 8:
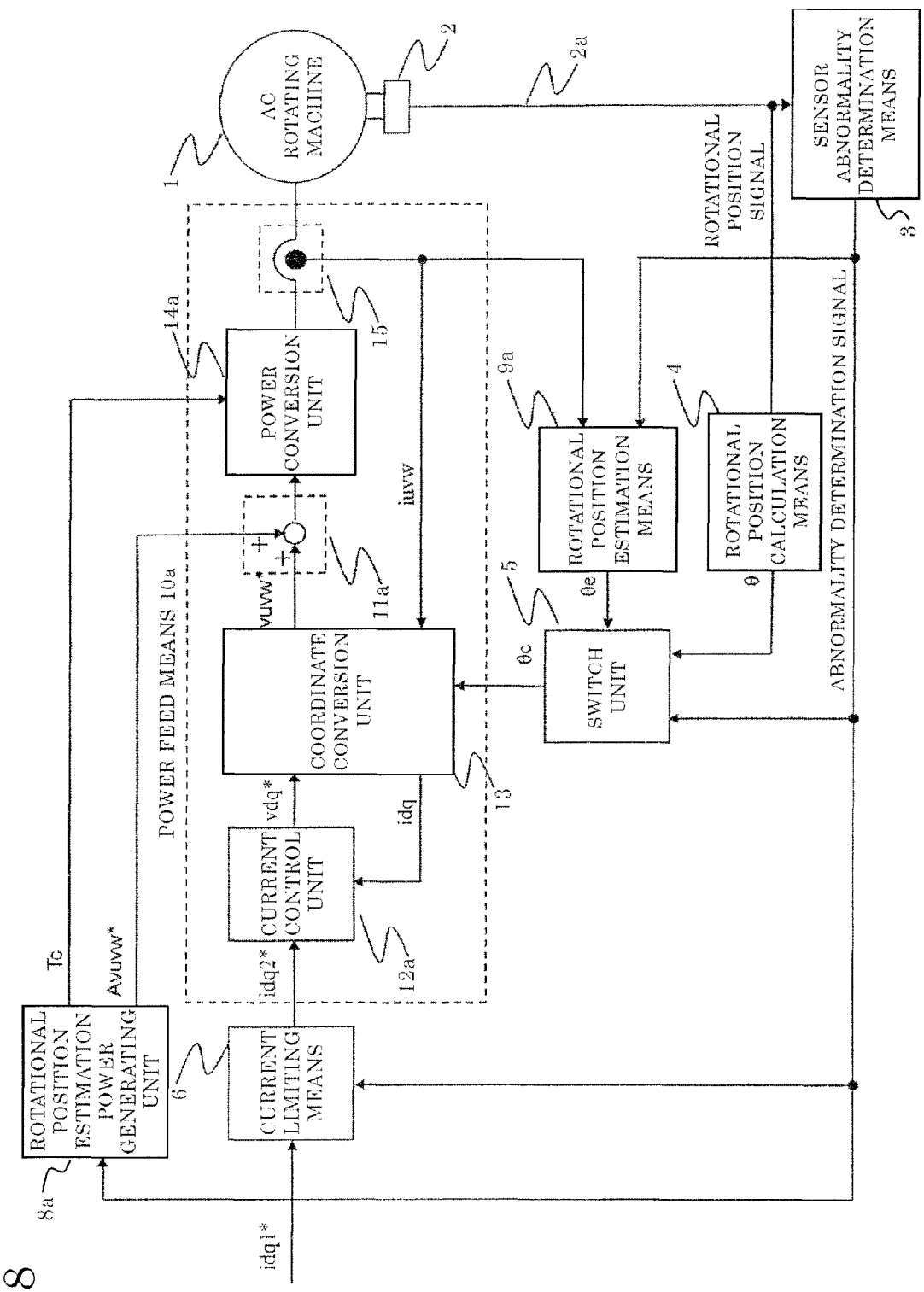
FIG. 8 is a diagram showing the entire configuration of an AC rotating machine control device in embodiment 2 of the present invention.

FIG. 8 is a diagram showing the entire configuration of an AC rotating machine control device in embodiment 2 of the present invention, in which the same reference characters as those in embodiment 1 indicate the same or corresponding components.

A rotational position estimation power generating unit 8a outputs the value of a switching cycle Tc to a power conversion unit 14a, and outputs three-phase high-frequency voltages Avu, Avv, Avw (hereinafter, collectively referred to as Avuvw) to the power conversion unit 14a.

Here, for example, as described in Japanese Patent Publication No. 5069306, the switching cycle Tc is sufficiently shorter than the cycle of a three-phase AC voltage commands vuvw* based on the current commands idq1* on d-q axes which are current commands for driving the AC rotating machine 1, and the switching cycle Tc is set in advance to an optimal value in consideration of the electric characteristics of the AC rotating machine 1, the frequency of electromagnetic noise caused by inverter driving, and the like.

The three-phase high-frequency voltages Avuvw are used for rotational position estimation means 9a to estimate the rotational position, and have a cycle m·Tc equal to m times the switching cycle Tc (m is an integer equal to or greater than 3, the reason why m is equal to or greater than 3 will be described later), and have different phases.

When the abnormality determination signal indicates abnormality, the rotational position estimation means 9a calculates the estimated rotational position θe on the basis of response in current of the AC rotating machine 1 due to application of the three-phase high-frequency voltages Avuvw.

Power feed means 10a is composed of a high-frequency superimposing unit 11a, a current control unit 12, a coordinate conversion unit 13, a power conversion unit 14a, and a current detection unit 15. On the basis of the current commands idq2* on d-q axes, the three-phase high-frequency voltages Avuvw, and the control angle θc, the power feed means 10a applies, to the AC rotating machine 1, voltages obtained by adding the three-phase high-frequency voltages Avuvw to such three-phase AC voltages as to cause d-axis current and q-axis current supplied to the AC rotating machine 1 to respectively coincide with the current commands idq2* on d-q axes.

Hereinafter, the internal configuration of the power feed means 10a will be described.

The high-frequency superimposing unit 11a adds the three-phase high-frequency voltages Avu, Avv, Avw to the three-phase voltage commands vu*, vv*, vw*, and outputs the resultant values as three-phase voltage commands vu2*, vv2*, vw2* (hereinafter, collectively referred to as vuvw2*) to the power conversion unit 14a.

Here, the reason why m is an integer equal to or greater than 3 as described above is that, if m is 1 or 2, the three-phase high-frequency voltages Avu, Avv, Avw having the cycle m·Tc equal to m times the switching cycle Tc cannot be made to have phase differences, and therefore the estimated rotational position θe cannot be accurately calculated by the rotational position estimation means 9a.

Thus, the three-phase high-frequency voltages Avu, Avv, Avw are respectively superimposed on the three-phase voltage commands vu*, vv*, vw* by the high-frequency superimposing unit 11a, and the resultant commands are applied to the AC rotating machine 1.

In this case, a voltage vector that is a vector sum of the three-phase high-frequency voltages Avu, Avv, Avw becomes not alternating voltage but rotating voltage.

The alternating voltage is such voltage that a voltage vector that is a vector sum of the three-phase AC voltages for the phases is applied in two or less directions in one cycle of the three-phase AC voltages.

The rotating voltage is such voltage that a voltage vector that is a vector sum of the three-phase AC voltages for the phases is applied in three or more directions in one cycle of the three-phase AC voltages.

On the basis of the high-frequency superimposed current commands id2* and iq2* on d-q axes and the detected currents id and iq on d-q axes, a current control unit 12a calculates such voltage commands vd* and vq* on d-q axes (hereinafter, collectively referred to as vdq*) as to cause the detected currents id and iq on d-q axes to respectively coincide with the high-frequency superimposed current commands id2* and iq2* on d-q axes, and outputs the voltage commands to the high-frequency superimposing unit 11a.

Figure 9:
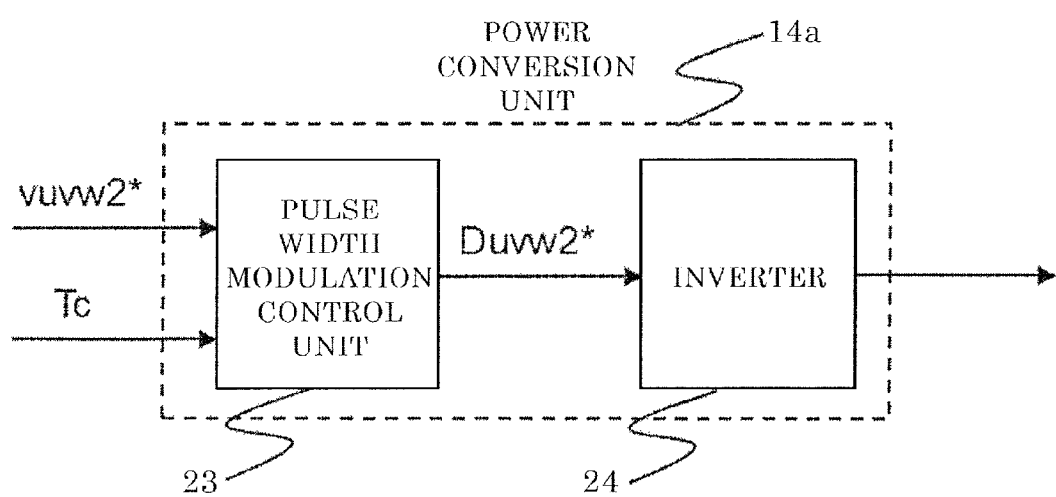
FIG. 9 is a diagram showing the configuration of a power conversion unit 14a in embodiment 2 of the present invention.

FIG. 9 is a diagram showing the configuration of the power conversion unit 14a.

The power conversion unit 14a is composed of a pulse width modulation control unit 23 and an inverter 24.

The pulse width modulation control unit generates logic signals Du, Dv, Dw subjected to pulse width modulation on the basis of the three-phase voltage commands vu2*, vv2*, vw2* outputted from the high-frequency superimposing unit 11a and the value of the switching cycle Tc outputted from the rotational position estimation power generating unit 8a.

The inverter 24 applies voltages to respective windings of the AC rotating machine 1 on the basis of the logic signals Du, Dv, Dw outputted from the pulse width modulation control unit 23.

Here, as the pulse width modulation control method, for example, a known pulse width modulation control method using a triangular wave as a carrier signal may be used.

In this case, for example, the cycle of the triangular wave is set to twice the switching cycle Tc outputted from the rotational position estimation power generating unit 8a.

Thus, the power conversion unit 14a applies the three-phase voltage commands vu2*, vv2*, vw2* to the AC rotating machine 1 on the basis of the three-phase voltage commands vu2*, vv2*, vw2* and the switching cycle Tc.

Here, the logic signals Du, Dv, Dw in the pulse width modulation control unit 23 may be calculated by another known method.

With the configuration as described above, when the rotational position sensor is abnormal, the AC rotating machine control device supplies high-frequency power to the AC rotating machine, estimates the rotational position of the AC rotating machine on the basis of a high-frequency component contained in the detected current of the AC rotating machine, and controls the AC rotating machine on the basis of the rotational position, thereby eliminating reverse torque or overcurrent at the time of shifting to sensorless control in which the AC rotating machine is controlled on the basis of the estimated rotational position.

Here, the method for the rotational position estimation means 9a to calculate the estimated rotational position θe on the basis of a high-frequency component contained in the detected current of the AC rotating machine when high-frequency power is supplied to the AC rotating machine will be described.

The rotational position estimation means 9a may calculate the estimated rotational position θe on the basis of response in current due to difference in components on two rotating axes of the inductance of the AC rotating machine when high-frequency current is supplied to the AC rotating machine having saliency, by a known method disclosed in Japanese Patent Publication No. 5069306.

The rotational position estimation means 9a calculates the estimated rotational position θe on the basis of response in current when: the rotational position estimation power generating unit 8a outputs the three-phase high-frequency voltages Avuvw which are used for the rotational position estimation means 9a to estimate the rotational position and which have the cycle m·Tc equal to m times the switching cycle Tc (m is an integer equal to or greater than 3, the reason why m is equal to or greater than 3 will be described later) and have different phases; and the three-phase high-frequency voltages Avuvw are applied by the power feed means 10a. However, the estimated rotational position θe may be calculated by another method on the basis of response in current due to difference in components on two rotating axes of the inductance when high-frequency power is supplied to the AC rotating machine 1 having saliency.

Subsequently, the method for the current limiting means 6 to limit the current commands idq1* on d-q axes in the above configuration will be described.

The current limiting means 6 limits the current commands idq1* on d-q axes by the same method as in the current limiting means 6 in embodiment 1 of the present invention, thereby eliminating reverse torque and preventing overcurrent at the time of shifting to sensorless control.

In the AC rotating machine control device in the present embodiment 2, the longest time taken until: the three-phase high-frequency voltages Avu, Avv, Avw are applied to the AC rotating machine 1 by the power feed means 10a; the corresponding three-phase detected currents iuvw of the AC rotating machine 1 are detected by the current detection unit 15; and then the rotational position estimation means 9a calculates the estimated rotational position θe, may be set as the (period since rotational position estimation power is supplied until estimated rotational position is calculated) in Mathematical 10.

In addition, the longest time taken until error of the estimated rotational position θe calculated by the rotational position estimation means 9a decreases to 90 degrees, may be set as the (longest period since rotational position estimation is started until error converges within 90 degrees).

As described above, in the AC rotating machine control device having the current limiting means 6, even in the case where high-frequency power is supplied to the AC rotating machine and the estimated rotational position θe is calculated on the basis of a high-frequency component contained in the detected current of the AC rotating machine, the current commands idq1* on d-q axes which are drive power for the AC rotating machine are limited, thereby eliminating reverse torque or preventing overcurrent at the time of switching to sensorless control in which the power feed means 10a supplies power to the AC rotating machine on the basis of the estimated rotational position θe when abnormality has occurred in the rotational position sensor 2.

That is, the AC rotating machine control device in embodiment 2 of the present invention includes: an AC rotating machine; a rotational position sensor for detecting a rotational position of the AC rotating machine; sensor abnormality detection means for, when abnormality of the rotational position sensor has been continuously detected for a predetermined determination period, determining that the rotational position sensor is abnormal; rotational position estimation means for calculating an estimated rotational position of the AC rotating machine when the rotational position sensor is determined to be abnormal; power limiting means for limiting drive power supplied for driving the AC rotating machine; and power feed means for, when the sensor abnormality determination means determines that the rotational position sensor is abnormal, on the basis of the estimated rotational position, supplying the AC rotating machine with power obtained by adding rotational position estimation power supplied for the rotational position estimation means to estimate the rotational position, to the drive power limited by the power limiting means. After the sensor abnormality determination means detects the abnormality, the power limiting means starts to limit the drive power by a time when the sensor abnormality determination means determines that the abnormality occurs, and limits the drive power at least during a predetermined period that allows estimated error of the estimated rotational position to fall within a predetermined range. The AC rotating machine has saliency. Current detection means for acquiring detected current of the AC rotating machine is provided. The rotational position estimation power is high-frequency power. The rotational position estimation means calculates the estimated rotational position on the basis of a high-frequency component contained in the detected current. It takes some time since supply of the rotational position estimation power is started until the rotational position estimation means calculates an estimated rotational position having such small error as not to cause reverse torque or overcurrent. Therefore, the feature that, while the magnitude of torque required for the AC rotating machine equally before and after occurrence of abnormality is intentionally reduced, the period of the reduction is minimized, and reverse torque acting in the direction opposite to desired torque of the AC rotating machine is eliminated or failure of the AC rotating machine or the drive circuit for the AC rotating machine due to overcurrent is prevented, provides a further significant effect.

Embodiment 3

In embodiment 1, the rotational position estimation means 9 calculates the estimated rotational position θe on the basis of response in the output torque Tm when high-frequency current is supplied to the AC rotating machine 1. However, the estimated rotational position may be calculated by another method.

Specifically, such voltage as to short-circuit windings of the AC rotating machine may be supplied, and the estimated rotational position θe may be calculated on the basis of the detected current of the AC rotating machine.

Initial estimated rotational position estimation means may be provided which calculates the initial value of the estimated rotational position θe to be calculated by the rotational position estimation means, that is, a value used immediately after switching to sensorless control, and drive power for the AC rotating machine may be limited in accordance with each rotational position estimation means, thereby eliminating reverse torque or preventing overcurrent at the time of switching to sensorless control.

In this case, the initial rotation estimation means calculates the rotational position with small error in a shorter time than the time for the rotational position estimation means 9 to calculate the estimated rotational position θe with small error. Therefore, the period during which drive power is limited for eliminating reverse torque or preventing overcurrent can be set to be shorter, and the AC rotating machine can output desired torque earlier.

Accordingly, in the present embodiment 3, in the AC rotating machine control device including, in addition to the rotational position estimation means 9 in embodiment 1, initial estimated rotational position estimation means for calculating the initial value of the estimated rotational position θe to be calculated by the rotational position estimation means 9, the method for eliminating reverse torque or preventing overcurrent at the time of switching to sensorless control will be described.

Further, in the AC rotating machine control device including known rotational position estimation means (for example, Japanese Patent Publication No. 3636340) which is different from the rotational position estimation means 9 and which applies voltage corresponding to such rotational position estimation power as to short-circuit windings of the AC rotating machine and calculates the estimated rotational position from current of the AC rotating machine at this time on the basis of the relationship between voltage and current of the AC rotating machine when windings of the AC rotating machine are short-circuited, the method for eliminating reverse torque or preventing overcurrent at the time of switching to sensorless control will be described.

Figure 10:
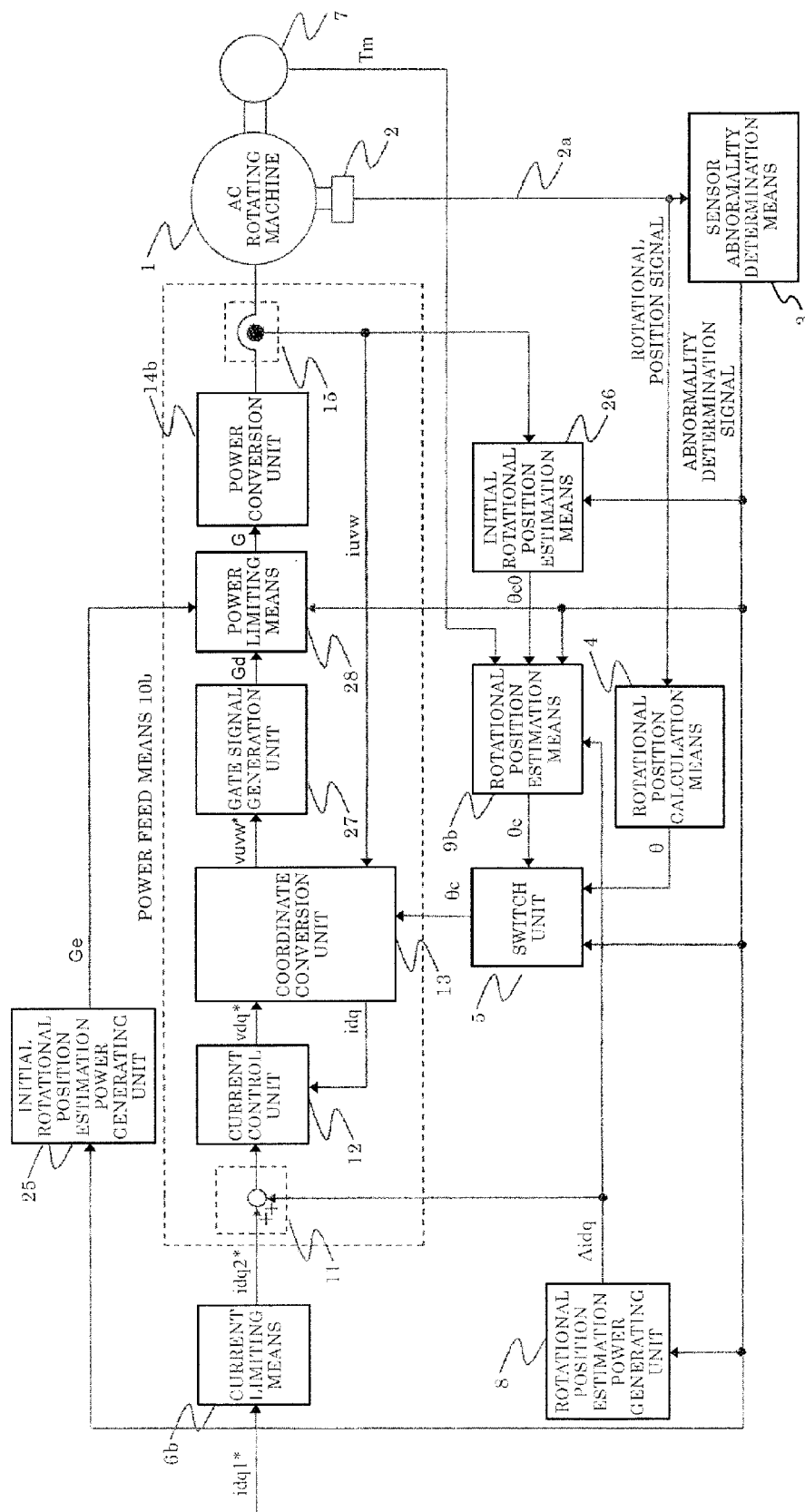
FIG. 10 is a diagram showing the entire configuration of an AC rotating machine control device in embodiment 3 of the present invention.

FIG. 10 is a diagram showing the entire configuration of an AC rotating machine control device in embodiment 3 of the present invention, in which the same reference characters as those in embodiment 1 indicate the same or corresponding components.

As in the current limiting means 6, current limiting means 6$b$ limits the current commands idq1* on d-q axes by the d-q axis current limiting value idqlim, and outputs the resultant commands as the current commands idq2* on d-q axes.

The method for setting the d-q axis current limiting value idqlim will be described later.

Next, the internal configuration of power feed means 10$b$ will be described.

A power conversion unit 14$b$ applies voltage to each phase of the AC rotating machine 1 on the basis of an inputted gate signal G.

Figure 11:
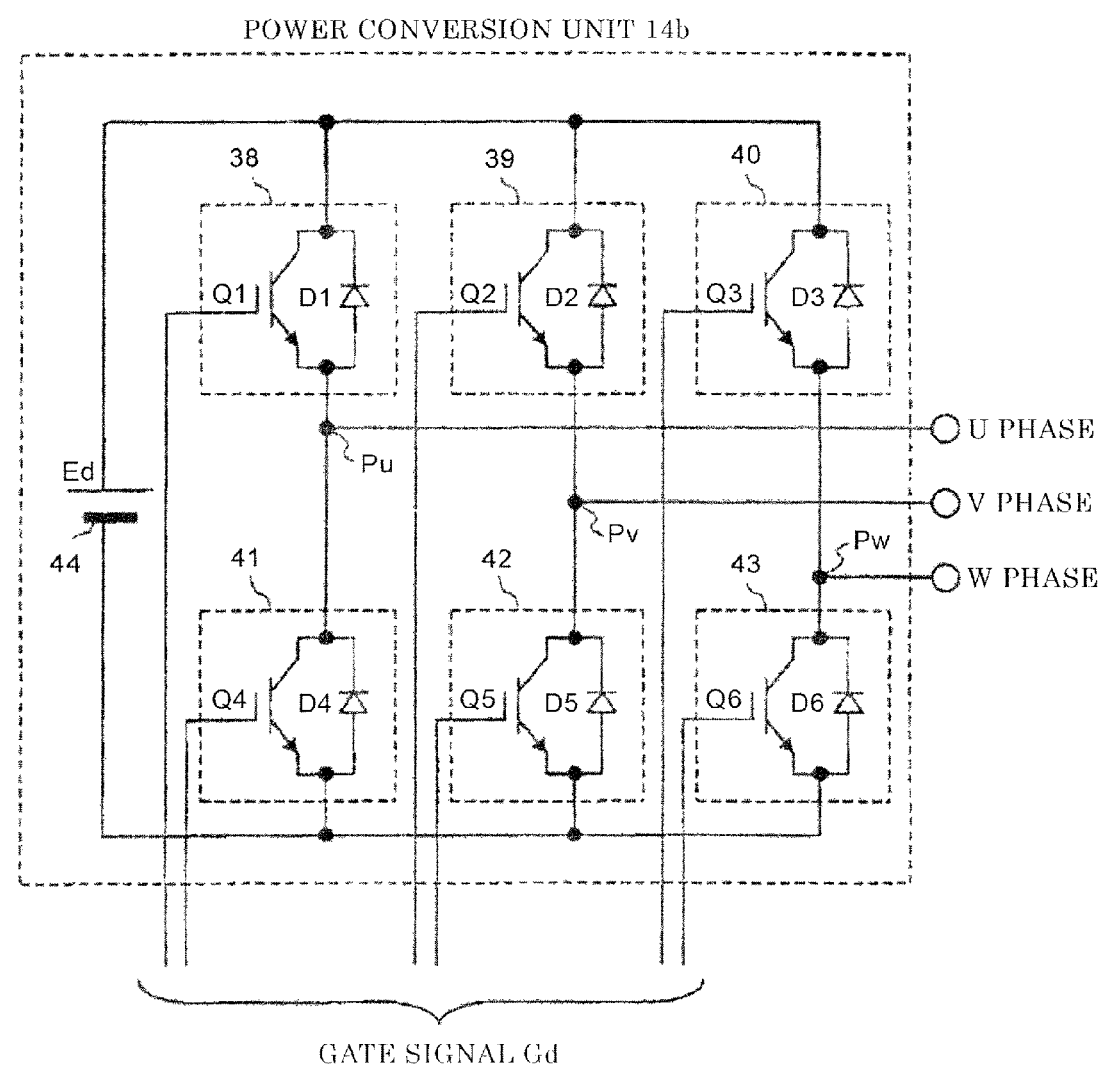
FIG. 11 is a diagram showing the configuration of a power conversion unit 14b in embodiment 3 of the present invention.

FIG. 11 is a diagram showing the internal configuration of the power conversion unit 14$b$.

The power conversion unit 14$b$ has semiconductor switches 38 to 43, each pair of the semiconductor switches 38 and 41, 39 and 42, 40 and 43 are connected in series, and the pairs of the semiconductor switches 38 and 41, 39 and 42, 40 and 43 connected in series are connected in parallel to a DC voltage source 44 which generates a potential difference Ed.

A midpoint Pu between the connected semiconductor switches 38 and 41 is connected to U phase of the AC rotating machine 1, a midpoint Pv between the connected semiconductor switches 39 and 42 is connected to V phase of the AC rotating machine 1, and a midpoint Pw between the connected semiconductor switches 40 and 43 is connected to W phase of the AC rotating machine 1.

In the semiconductor switches 38 to 43, insulated gate bipolar transistors (IGBTs) Q1 to Q6 and diodes D1 to D6 are respectively connected in parallel, and the forward directions of the diodes are directed to the plus side of the DC voltage source 44.

Gate signals applied to the gates of the IGBTs Q1 to Q6 turn on or off the respective IGBTs Q1 to Q6.

A gate signal generation unit 27 outputs such a drive gate signal Gd as to apply the three-phase voltage commands vuvw* to the AC rotating machine 1.

Here, the drive gate signal Gd may be calculated by a known method in which, for example, as in the pulse width modulation control unit 23 in embodiment 2 of the present invention, the three-phase voltage commands vuvw* are subjected to pulse width modulation to calculate logic signals Duvw, and gate signals for turning on or off the semiconductor switches 38 to 43 for the respective phases of the AC rotating machine 1 are calculated on the basis of the logic signals Duvw.

Power limiting means 28 limits the drive gate signal Gd, thereby eliminating reverse torque and preventing overcurrent at the time of shifting to sensorless control in which the AC rotating machine is controlled on the basis of the estimated rotational position when the rotational position sensor 2 has become abnormal.

Specifically, during a predetermined period Δt120 since the abnormality determination signal indicates abnormality until initial rotational position estimation means 26 calculates an initial estimated rotational position θe0, the drive gate signal Gd is interrupted and an estimation gate signal Ge is outputted. Thereafter, the estimation gate signal Ge is interrupted and the drive gate signal Gd is outputted.

An initial rotational position estimation power generating unit 25 outputs the estimation gate signal Ge for the initial rotational position estimation means 26 to estimate the rotational position, to the power feed means 10$b$, when the abnormality determination signal indicates abnormality.

The initial rotational position estimation means 26 calculates the initial estimated rotational position θe0 on the basis of the three-phase detected currents iuvw, and outputs the initial estimated rotational position θe0 to rotational position estimation means 9$b$.

The rotational position estimation means 9$b$ is different from the rotational position estimation means 9 only in that the rotational position estimation means 9$b$ uses the initial estimated rotational position θe outputted from the initial rotational position estimation means 26, as the initial value of the estimated rotational position θe to be calculated.

With the configuration as described above, when the rotational position sensor is abnormal, the AC rotating machine control device supplies such voltage as to short-circuit windings of the AC rotating machine, estimates the rotational position of the AC rotating machine on the basis of the detected current of the AC rotating machine, and controls the AC rotating machine on the basis of the rotational position, thereby eliminating reverse torque or overcurrent at the time of shifting to sensorless control in which the AC rotating machine is controlled on the basis of the estimated rotational position.

Here, the method for the initial rotational position estimation power generating unit 25 to output the estimation gate signal Ge and for the initial rotational position estimation means 26 to calculate the initial estimated rotational position θe0 will be described.

As the method, a known method disclosed in Japanese Patent Publication No. 3636340 may be used.

When the abnormality determination signal indicates abnormality, the initial rotational position estimation power generating unit 25 turns on all the semiconductor switches 38 to 43 of the power conversion unit 14$b$, thereby short-circuiting stator windings for all the phases of the AC rotating machine 1.

That is, the initial rotational position estimation power generating unit 25 supplies power for short-circuiting the AC rotating machine, to the AC rotating machine 1 via the power feed means 10$b$.

The initial rotational position estimation means 26 can calculate the rotation speed and the initial estimated rotational position θe0 of the AC rotating machine 1 on the basis of the three-phase detected currents iuvw flowing due to induced voltage when a predetermined time t0 has elapsed after the stator windings for all the phases of the AC rotating machine 1 are short-circuited.

Thus, the initial rotational position estimation means 26 calculates the initial estimated rotational position θe0 on the basis of detected current of the AC rotating machine when voltage corresponding to such rotational position estimation power as to short-circuit the windings of the AC rotating machine is applied.

The initial rotational position estimation means 26 calculates the initial estimated rotational position θe0 by a known method as disclosed in Japanese Patent Publication No. 3636340. However, without limitation thereto, the initial estimated rotational position θe0 may be calculated by another method on the basis of the relationship between voltage and current of the AC rotating machine when windings of the AC rotating machine are short-circuited.

Subsequently, the method for the current limiting means 6*b* and the power limiting means 28 to limit drive power for the AC rotating machine in the above configuration will be described.

As described above, during the period since the abnormality determination signal indicates abnormality until the predetermined period Δt120 elapses, the power limiting means 28 interrupts the drive gate signal Gd and outputs the estimation gate signal Ge.

Thereafter, the power limiting means 28 interrupts the estimation gate signal Ge and outputs the drive gate signal Gd. Here, since the initial rotational position estimation means 26 calculates the initial estimated rotational position θe0 on the basis of the three-phase detected currents iuvw when the predetermined time t0 has elapsed, the predetermined period Δt120 is a known period since the abnormality determination signal indicates abnormality until the initial rotational position estimation power generating unit 25 supplies power for short-circuiting the AC rotating machine and the predetermined time t0 elapses.

The current limiting means 6*b* may limit the current commands idq1* on d-q axes by the same method as in the current limiting means 6 in embodiment 1 of the present invention.

In principle, there is a limit on the estimation accuracy for the initial estimated rotational position θe calculated by the initial rotational position estimation means 26.

In other words, error between the initial estimated rotational position θe and the actual rotational position is equal to or smaller than a predetermined error Δθ0, and in principle, the predetermined error Δθ0 is a value of 90 degrees or smaller.

Therefore, the error of the estimated rotational position θe calculated by the rotational position estimation means 9*b* relative to the actual rotational position is originally equal to or smaller than 90 degrees, and is equal to or smaller than the predetermined error Δθ0.

That is, t2 which is the time at which a sufficient period has elapsed so that error of the estimated rotational position θe calculated by the rotational position estimation means 9*b* relative to the actual rotational position becomes 90 degrees or smaller, may be used as the time at which the initial rotational position estimation means 26 calculates the initial estimated rotational position θe, and the predetermined period Δt12 may be set to the same value as the predetermined period Δt120.

As described above, in the AC rotating machine control device having the current limiting means 6*b* and the power limiting means 28, even in the case where such voltage as to short-circuit windings of the AC rotating machine is supplied and the estimated rotational position θe is calculated on the basis of detected current of the AC rotating machine, the current commands idq1* on d-q axes which are drive power for the AC rotating machine are limited, thereby eliminating reverse torque or preventing overcurrent at the time of switching to sensorless control in which the power feed means 10*b* supplies power to the AC rotating machine on the basis of the estimated rotational position θe when abnormality has occurred in the rotational position sensor 2.

In addition, even in the case of providing the initial estimated rotational position estimation means for calculating the initial value of the estimated rotational position θe to be calculated by the rotational position estimation means, that is, a value used immediately after switching to sensorless control, the current commands idq1* on d-q axes which are drive power for the AC rotating machine are limited, thereby eliminating reverse torque or preventing overcurrent at the time of switching to sensorless control in which the power feed means 10*a* supplies power to the AC rotating machine on the basis of the estimated rotational position θe when abnormality has occurred in the rotational position sensor 2.

That is, the AC rotating machine control device in embodiment 3 of the present invention includes: an AC rotating machine; a rotational position sensor for detecting a rotational position of the AC rotating machine; sensor abnormality detection means for, when abnormality of the rotational position sensor has been continuously detected for a predetermined determination period, determining that the rotational position sensor is abnormal; rotational position estimation means for calculating an estimated rotational position of the AC rotating machine when the rotational position sensor is determined to be abnormal; power limiting means for limiting drive power supplied for driving the AC rotating machine; and power feed means for, when the sensor abnormality determination means determines that the rotational position sensor is abnormal, on the basis of the estimated rotational position, supplying the AC rotating machine with power obtained by adding rotational position estimation power supplied for the rotational position estimation means to estimate the rotational position, to the drive power limited by the power limiting means. After the sensor abnormality determination means detects the abnormality, the power limiting means starts to limit the drive power by a time when the sensor abnormality determination means determines that the abnormality occurs, and limits the drive power at least during a predetermined period that allows estimated error of the estimated rotational position to fall within a predetermined range. Current detection means for acquiring detected current of the AC rotating machine is provided. The rotational position acquisition estimation power has such voltage as to short-circuit windings of the AC rotating machine. The rotational position estimation means calculates the estimated rotational position on the basis of the detected current. Therefore, since the initial rotation estimation means calculates the rotational position with small error in a short time, the period during which drive power is limited for eliminating reverse torque or preventing overcurrent can be set to be shorter, whereby the AC rotating machine can output desired torque earlier.

In the present embodiment 3, time t2 is a sufficient time by which error of the estimated rotational position θe calculated by the rotational position estimation means 9*b* relative to the actual rotational position falls within the predetermined error Δθ0 which is 90 degrees or smaller, and the predetermined period Δt12 is composed of the (period since rotational position estimation is started until error converges to predetermined error Δθ0 which is 90 degrees or smaller). However, time t2 may be a sufficient time by which error of the estimated rotational position θe calculated by the rotational position estimation means 9*b* relative to the actual rotational position becomes equal to or smaller than an arbitrary predetermined error that is smaller than the predetermined error Δθ0, and the predetermined period Δt12 may be composed of a (period since rotational position estimation is started until error converges within arbitrary predetermined error that is smaller than predetermined error Δθ0). In this case, time t2 is set as a time at which the longest time taken for error of the estimated rotational position θe calculated by the rotational position estimation means 9*b* relative to the actual rotational position to converge from the predetermined error Δθ0 to the arbitrary predetermined error has elapsed since the time at which the initial rotational position estimation means 26 calculates the initial estimated rotational position θe, and the time taken until the error of the estimated rotational position θe calculated by the rotational position estimation means 9b reduces to the arbitrary predetermined error may be measured or calculated in advance, whereby time t2 and the predetermined period Δt12 may be determined.

Embodiment 4

In embodiment 3, the initial rotational position estimation means 26 calculates the initial estimated rotational position θe0 on the basis of detected current of the AC rotating machine when such voltage as to short-circuit windings of the AC rotating machine 1 is supplied. However, in the case where the rotation speed of the AC rotating machine is low, induced voltage of the AC rotating machine is small, so that the estimation accuracy of the rotational position deteriorates in principle.

Accordingly, in the present embodiment 4, in the AC rotating machine control device having known rotational position estimation means (for example, disclosed in Japanese Patent Publication No. 4271397) capable of calculating the initial estimated rotational position θe0 with high accuracy on the basis of the relationship between voltage and current supplied to the AC rotating machine when such voltage as to cause magnetic saturation is supplied to the AC rotating machine in the case where the rotation speed of the AC rotating machine is low, the method for eliminating reverse torque or preventing overcurrent at the time of switching to sensorless control will be described.

Figure 12:
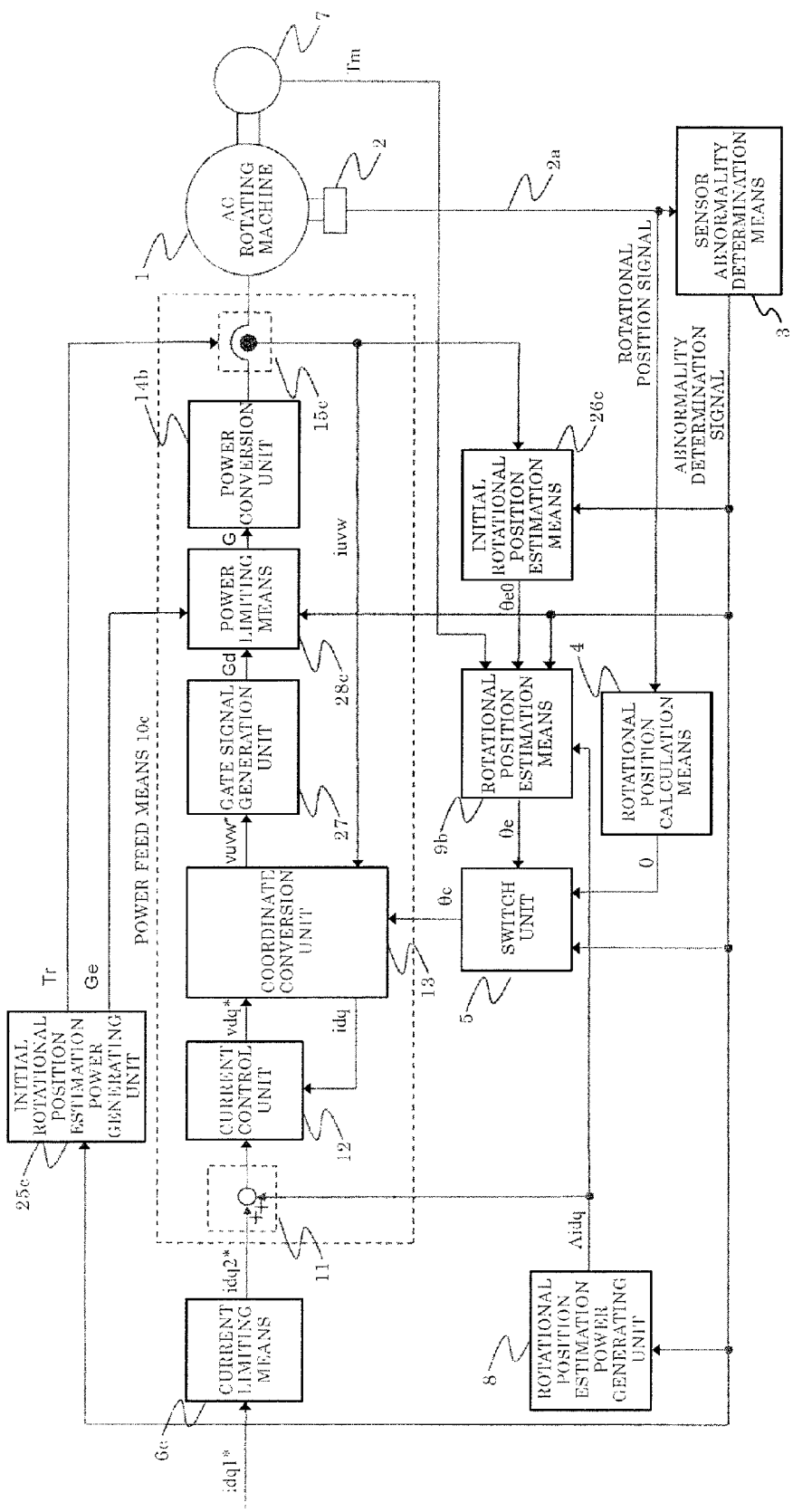
FIG. 12 is a diagram showing the entire configuration of an AC rotating machine control device in embodiment 4 of the present invention.

FIG. 12 is a diagram showing the entire configuration of an AC rotating machine control device in embodiment 4 of the present invention, in which the same reference characters as those in embodiments 1 to 3 indicate the same or corresponding components.

As in the current limiting means 6b, current limiting means 6c limits the current commands idq1* on d-q axes by the d-q axis current limiting value idqlim, and outputs the resultant commands as the current commands idq2* on d-q axes.

The method for setting the d-q axis current limiting value idqlim will be described later.

Next, a current detection unit 15c composing power feed means 10c detects current for each phase of the AC rotating machine 1 at the timing at which a trigger signal Tr outputted from an initial rotational position estimation power generating unit 25c rises, and outputs the detected currents to the coordinate conversion unit 13 and initial rotational position estimation means 26c.

As in the power limiting means 28 in embodiment 3 of the present invention, power limiting means 28c limits the drive gate signal Gd, thereby eliminating reverse torque and preventing overcurrent at the time of shifting to sensorless control in which the AC rotating machine is controlled on the basis of the estimated rotational position when the rotational position sensor 2 has become abnormal.

Specifically, during the predetermined period Δt120 since the abnormality determination signal indicates abnormality until the initial rotational position estimation means 26c calculates the initial estimated rotational position θe0, the drive gate signal Gd is interrupted and the estimation gate signal Ge is outputted.

Thereafter, the estimation gate signal Ge is interrupted and the drive gate signal Gd is outputted.

When the abnormality determination signal indicates abnormality, an initial rotational position estimation power generating unit 25c outputs, to the power feed means 10c, the estimation gate signal Ge for the initial rotational position estimation means 26c to estimate the rotational position, in accordance with a voltage vector command V, and outputs the trigger signal Tr to the power feed means 10c.

The initial rotational position estimation means 26 calculates the initial estimated rotational position θe0 on the basis of the three-phase detected current iuvw, and outputs the initial estimated rotational position θe0 to the rotational position estimation means 9b.

With the configuration as described above, when the rotational position sensor is abnormal, the AC rotating machine control device estimates the rotational position of the AC rotating machine on the basis of the relationship between voltage and current supplied to the AC rotating machine in the case where such voltage as to cause magnetic saturation is supplied to the AC rotating machine, and controls the AC rotating machine on the basis of the rotational position, thereby eliminating reverse torque or overcurrent at the time of shifting to sensorless control in which the AC rotating machine is controlled on the basis of the estimated rotational position.

Here, the method for the initial rotational position estimation power generating unit 25c to output the estimation gate signal Ge and for the initial rotational position estimation means 26c to calculate the initial estimated rotational position θe0 will be described.

As the method, a known method disclosed in Japanese Patent Publication No. 4271397 may be used.

As described above, when the abnormality determination signal indicates abnormality, the initial rotational position estimation power generating unit 25 outputs the estimation gate signal Ge according to the voltage vector command V, to the power feed means 10c.

Here, the voltage vector command V has nine switching modes "0" to "8", and the switching modes "0" to "8" are defined as follows in accordance with combinations of the IGBTs Q1 to Q6 to be turned on, and correspond to the respective estimation gate signals Ge to be outputted.

| Switching mode | Combination of IGBTs Q1 to Q6 to be turned on |
| --- | --- |
| "0" | None |
| "1" | Q1, Q5, Q6 |
| "2" | Q1, Q2, Q6 |
| "3" | Q4, Q2, Q6 |
| "4" | Q4, Q2, Q3 |
| "5" | Q4, Q5, Q3 |
| "6" | Q1, Q5, Q3 |
| "7" | Q1, Q2, Q3 |
| "8" | Q4, Q5, Q6 |

Voltage vectors V1 to V8 corresponding to the respective switching modes "0" to "8" each have a phase difference by 60 degrees and have equal magnitudes.

By a known method, the initial rotational position estimation power generating unit 25 sequentially outputs, to the power limiting means 28, predetermined estimation gate signals Ge corresponding to predetermined voltage vectors V during a period that is short enough not to cause magnetic saturation, and after application of each voltage vector is finished, outputs the trigger signal Tr to the current detection unit 15c. The current detection unit 15c samples the three-phase detected currents iuvw at the timing at which the trigger signal Tr rises, and outputs the three-phase detected currents iuvw to the initial rotational position estimation means 26c, whereby the initial rotational position estimation means 26c calculates the rotational position between 0 to 180 degrees on the basis of the three-phase detected currents iuvw. Further, voltage vectors according to the three-phase detected currents iuvw are applied during such an application period as to cause magnetic saturation, and the rotational position relationship as to 180 degrees is determined using the magnitude relationship of the absolute values of the voltage vectors, thereby calculating the initial estimated rotational position θe0 that uniquely specifies the rotational position in the entire angle range.

The initial rotational position estimation means 26c calculates the initial estimated rotational position θe0 by a known method as disclosed in Japanese Patent Publication No. 4271397. However, without limitation thereto, the initial estimated rotational position θe0 may be calculated by another method on the basis of the relationship between voltage and current supplied to the AC rotating machine in the case where such voltage as to cause magnetic saturation is supplied to the AC rotating machine.

Subsequently, the method for the current limiting means 6c and the power limiting means 28 to limit drive power for the AC rotating machine in the above configuration will be described.

As described above, during the period since the abnormality determination signal indicates abnormality until the predetermined period Δt120 elapses, the power limiting means 28c interrupts the drive gate signal Gd and outputs the estimation gate signal Ge. Thereafter, the power limiting means 28c interrupts the estimation gate signal Ge and outputs the drive gate signal Gd.

Here, the initial rotational position estimation means 26c applies a predetermined voltage vector command V at a predetermined timing, and calculates the initial estimated rotational position θe0 on the basis of the three-phase detected currents iuvw sampled at a predetermined timing. Therefore, the predetermined period Δt120 is a known period since the abnormality determination signal indicates abnormality until the initial rotational position estimation means 26c calculates the initial estimated rotational position θe0.

The current limiting means 6b may limit the current commands idq1* on d-q axes by the same method as in the current limiting means 6b in embodiment 3 of the present invention.

In principle, there is a limit on the estimation accuracy for the initial estimated rotational position θe calculated by the initial rotational position estimation means 26c. In other words, error between the initial estimated rotational position θe and the actual rotational position is equal to or smaller than a predetermined error Δθ0, and in principle, the predetermined error Δθ0 is a value of 90 degrees or smaller.

Therefore, the error of the estimated rotational position θe calculated by the rotational position estimation means 9c relative to the actual rotational position is originally equal to or smaller than 90 degrees, and is equal to or smaller than the predetermined error Δθ0. That is, t2 which is the time at which a sufficient period has elapsed so that error of the estimated rotational position θe calculated by the rotational position estimation means 9c relative to the actual rotational position becomes 90 degrees or smaller, may be used as the time at which the initial rotational position estimation means 26c calculates the initial estimated rotational position θe0, and the predetermined period Δt12 may be set to the same value as the predetermined period Δt120.

As described above, in the AC rotating machine control device having the current limiting means 6c and the power limiting means 28c, even in the case where such voltage as to cause magnetic saturation is supplied to the AC rotating machine and the estimated rotational position θe is calculated on the basis of the relationship between voltage and current supplied to the AC rotating machine, the current commands idq1* on d-q axes which are drive power for the AC rotating machine are limited, thereby eliminating reverse torque or preventing overcurrent at the time of switching to sensorless control in which the power feed means 10c supplies power to the AC rotating machine on the basis of the estimated rotational position θe when abnormality has occurred in the rotational position sensor 2.

That is, the AC rotating machine control device in embodiment 4 of the present invention includes: an AC rotating machine; a rotational position sensor for detecting a rotational position of the AC rotating machine; sensor abnormality detection means for, when abnormality of the rotational position sensor has been continuously detected for a predetermined determination period, determining that the rotational position sensor is abnormal; rotational position estimation means for calculating an estimated rotational position of the AC rotating machine when the rotational position sensor is determined to be abnormal; power limiting means for limiting drive power supplied for driving the AC rotating machine; and power feed means for, when the sensor abnormality determination means determines that the rotational position sensor is abnormal, on the basis of the estimated rotational position, supplying the AC rotating machine with power obtained by adding rotational position estimation power supplied for the rotational position estimation means to estimate the rotational position, to the drive power limited by the power limiting means. After the sensor abnormality determination means detects the abnormality, the power limiting means starts to limit the drive power by a time when the sensor abnormality determination means determines that the abnormality occurs, and limits the drive power at least during a predetermined period that allows estimated error of the estimated rotational position to fall within a predetermined range. Current detection means for acquiring detected current of the AC rotating machine is provided. The power limiting means supplies such rotational position estimation power as to magnetically saturate windings of the AC rotating machine. The rotational position estimation power is such power as to magnetically saturate the windings of the AC rotating machine. The rotational position estimation means calculates the estimated rotational position on the basis of the relationship between voltage and current supplied to the AC rotating machine. Therefore, even in the case where the rotation speed of the AC rotating machine is low, the initial rotation estimation means calculates the rotational position with small error in a shorter time, and thus the period during which drive power is limited for eliminating reverse torque or preventing overcurrent can be set to be shorter, whereby the AC rotating machine can output desired torque earlier.

In the present embodiment 4, time t2 is a sufficient time by which error of the estimated rotational position θe calculated by the rotational position estimation means 9c relative to the actual rotational position falls within the predetermined error Δθ0 which is 90 degrees or smaller, and the predetermined period Δt12 is composed of the (period since rotational position estimation is started until error converges to predetermined error Δθ0 which is 90 degrees or smaller). However, time t2 may be a sufficient time by which error of the estimated rotational position θe calculated by the rotational position estimation means 9b relative to the actual rotational position becomes equal to or smaller than an arbitrary predetermined error that is smaller than the predetermined error Δθ0, and the predetermined period Δt12 may be composed of a (period since rotational position estimation is started until error converges within arbitrary predetermined error that is smaller than predetermined error Δθ0). In this case, time t2 is set as a time at which the longest time taken for error of the estimated rotational position θe calculated by the rotational position estimation means 9b relative to the actual rotational position to converge from the predetermined error Δθ0 to the arbitrary predetermined error has elapsed since the time at which the initial rotational position estimation means 26c calculates the initial estimated rotational position θe, and the time taken until the error of the estimated rotational position θe calculated by the rotational position estimation means 9b reduces to the arbitrary predetermined error may be measured or calculated in advance, whereby time t2 and the predetermined period Δt12 may be determined.

Embodiment 5

In embodiment 1, the rotational position estimation means 9 calculates the estimated rotational position θe on the basis of response in the output torque Tm when high-frequency current is supplied to the AC rotating machine 1. However, in the case where the rotation speed of the AC rotating machine is greater than the frequency of the high-frequency currents Δidq on d-q axes, the estimation accuracy of the rotational position deteriorates.

Accordingly, in the present embodiment 4, in an AC rotating machine control device that, in the case where the rotation speed of the AC rotating machine is low, outputs the estimated rotational position θe calculated on the basis of response in the output torque Tm when high-frequency current is supplied to the AC rotating machine 1, and in the case where the rotation speed is high, outputs the estimated rotational position θe calculated by another method capable of calculating the estimated rotational position with high accuracy during high-speed rotation, the method for eliminating reverse torque or preventing overcurrent at the time of switching to sensorless control will be described.

That is, in the AC rotating machine control device having the rotational position estimation means that estimates the rotational position by a plurality of methods, the method for eliminating reverse torque or preventing overcurrent at the time of switching to sensorless control will be described.

Figure 13:
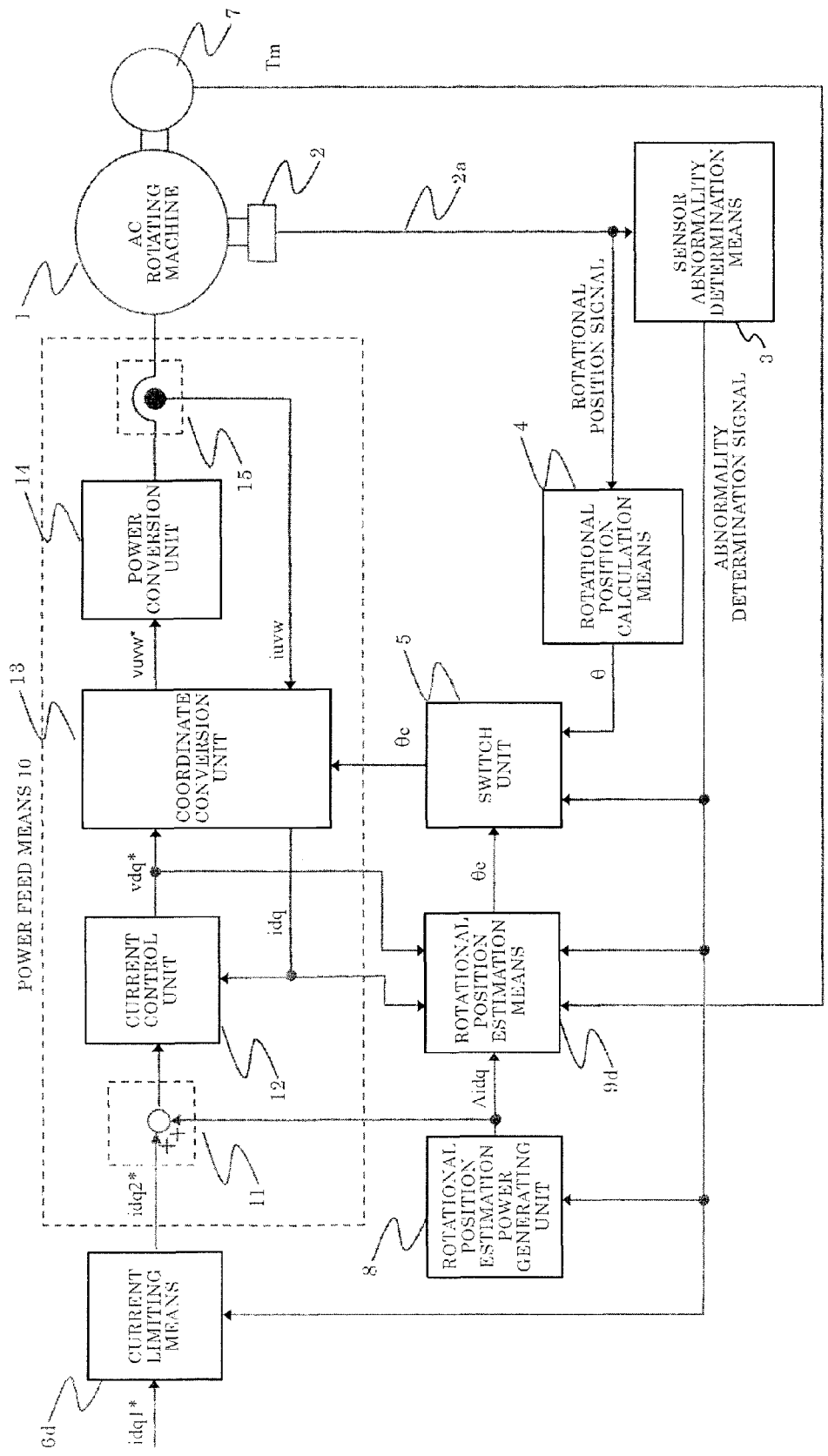
FIG. 13 is a diagram showing the entire configuration of an AC rotating machine control device in embodiment 5 of the present invention.

FIG. 13 is a diagram showing the entire configuration of an AC rotating machine control device in embodiment 5 of the present invention, in which the same reference characters as those in embodiment 1 indicate the same or corresponding components.

As in the current limiting means 6, current limiting means 6d limits the current commands idq1* on d-q axes by the d-q axis current limiting value idqlim, and outputs the resultant commands as the current commands idq2* on d-q axes.

The method for setting the d-q axis current limiting value idqlim will be described later.

Figure 14:
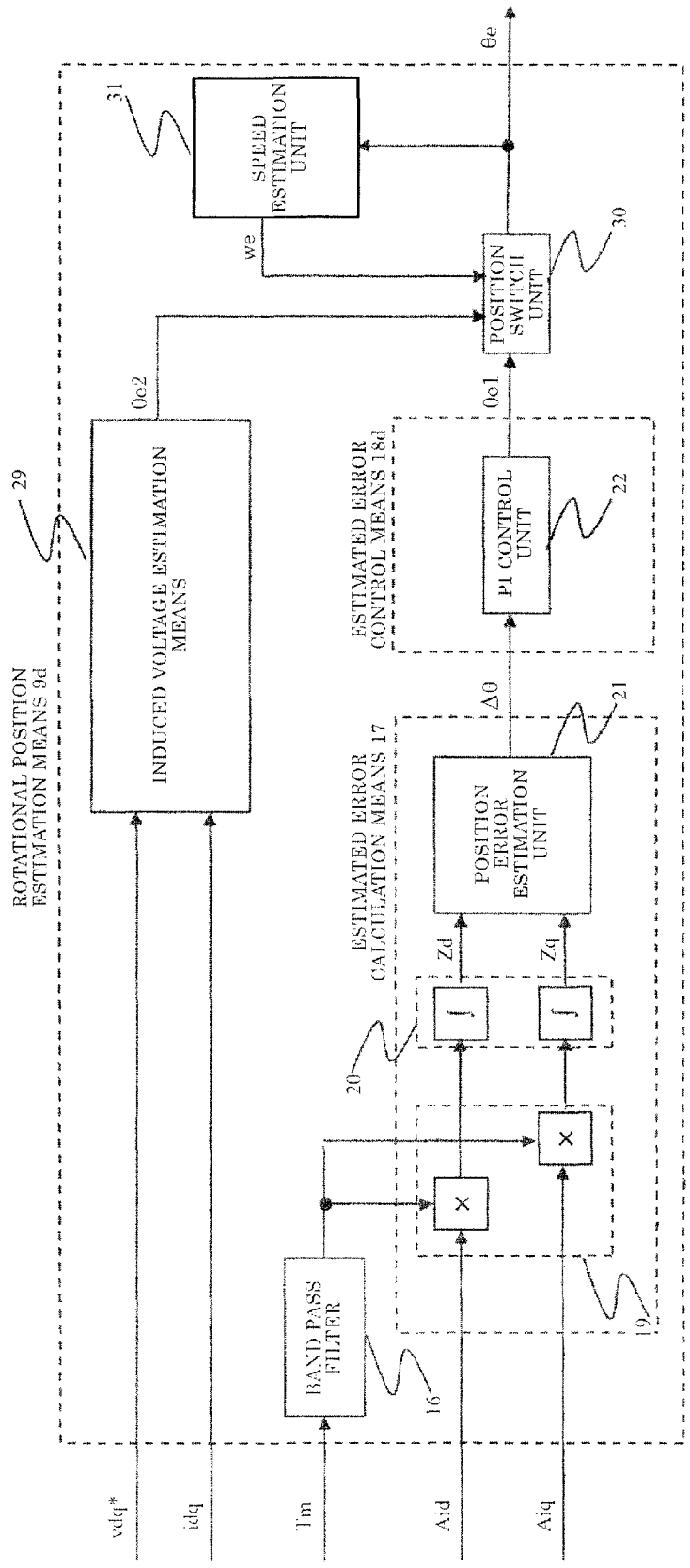
FIG. 14 is a diagram showing the configuration of rotational position estimation means 9d in embodiment 5 of the present invention.

Next, the internal configuration of the rotational position estimation means 9b shown in FIG. 14 will be described.

As in the estimated error control means 18 in embodiment 1 of the present invention, estimated error control means 18d calculates an estimated rotational position and outputs the estimated rotational position as a first estimated rotational position θe1.

On the basis of the voltage commands vdq* on d-q axes and the detected currents idq on d-q axes outputted from the power feed means 10, by a known method (for example, Japanese Patent Publication No. 4672236) using an adaptive observer and an integration unit, the induced voltage estimation means 29 estimates induced voltage generated by the AC rotating machine 1 and calculates a second estimated rotational position θe2.

Here, as the rotation speed increases, the induced voltage of the AC rotating machine increases, and thus influence on the induced voltage due to voltage error reduces.

Therefore, in the case where the rotation speed is high, the second estimated rotational position θe2 calculated by the induced voltage estimation means 29 has high accuracy.

The position switch unit 30 outputs the estimated rotational position θe on the basis of the first estimated rotational position θe1 outputted from the estimated error control means 18d, the second estimated rotational position θe2 outputted from the induced voltage estimation means 29, and an estimated rotation speed we outputted from a speed estimation unit 31 described later.

That is, if the estimated rotation speed we is smaller than a predetermined value, the position switch unit 30 selects the first estimated rotational position θe1, and if the estimated rotation speed we is equal to or greater than the predetermined value, the position switch unit 30 selects the second estimated rotational position θe2. Then, the position switch unit 30 outputs the selected rotational position as the estimated rotational position θe.

The predetermined value may be prescribed in advance in consideration of the accuracies of the first estimated rotational position θe1 and the second estimated rotational position θe2 with respect to the rotation speed.

The speed estimation unit 31 differentiates the estimated rotational position θe outputted from the position switch unit 30, thereby calculating the estimated rotation speed we of the AC rotating machine 1, and outputs the estimated rotation speed we to the position switch unit 30.

With the configuration as described above, when the rotational position sensor is abnormal, the AC rotating machine control device estimates the rotational position of the AC rotating machine by a plurality of methods, and controls the AC rotating machine on the basis of the rotational position, thereby eliminating reverse torque or overcurrent at the time of shifting to sensorless control in which the AC rotating machine is controlled on the basis of the estimated rotational position.

The induced voltage estimation means 29 calculates the second estimated rotational position θe2 by a known method using an adaptive observer and an integration unit as disclosed in Japanese Patent Publication No. 4672236. However, without limitation thereto, the induced voltage estimation means 29 may calculate the second estimated rotational position θe2 on the basis of induced voltage estimation, by another method.

Subsequently, the method for the current limiting means 6d to limit drive power for the AC rotating machine in the above configuration will be described.

The current limiting means 6d limits the current commands idq1* on d-q axes by the same method as in the current limiting means 6 in embodiment 1 of the present invention, thereby eliminating reverse torque and preventing overcurrent at the time of shifting to sensorless control.

In the AC rotating machine control device in the present embodiment 5, as in the current limiting means 6 in embodiment 1 of the present invention, the (period since rotational position estimation power is supplied until estimated rotational position is calculated) in Mathematical (10) is set to the longest time taken until: the high-frequency currents Aidq on d-q axes are supplied to the AC rotating machine 1 by the power feed means 10; the corresponding output torque of the AC rotating machine 1 is detected by the torque detection means 7; and then the first estimated rotational position θe1 is calculated by the estimated error control means 18d in the rotational position estimation means 9d.

In addition, the (longest period since rotational position estimation is started until error converges within 90 degrees) may be set to a longer one of: the longest time taken until error of the first estimated rotational position θe1 calculated by the estimated error control means 18d in the rotational position estimation means 9d decreases to 90 degrees; and the longest time taken until error of the second estimated rotational position θe2 calculated by the induced voltage estimation means 29 in the rotational position estimation means 9d decreases to 90 degrees.

Here, as for the longest time taken until error of the second estimated rotational position θe2 calculated by the induced voltage estimation means 29 decreases to 90 degrees, in accordance with the convergence characteristics of the adaptive observer and the integration unit composing the induced voltage estimation means 29, the time taken until the error of the second estimated rotational position θe2 decreases to 90 degrees may be measured or calculated in advance considering the worst case where error between the second estimated rotational position θe2 and the actual rotational position of the AC rotating machine is 180 degrees when calculation of the second estimated rotational position θe2 is started.

Further, the longest time may be set considering the case where voltage applied to the AC rotating machine is saturated with respect to power supply voltage supplied to the AC rotating machine.

As described above, in the AC rotating machine control device having the current limiting means 6d, even in the case where the estimated rotational position θe of the AC rotating machine is calculated by a plurality of methods, the current commands idq1* on d-q axes which are drive power for the AC rotating machine are limited, thereby eliminating reverse torque or preventing overcurrent at the time of switching to sensorless control in which the power feed means 10c supplies power to the AC rotating machine on the basis of the estimated rotational position θe when abnormality has occurred in the rotational position sensor 2.

Embodiment 6

In embodiment 1, the d-q axis current limiting value idqlim which is a limiting value for limiting the current commands idq1* on d-q axes in the current limiting means 6 is set to zero since time t1 until the predetermined period Δt12 has elapsed, thereby eliminating reverse torque or preventing overcurrent at the time of switching to sensorless control. However, in the AC rotating machine control device for which reverse torque at the time of shifting to sensorless control does not become a problem in terms of usage purpose, the d-q axis current limiting value idqlim may be set to zero until induced voltage of the AC rotating machine becomes a predetermined value or smaller, that is, the rotation speed of the AC rotating machine becomes a predetermined value or smaller, thereby preventing overcurrent.

Accordingly, in the present embodiment 4, in the AC rotating machine control device having current limiting means that limits the d-q axis current limiting value idqlim which is a limiting value for limiting the current commands idq1* on d-q axes, to zero until the induced voltage becomes a predetermined value or smaller, that is, the rotation speed of the AC rotating machine becomes a predetermined value or smaller, the method for preventing overcurrent at the time of switching to sensorless control will be described.

Figure 15:
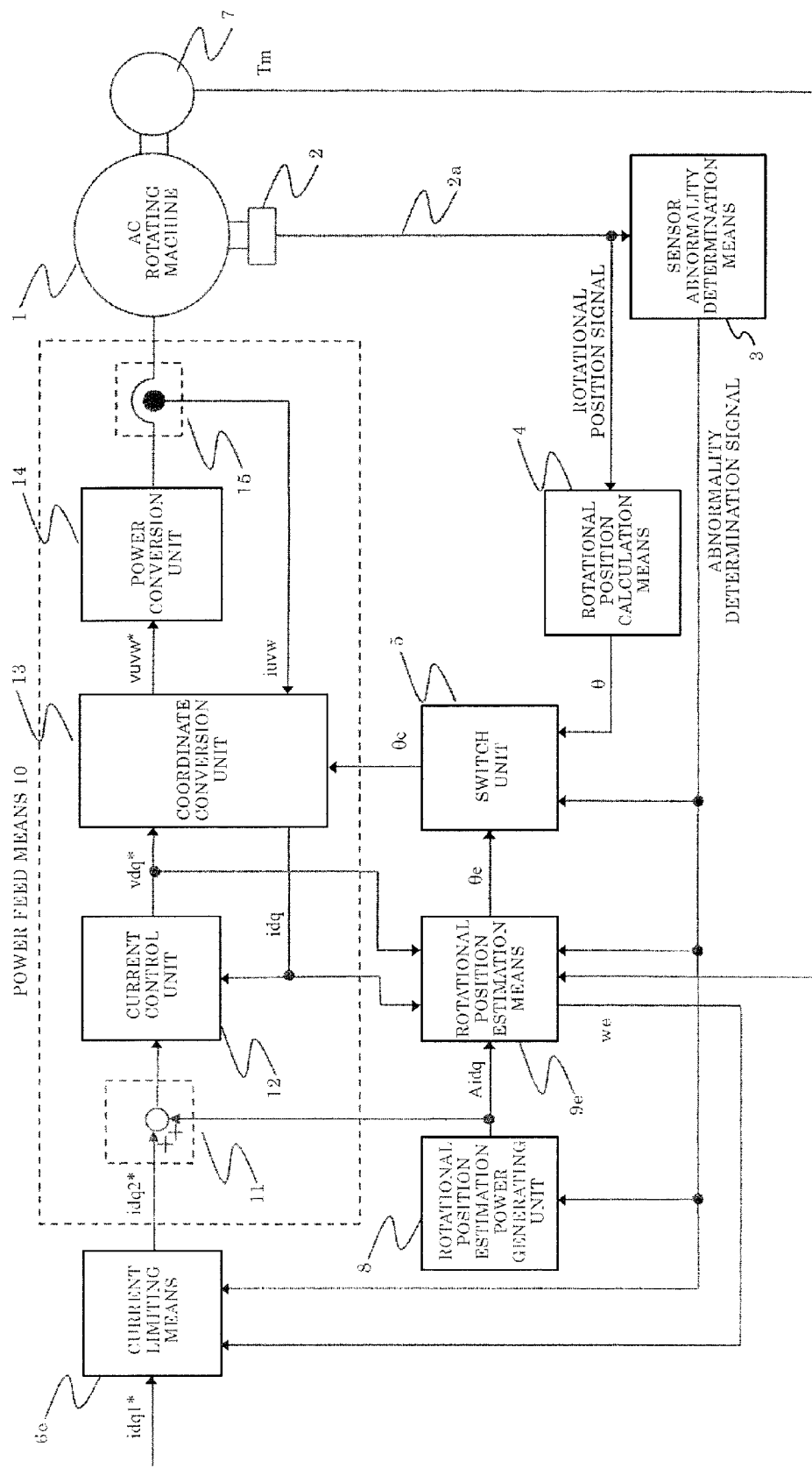
FIG. 15 is a diagram showing the entire configuration of an AC rotating machine control device in embodiment 6 of the present invention.

FIG. 15 is a diagram showing the entire configuration of an AC rotating machine control device in embodiment 6 of the present invention, in which the same reference characters as those in embodiments 1 to 5 indicate the same or corresponding components.

When the abnormality determination signal indicates abnormality, the current limiting means 6e limits the current commands idq1* on d-q axes by the d-q axis current limiting value idqlim on the basis of the estimated rotation speed we outputted from rotational position estimation means 9e, and outputs the limited commands as the current commands idq2* on d-q axes.

The method for setting the d-q axis current limiting value idqlim will be described later.

Figure 16:
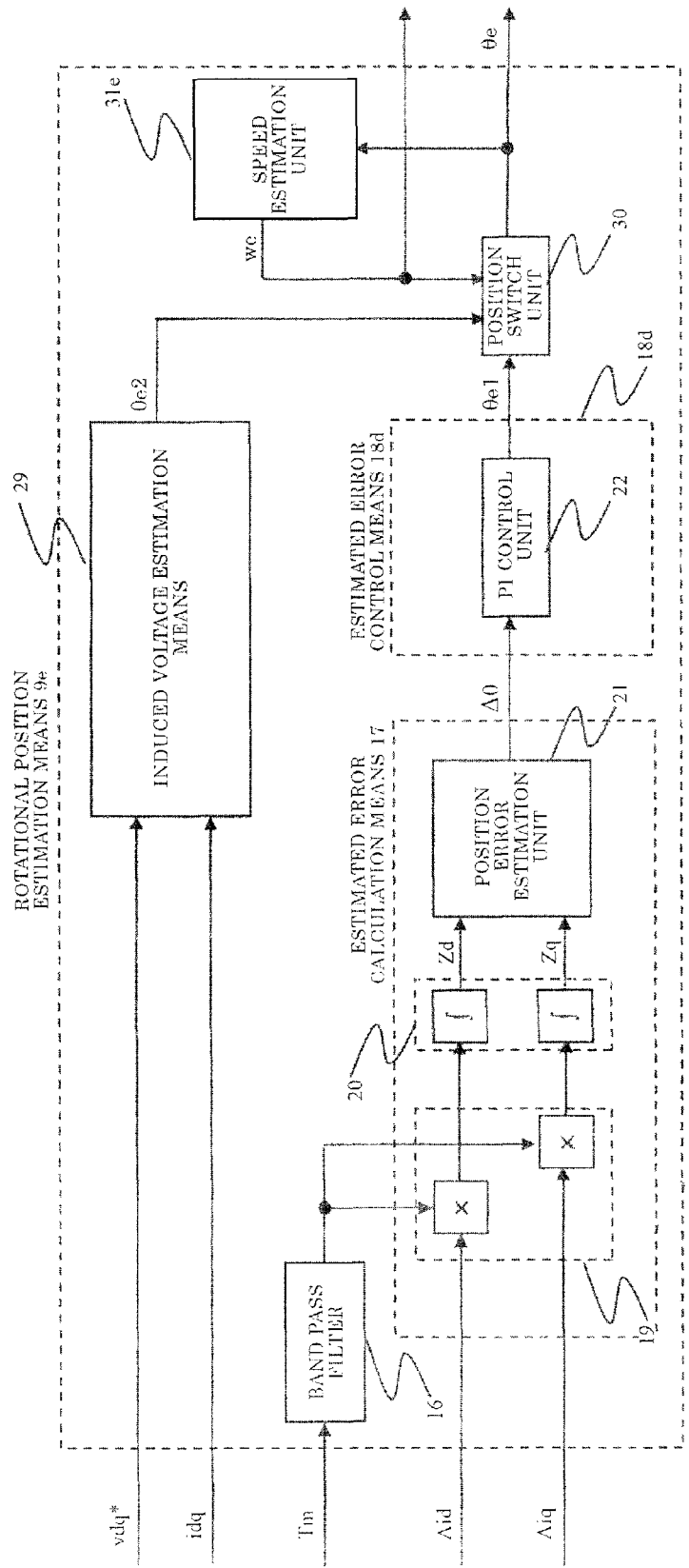
FIG. 16 is a diagram showing the configuration of rotational position estimation means 9e in embodiment 6 of the present invention.

Next, the internal configuration of the rotational position estimation means 9e shown in FIG. 16 will be described.

The rotational position estimation means 9e is different from the rotational position estimation means 9d only in that a speed estimation unit 31e outputs the estimated speed we to outside of the rotational position estimation means 9e.

With the configuration as described above, the AC rotating machine control device limits the current commands idq1* on d-q axes which are drive power for the AC rotating machine, on the basis of induced voltage of the AC rotating machine, thereby preventing overcurrent at the time of shifting to sensorless control in which the AC rotating machine is controlled on the basis of the estimated rotational position when abnormality has occurred in the rotational position sensor.

Subsequently, the method for the current limiting means 6e to limit drive power for the AC rotating machine on the basis of the estimated rotation speed we in the above configuration will be described.

Overcurrent occurs in the case where error between the control angle and the actual rotational position is great, current of the AC rotating machine is great, and induced voltage of the AC rotating machine is great, in other words, in the case where the rotation speed is great.

Therefore, the maximum value of induced voltage of the AC rotating machine that does not cause overcurrent, that is, the maximum value of the rotation speed that does not cause overcurrent in the case where error of the rotational position is maximum and the current commands idq1* on d-q axes are maximum, may be calculated in advance as a predetermined value, and the d-q axis current limiting value idqlim may be set to zero as long as the estimated rotation speed we is equal to or greater than the predetermined value since time t1 at which the abnormality determination signal is switched from normality to abnormality. Then, when the estimated rotation speed we becomes equal to or smaller than the predetermined value, the d-q axis current limiting value idqlim may be gradually increased with time.

However, it can also be assumed that the predetermined period Δt12 described in embodiment 1 of the present invention which is a sufficient time for error of the estimated rotational position θe to become 90 degrees or smaller elapses earlier before the induced voltage becomes the predetermined value or smaller. Therefore, from time t1, the d-q axis current limiting value idqlim may be set to zero during a period in which induced voltage of the AC rotating machine is equal to or greater than the predetermined value and within the predetermined period Δt12, and then, when induced voltage of the AC rotating machine becomes equal to or smaller than the predetermined value or when the predetermined period Δt12 has elapsed, the d-q axis current limiting value idqlim may be gradually increased with time. Thus, the period during which the d-q axis current limiting value idqlim is set to zero for preventing overcurrent can be made to be a minimum necessary period.

Thus, in the AC rotating machine control device having the current limiting means 6e, drive power for the AC rotating machine is limited on the basis of induced voltage of the AC rotating machine, thereby preventing overcurrent at the time of shifting to sensorless control in which the AC rotating machine is controlled on the basis of the estimated rotational position when abnormality has occurred in the rotational position sensor.

That is, the AC rotating machine control device in embodiment 6 of the present invention includes: an AC rotating machine; a rotational position sensor for detecting a rotational position of the AC rotating machine; sensor abnormality detection means for, when abnormality of the rotational position sensor has been continuously detected for a predetermined determination period, determining that the rotational position sensor is abnormal; rotational position estimation means for calculating an estimated rotational position of the AC rotating machine when the rotational position sensor is determined to be abnormal; power limiting means for limiting drive power supplied for driving the AC rotating machine; induced voltage acquiring means for acquiring induced voltage of the AC rotating machine; and power feed means for, when the sensor abnormality determination means determines that the rotational position sensor is abnormal, on the basis of the estimated rotational position, supplying the AC rotating machine with the drive power limited by the power limiting means. After the sensor abnormality determination means detects the abnormality, the power limiting means starts to limit the drive power by a time when the sensor abnormality determination means determines that the abnormality occurs, and limits the drive power at least until the induced voltage of the AC rotating machine becomes equal to or smaller than a predetermined value.

Therefore, while the magnitude of torque required for the AC rotating machine equally before and after occurrence of abnormality is intentionally reduced, the period of the reduction is minimized and failure of the AC rotating machine or the drive circuit for the AC rotating machine due to overcurrent can be prevented, thus providing a significant effect that could not be obtained conventionally.

In the present embodiment 6, the sensor abnormality determination means 3 detects abnormality of the rotational position sensor 2 on the basis of the rotational position signal, and if the abnormality has been continuously detected for a predetermined period, determines that the rotational position sensor 2 is abnormal. However, on the basis of the rotational position signal, the sensor abnormality determination means 3 may determine that the rotational position sensor 2 is abnormal immediately when abnormality of the rotational position sensor is detected.

That is, the AC rotating machine control device includes: an AC rotating machine; a rotational position sensor for detecting a rotational position of the AC rotating machine; sensor abnormality determination means for performing determination as to abnormality of the rotational position sensor; rotational position estimation means for calculating an estimated rotational position of the AC rotating machine when the rotational position sensor is determined to be abnormal; power limiting means for limiting drive power supplied for driving the AC rotating machine; induced voltage acquiring means for acquiring induced voltage of the AC rotating machine; and power feed means for, when the sensor abnormality determination means determines that the rotational position sensor is abnormal, on the basis of the estimated rotational position, supplying the AC rotating machine with the drive power limited by the power limiting means. The power limiting means limits the drive power since the sensor abnormality determination means determines that the abnormality occurs at least until the induced voltage of the AC rotating machine becomes equal to or smaller than a predetermined value. Also in this case, as in the AC rotating machine control device in the present embodiment 6, while the magnitude of torque required for the AC rotating machine equally before and after occurrence of abnormality is intentionally reduced, the period of the reduction is minimized and failure of the AC rotating machine or the drive circuit for the AC rotating machine due to overcurrent can be prevented, thus providing a significant effect that could not be obtained conventionally.

Embodiment 7

In embodiment 1, the d-q axis current limiting value idqlim which is a limiting value for limiting the current commands idq1* on d-q axes in the current limiting means 6 is set to zero since time t1 until the predetermined period Δt12 elapses, thereby eliminating reverse torque or preventing overcurrent at the time of switching to sensorless control.

In the configuration in which such drive power for the AC rotating machine as to cause the deviation between a desired rotation speed command and the rotation speed of the AC rotating machine to be zero is calculated on the basis of the rotation speed, the drive power calculated when the estimated rotational position has error of 90 degrees or greater relative to the rotational position has a sign opposite to that of desired drive power and convergence cannot be reached, resulting in continuation of reverse torque.

Therefore, in such a case, limiting the drive power to eliminate reverse torque leads to breakage of positive feedback that causes continuation of reverse torque, thus providing a further effect.

In the present embodiment 7, in an AC rotating machine control device having drive current calculation means for calculating drive current for the AC rotating machine on the basis of the estimated rotation speed, the method for eliminating reverse torque or preventing overcurrent at the time of switching to sensorless control will be described.

Figure 17:
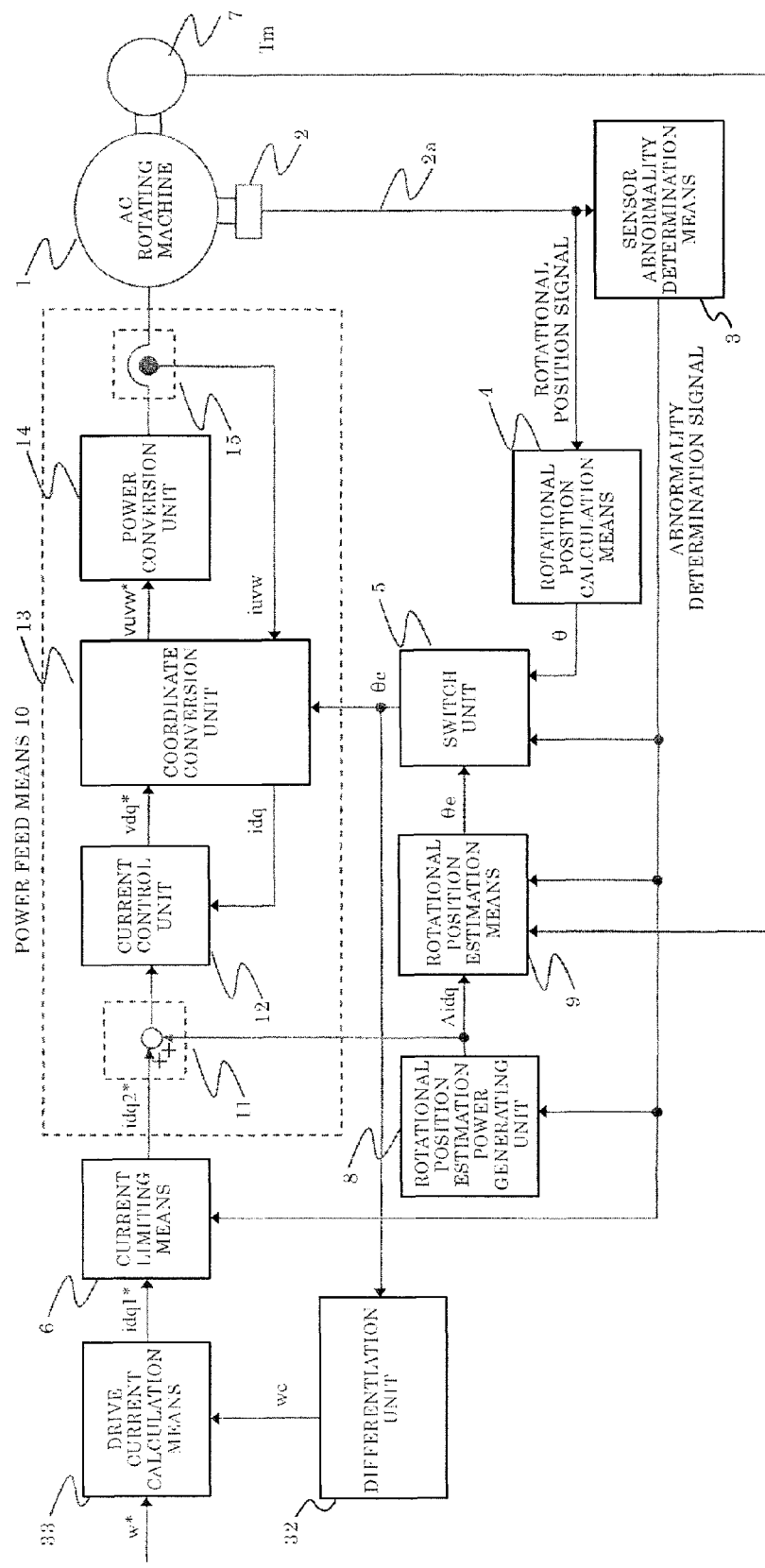
FIG. 17 is a diagram showing the entire configuration of an AC rotating machine control device in embodiment 7 of the present invention.

FIG. 17 is a diagram showing the entire configuration of an AC rotating machine control device in embodiment 7 of the present invention, in which the same reference characters as those in embodiments 1 to 6 indicate the same or corresponding components.

The rotation speed calculation means 32 differentiates the control angle θc, and outputs the resultant value as a control speed we to the drive current calculation means 33.

That is, when the abnormality determination signal indicates normality, the control speed wc is a speed based on the rotational position signal outputted from the rotational position sensor 2, and when the abnormality determination signal indicates abnormality, the control speed wc is an estimated speed based on the estimated rotational position θe outputted from the rotational position estimation means 9. The control speed wc represents the rotation speed of the AC rotating machine 1.

The drive current calculation means 33 calculates such current commands idq1* on d-q axes as to cause the control speed wc to coincide with a rotation speed command w*, on the basis of the rotation speed command w* and the control speed wc.

Specifically, a known integral control is applied in which a value obtained by multiplying the deviation between the rotation speed command w* and the control speed wc by a predetermined gain and integrating the resultant value is used as the current commands idq1* on d-q axes.

Another method may be applied to the calculation of such current commands idq1* on d-q axes as to cause the control speed wc to coincide with the rotation speed command w*.

Thus, in the AC rotating machine control device having the drive current calculation means for calculating drive current for the AC rotating machine on the basis of the estimated rotation speed, reverse torque can be eliminated or overcurrent can be prevented at the time of shifting to sensorless control.

Here, in the case where error between the estimated rotational position and the actual rotational position of the AC rotating machine is 90 degrees or greater immediately after switching to sensorless control, the current commands idq1* on d-q axes calculated by the drive current calculation means are supplied in the direction opposite to a desired direction on the actual d-q axes of the AC rotating machine, thus causing reverse torque.

That is, the direction of the control speed wc becomes opposite to the direction of the rotation speed command w*, and the deviation between the rotation speed command w* and the control speed wc increases.

As a result, the current commands idq1* on d-q axes calculated by the drive current calculation means 33 become greater values, and reverse torque further increases.

Hereafter, likewise, by reverse torque increasing, the deviation between the rotation speed command w* and the control speed wc further increases, and thereby reverse torque further increases. Thus, a negative chain arises.

Therefore, in the AC rotating machine control device having the drive current calculation means for calculating drive current for the AC rotating machine on the basis of the estimated rotation speed, eliminating reverse torque at the time of switching to sensorless control enables elimination of increase in reverse torque due to the drive current calculation means 33 in the case where error between the estimated rotational position and the actual rotational position of the AC rotating machine is 90 degrees or greater immediately after switching to sensorless control, thus providing a further significant effect.

The AC rotating machine control device in embodiment 7 of the present invention includes: an AC rotating machine; a rotational position sensor for detecting a rotational position of the AC rotating machine; sensor abnormality detection means for, when abnormality of the rotational position sensor has been continuously detected for a predetermined determination period, determining that the rotational position sensor is abnormal; rotational position estimation means for calculating an estimated rotational position of the AC rotating machine when the rotational position sensor is determined to be abnormal; power limiting means for limiting drive power supplied for driving the AC rotating machine; and power feed means for, when the sensor abnormality determination means determines that the rotational position sensor is abnormal, on the basis of the estimated rotational position, supplying the AC rotating machine with power obtained by adding rotational position estimation power supplied for the rotational position estimation means to estimate the rotational position, to the drive power limited by the power limiting means. After the sensor abnormality determination means detects the abnormality, the power limiting means starts to limit the drive power by a time when the sensor abnormality determination means determines that the abnormality occurs, and limits the drive power at least during a predetermined period that allows estimated error of the estimated rotational position to fall within a predetermined range. The AC rotating machine control device includes: drive power calculation means for calculating the drive power; and rotation speed calculation means for calculating the rotation speed of the AC rotating machine. The drive power calculation means calculates the drive power on the basis of the rotation speed. In the case where error between the estimated rotational position and the actual rotational position of the AC rotating machine is 90 degrees or greater immediately after switching to sensorless control, reverse torque acting in the direction opposite to desired torque of the AC rotating machine is further increased by the drive current calculation means. Therefore, the feature that, while the magnitude of torque required for the AC rotating machine equally before and after occurrence of abnormality is intentionally reduced, the period of the reduction is minimized, and reverse torque acting in the direction opposite to desired torque of the AC rotating machine is eliminated or failure of the AC rotating machine or the drive circuit for the AC rotating machine due to overcurrent is prevented, provides a further significant effect.

In the present embodiment 7, the drive current calculation means for calculating drive current for the AC rotating machine on the basis of the estimated rotation speed is provided. However, the drive current may be calculated on the basis of another status amount according to the rotation speed.

That is, the drive power calculation means may calculate the drive power on the basis of the status amount according to the rotation speed of the AC rotating machine, whereby the same effect can be obtained.

For example, in the configuration in which output torque of the AC rotating machine 1 is transmitted to a load device via a gear and a transmission shaft, a rotation speed wL on the load device side may be detected, and on the basis of a rotation speed command wL* and the rotation speed wL, the drive current calculation means may calculate such current commands idq1* on d-q axes as to cause the rotation speed wL to coincide with the rotation speed command wL*.

Embodiment 8

In the above embodiments, the AC rotating machine control devices have been described. However, an electric power steering device may be configured by generating torque for assisting steering torque by the AC rotating machine control device.

The electric power steering device requires high safety and reliability in light of its usage purpose.

In recent years, outputs of AC rotating machines provided to electric power steering devices have been further enhanced, and electric power steering devices are increasingly provided to not only small-sized and middle-sized vehicles but also large-sized vehicles having great weights. Thus, output torques of AC rotating machines of electric power steering devices tend to increase.

In the case where an AC rotating machine is suddenly stopped in an electric power steering device provided in a large-sized vehicle, or in the case where an AC rotating machine with high output is provided and reverse torque acting in the direction opposite to desired assist torque occurs, strange feeling of a driver is further increased because the torque is great, and thus the functionality is significantly deteriorated.

Further, in a general electric power steering device, assist torque of the AC rotating machine has the same direction as that of the steering torque, and increases as the steering torque of a driver increases. Therefore, if such reverse torque occurs when a driver increases turn of a steering wheel, the steering torque for increasing turn of the steering wheel by the driver is further increased by the reverse torque, and as a result, the assist torque further increases, thus causing such a negative chain that the state in which reverse torque increases and the driver has a strange feeling continues.

Therefore, a further significant effect can be obtained by applying, to an electric power steering device, the AC rotating machine control device described in embodiment 1 which continues to drive the AC rotating machine by reducing reverse torque or preventing failure of the AC rotating machine and the drive circuit for the AC rotating machine due to overcurrent, at the time of shifting to sensorless control in which the AC rotating machine is controlled on the basis of the estimated rotational position when abnormality has occurred in the rotational position sensor.

Figure 18:
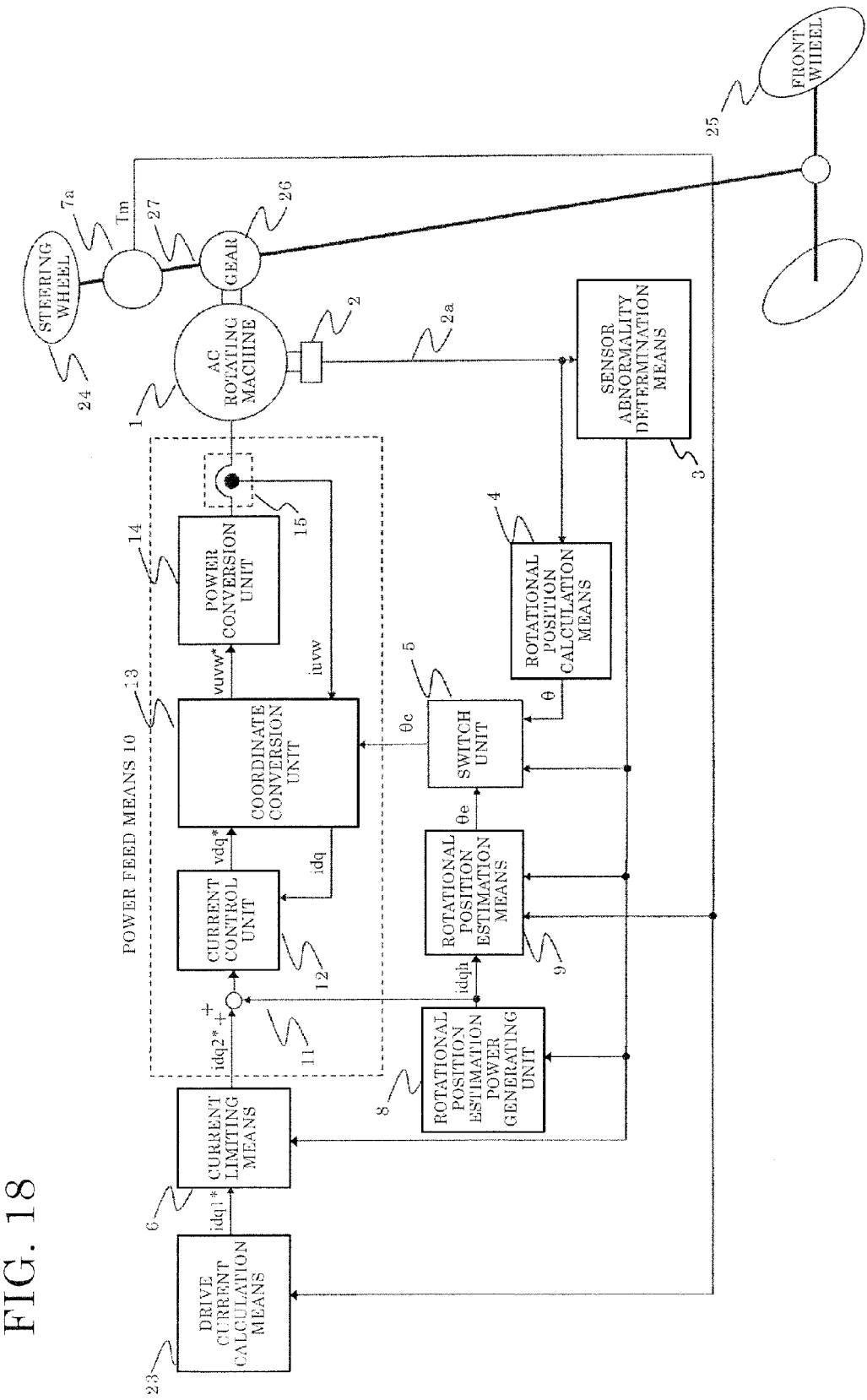
FIG. 18 is a diagram showing the entire configuration of an AC rotating machine control device in embodiment 8 of the present invention.

FIG. 18 is a diagram showing the entire configuration of an electric power steering device in embodiment 8 of the present invention, in which the same reference characters as those in embodiment 1 indicate the same or corresponding components.

A driver turns a steering wheel 34 rightward or leftward to steer a front wheel 35.

A gear 36 transmits output torque of the AC rotating machine 1 to a transmission shaft 37.

The transmission shaft 37 transmits the transmitted output torque of the AC rotating machine 1 to the steering wheel 34 and the front wheel 35, to assist steering of the driver.

Torque detection means 7f detects shaft torque acting on the transmission shaft 37 between the steering wheel 34 and the gear 36, as output torque Tm, and outputs the output torque Tm to rotational position estimation means 9f and drive current calculation means 33f.

On the basis of the output torque Tm, the drive current calculation means 33f calculates the current commands idq1* on d-q axes to be supplied to the AC rotating machine 1 so as to assist steering of the driver.

Figure 19:
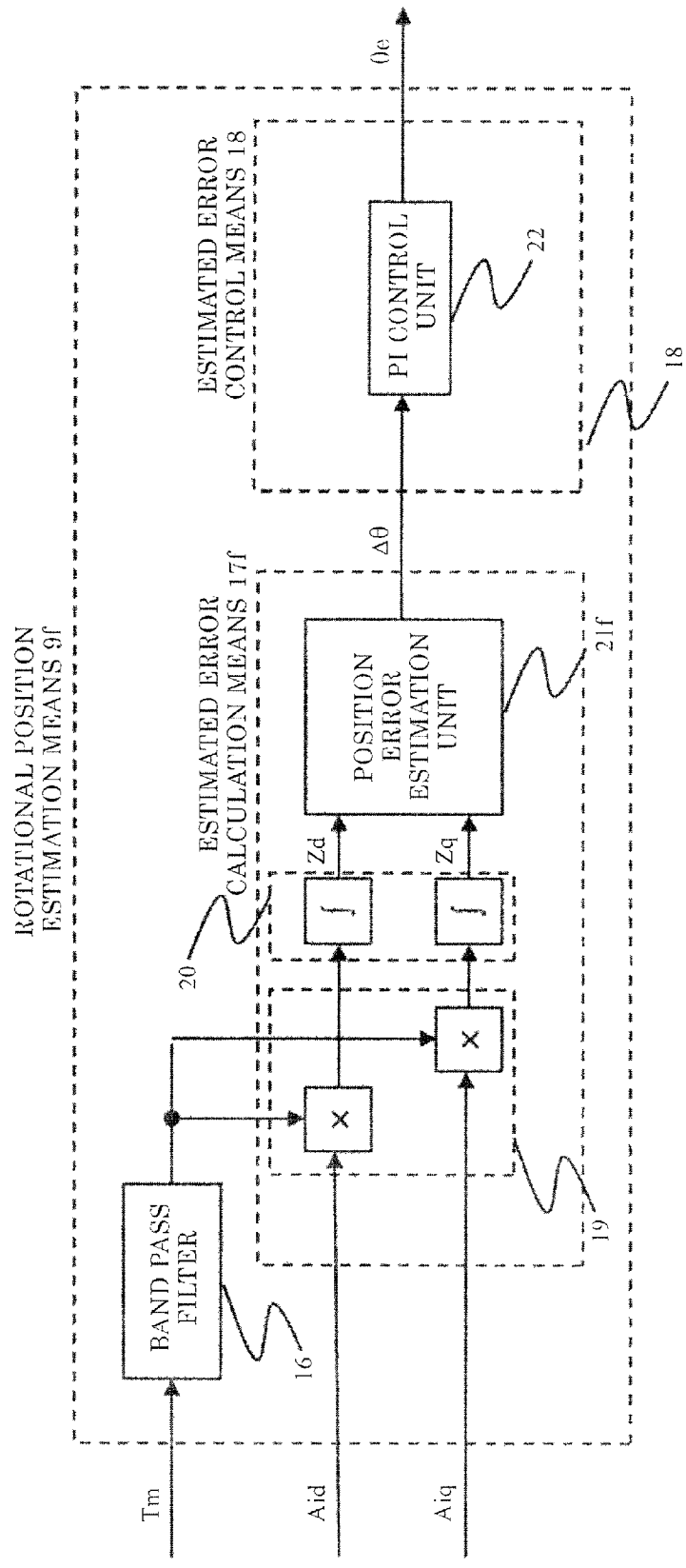
FIG. 19 is a diagram showing the configuration of rotational position estimation means 9f in embodiment 8 of the present invention.

FIG. 19 shows the internal configuration of the rotational position estimation means 9f.

A position error estimation unit 21f in estimated error calculation means 17f of the rotational position estimation means 9f subtracts a predetermined value θ0 from a position calculated from the arc tangent of a value obtained by dividing the integral value Zd outputted from the integration unit 20 by the integral value Zq, and outputs the resultant value as the rotational position estimated error Δθ.

The rotational position estimation means 9f is different from the rotational position estimation means 9 in embodiment 1 of the present invention only in that the rotational position estimation means 9f subtracts the predetermined value θ0.

Here, in the AC rotating machine control device in embodiment 1, the torque detection means 7 directly detects output torque on the output shaft of the AC rotating machine 1. However, the configuration of the electric power steering device in the present embodiment 3 has a problem that output torque detected by the torque detection means 7f has a predetermined phase difference depending on the frequency of torque, relative to torque on the output shaft of the AC rotating machine.

Therefore, the predetermined value θ0 corresponding to the phase difference is subtracted in the position error estimation unit 21f, whereby the estimated rotational position θe is calculated in consideration of the phase difference.

The frequency of the high-frequency currents Aid and Aiq on d-q axes superimposed in the power feed means 10 has a predetermined value sufficiently higher than the frequency of steering torque Th of the driver.

By the above configuration, the rotational position estimation means 9f is allowed to calculate the rotational position θ on the basis of the output torque Tm detected by the torque detection means 7f, and thus the electric power steering device can stably assist steering of the driver over the entire operation region of the AC rotating machine 1 without using a position sensor.

Hereinafter, the principle for calculating the rotational position estimated error Δθ by the estimated error calculation means 17f in the rotational position estimation means 9f with the above configuration will be described.

Figure 20:
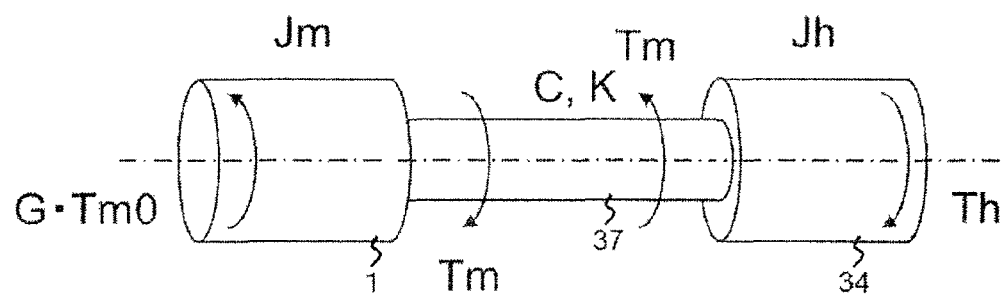
FIG. 20 is a diagram showing a mechanically equivalent structure as to the relationship among torques applied to an AC rotating machine 1, a steering wheel 34, and a transmission shaft 37 in embodiment 8 of the present invention.

FIG. 20 shows the relationship among torques applied to the AC rotating machine 1, the steering wheel 34, and the transmission shaft 37, by a mechanically equivalent structure. In FIG. 20, Jm and Jh respectively denote the moments of inertia of the AC rotating machine 1 and the steering wheel 34, C and K respectively denote the damping coefficient and the spring constant of the transmission shaft 37, Tm0 and Th respectively denote output torque of the AC rotating machine 1 on the output shaft thereof and steering torque of the driver, and G denotes the gear ratio of the gear 36.

As shown in FIG. 20, the relationship among the output torques Tm and Tm0 and the steering torque Th is as shown by Mathematical 11.

$$Tm = \left(C + \frac{K}{s}\right)\left(\frac{Tm0}{GJms} - \frac{Th}{Jhs}\right) \qquad \text{[Mathematical 11]}$$

Here, since the frequency of the high-frequency currents Aid and Aiq on d-q axes superimposed in the power feed means 10a has a value sufficiently higher than the frequency of the steering torque Th, the angular frequency wh component of the output torque Tm0 is set as an output torque high-frequency wave Tmhf0, and Mathematical 11 is expressed only for the angular frequency wh component, as shown by Mathematical 12.

$$Tmhf = \frac{1}{GJms}\left(C + \frac{K}{s}\right)Tmhf0 \qquad \text{[Mathematical 12]}$$

In Mathematical 12, G, Jm, C, and K are constants indicating the mechanical characteristics of the gear 36, the AC rotating machine 1, and the transmission shaft 37. Therefore, it is found that the phase difference between the output torque high-frequency waves Tmhf0 and Tmhf depends on only the frequency of the high-frequency currents Aid and Aiq on d-q axes.

Here, since the frequency of the high-frequency currents Aid and Aiq on d-q axes has a predetermined value, the output torque high-frequency waves Tmhf0 and Tmhf have the predetermined phase difference θ0.

Figure 21:
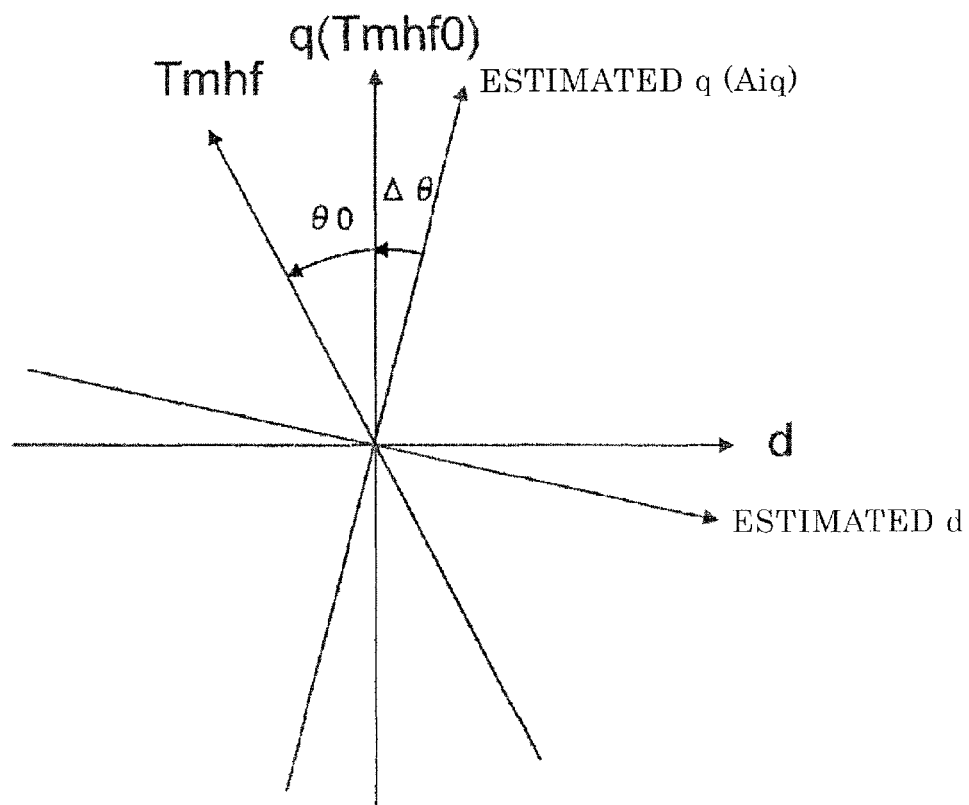
FIG. 21 is a diagram showing a phase relationship among an output torque high-frequency wave Tmhf0, high-frequency output torque Tmhf, and estimated d-q axes on which high-frequency currents Aid and Aiq on d-q axes are supplied, in embodiment 8 of the present invention.

That is, the phase relationship among: the output torque high-frequency wave Tmhf0 representing the output shaft of the AC rotating machine 1, i.e., the actual d-q axes of the AC rotating machine 1; the high-frequency output torque Tmhf which is a high-frequency component of the output torque Tm detected by the torque detection means 7f; and the estimated d-q axes on which the high-frequency currents Aid and Aiq on d-q axes are supplied, can be represented as shown in FIG. 21.

Therefore, in the position error estimation unit 21f in the estimated error calculation means 17f, first, by the same method as in the position error estimation unit 21 in the above embodiments, the phase difference between the high-frequency output torque Tmhf and the high-frequency current Aiq on q-axis is calculated, and the predetermined phase difference θ0 is subtracted therefrom, thereby obtaining the rotational position estimated error Δθ which is the phase difference between the actual d-q axes and the estimated d-q axes.

Thus, even in the case where the output torque detected by the torque detection means 7f has a predetermined phase difference from output torque on the output shaft of the AC rotating machine 1, the rotational position estimation means 9f can calculate the rotational position estimated error Δθ by subtracting the predetermined phase difference from a position calculated from an arc tangent function on the basis of the relationship between outputs of the integration unit 20 by the position error estimation unit 21, whereby the estimated rotational position θe can be calculated.

Subsequently, the method for the drive current calculation means 33f to calculate the current commands idq1* on d-q axes to be supplied to the AC rotating machine 1 so as to assist steering of the driver will be described.

A general electric power steering device is set so that the assist torque of the AC rotating machine 1 increases as the steering torque of the driver increases.

That is, the steering torque Th of the driver can be represented as shown by Mathematical 13.

In Mathematical 13, Ka is a predetermined value set on the basis of assist torque required for the electric power steering device.

$$Tm0 = KaTh \qquad \text{Mathematical 13}$$

By substituting Mathematical 13 into Mathematical 11, Mathematical 14 is obtained.

$$Tm1 = \left(C + \frac{K}{s}\right)\left(\frac{Ka}{GJms} - \frac{1}{Jhs}\right)Th \qquad [\text{Mathematical 14}]$$

That is, the output torque Tm outputted from the torque detection means 7f can be regarded as a value correlated with the steering torque Th.

Therefore, the drive current calculation means 33 calculates the current commands idq1* on d-q axes as shown by Mathematical 16 so that the output torque of the AC rotating machine 1 is represented by Mathematical 15.

In Mathematical 15, Ka' is a predetermined value set on the basis of Ka and assist torque required on the electric power steering device. In Mathematical 16, Kt denotes a torque constant of the AC rotating machine 1.

$$Tm0 = Ka'Tm \qquad [\text{Mathematical 15}]$$

$$\begin{aligned} id1^* &= 0 \\ iq1^* &= \frac{Tm}{Kt} = \frac{Ka'}{Kt}Tm \end{aligned} \qquad [\text{Mathematical 16}]$$

Thus, the drive current calculation means 33f can calculate the current commands idq1* on d-q axes suitable for the electric power steering device so that output torque of the AC rotating machine 1 has the same direction as that of the steering torque and increases as the steering torque of the driver increases.

In addition, with the same configuration as that of the current limiting means 6 in embodiment 1, the current limiting means 6 limits the current commands idq1* on d-q axes, whereby reverse torque can be eliminated and overcurrent can be prevented at the time of shifting to sensorless control.

The d-q axis current limiting value idqlim is set so as to gradually increase with time, to finally reach the rated current.

Therefore, torque of the AC rotating machine 1 does not sharply change, and problems such as impact to a load device of the AC rotating machine, resonance of the AC rotating machine 1 and the load device, or hunting, due to sharp change in torque can be prevented.

However, if the slope is mild, return to the torque originally required for the AC rotating machine 1 is delayed. Therefore, the slope may be designed depending on the usage purpose of the AC rotating machine 1.

Thus, the current limiting means 6 limits the current commands idq1* on d-q axes, thereby reducing reverse torque or preventing overcurrent at the time of switching to sensorless control in which the power feed means 10a supplies power to the AC rotating machine on the basis of the estimated rotational position θe when abnormality has occurred in the rotational position sensor 2.

That is, it is possible to obtain an electric power steering device in which the current limiting means 6 limits the current commands idq1* on d-q axes, thereby reducing reverse torque or preventing overcurrent at the time of switching to sensorless control in which the power feed means 10a supplies power to the AC rotating machine on the basis of the estimated rotational position θe when abnormality has occurred in the rotational position sensor 2.

That is, the electric power steering device in embodiment 8 of the present invention is provided with an AC rotating machine control device including: an AC rotating machine; a rotational position sensor for detecting a rotational position of the AC rotating machine; sensor abnormality detection means for, when abnormality of the rotational position sensor has been continuously detected for a predetermined determination period, determining that the rotational position sensor is abnormal; rotational position estimation means for calculating an estimated rotational position of the AC rotating machine when the rotational position sensor is determined to be abnormal; power limiting means for limiting drive power supplied for driving the AC rotating machine; and power feed means for, when the sensor abnormality determination means determines that the rotational position sensor is abnormal, on the basis of the estimated rotational position, supplying the AC rotating machine with power obtained by adding rotational position estimation power supplied for the rotational position estimation means to estimate the rotational position, to the drive power limited by the power limiting means. After the sensor abnormality determination means detects the abnormality, the power limiting means starts to limit the drive power by a time when the sensor abnormality determination means determines that the abnormality occurs, and limits the drive power at least during a predetermined period that allows estimated error of the estimated rotational position to fall within a predetermined range.

In the electric power steering device, reverse torque acting in the direction opposite to desired torque of the AC rotating machine gives a strange feeling to a driver and significantly deteriorates the functionality. Therefore, the feature that, while the magnitude of torque required for the AC rotating machine equally before and after occurrence of abnormality is intentionally reduced, the period of the reduction is minimized, and reverse torque acting in the direction opposite to desired torque of the AC rotating machine is eliminated or failure of the AC rotating machine or the drive circuit for the AC rotating machine due to overcurrent is prevented, provides a further significant effect.

Further, since the power limiting means limits the drive power so that current supplied to the AC rotating machine becomes zero, reverse torque due to an estimated position having great error and due to large current, and large current that causes overcurrent, can be minimized.

Further, in the electric power steering device, as shown by Mathematical 15, torque outputted from the AC rotating machine 1 is set to have the same direction as that of the steering torque and increase as the steering torque of a driver increases. Therefore, if such reverse torque occurs when a driver increases turn of the steering wheel 34, the steering torque for increasing turn of the steering wheel 34 by the driver is further increased by the reverse torque, and as a result, the assist torque further increases, whereby reverse torque increases and the strange feeling of the driver increases, thus causing a negative chain in which such a situation continues.

Thus, limiting the current commands idq1* on d-q axes so as to reduce reverse torque by the current control means 6 provides a further significant effect.

That is, the electric power steering device includes: the AC rotating machine control device having the drive power calculation means for calculating the drive power; and torque detection means for detecting steering torque applied to a steering wheel, wherein the drive power calculation means calculates the drive power on the basis of the steering torque which is a status amount according to output torque of the AC rotating machine. In the case where error between the estimated rotational position and the actual rotational position of the AC rotating machine is 90 degrees or greater immediately after switching to sensorless control, reverse torque acting in the direction opposite to desired torque of the AC rotating machine is further increased by the drive current calculation means. Therefore, the feature that, while the magnitude of torque required for the AC rotating machine equally before and after occurrence of abnormality is intentionally reduced, the period of the reduction is minimized, and reverse torque acting in the direction opposite to desired torque of the AC rotating machine is eliminated or failure of the AC rotating machine or the drive circuit for the AC rotating machine due to overcurrent is prevented, provides a further significant effect.

Further, in the electric power steering device, if output torque of the AC rotating machine 1 sharply increases, the applied steering torque suddenly decreases.

When such sudden decrease in the steering torque occurs during travelling, the driver is hindered from performing desired steering of a vehicle, and thus the driver has a strange feeling.

Therefore, if the d-q axis current limiting value idqlim which is a limiting value for limiting the current commands idq1* on d-q axes is set so as to gradually increase with time from time t2 in the current limiting means 6, a further significant effect is obtained in the electric power steering device.

In the present embodiment 8, the rotational position estimation means 9f calculates the estimated rotational position θe on the basis of response in the output torque Tm when the high-frequency current is supplied to the AC rotating machine 1. However, the estimated rotational position θe may be calculated in another method. The method therefor is not limited.

Time t2 is a sufficient time by which error of the estimated rotational position θe calculated by the rotational position estimation means 9 relative to the actual rotational position becomes 90 degrees or smaller, and the predetermined period Δt12 is composed of the (period since rotational position estimation is started until error converges within 90 degrees). However, time t2 may be a sufficient time by which error of the estimated rotational position θe calculated by the rotational position estimation means 9 relative to the actual rotational position becomes an arbitrary predetermined error or smaller, and the predetermined period Δt12 may be composed of a (period since rotational position estimation is started until error converges within arbitrary predetermined error).

In the case where error of the control angle θc is equal to or smaller than 90 degrees, torque of the AC rotating machine 1 becomes smaller than desired torque as the error increases, and in the case where the error is 90 to 180 degrees, reverse torque opposite to desired torque increases as the error increases.

Therefore, if not only reverse torque but also torque reduction cannot be tolerated, the predetermined error may be determined in accordance with such error between the control angle θc and the actual rotational position as to cause intolerable torque.

If reverse torque is tolerable to a certain extent, the predetermined error may be determined depending on error between the control angle θc at which reverse torque becomes a tolerable level, and the actual rotational position.

In this case, the (period since rotational position estimation is started until error converges within predetermined error) is the longest time taken since the rotational position estimation means 9f starts to calculate the estimated rotational position θe on the basis of the rotational position signal until error between the estimated rotational position θe and the rotational position converges within the predetermined error. Considering the worst case where error between the estimated rotational position θe and the actual rotational position of the AC rotating machine is 180 degrees when the rotational position estimation means 9f starts to calculate the estimated rotational position θe, the time taken until the error of the estimated rotational position θe reduces to the predetermined error may be measured or calculated in advance.

The d-q axis current limiting value idqlim which is a limiting value for limiting the current commands idq1* on d-q axes in the current limiting means 6 is set so as to gradually increase with time from time t2. However, in the case where influence due to sharp change in torque is not a problem and it is desired to restore torque as early as possible, the d-q axis current limiting value idqlim may be set so as to sharply increase from time t2.

The (period since rotational position estimation power is supplied until estimated rotational position is calculated) and the (period since rotational position estimation is started until error converges within 90 degrees) which compose the predetermined period Δt12 during which the d-q axis current limiting value idqlim which is a limiting value for limiting the current commands idq1* on d-q axes in the current limiting means 6 is set to zero, are set to the respective longest times that can be taken. However, depending on a condition, the longest time that can be taken in the condition may be set in a switched manner. Regarding the predetermined period Δt12 during which the d-q axis current limiting value idqlim is set to zero in the present embodiment 8, the (period since rotational position estimation power is supplied until estimated rotational position is calculated) which composes the predetermined period Δt12 can vary depending on, for example, the temperature characteristics of the torque detection means.

Therefore, for example, the temperature of the torque detection means may be detected, and depending on the temperature, the longest time of the (period since rotational position estimation power is supplied until estimated rotational position is calculated) at the temperature may be set in a switched manner.

The d-q axis current limiting value idqlim which is a limiting value for limiting the current commands idq1* on d-q axes in the current limiting means 6 is set as shown in FIG. 4. However, as shown in FIG. 5, the d-q axis current limiting value idqlim may be set so as to perform limitation to zero between time t0 and time t1.

In this case, the sensor abnormality determination means 3 needs to output not only presence/absence of abnormality of the rotational position sensor but also an abnormality detection status of the rotational position sensor 2, specifically, the duration of abnormality detection of the rotational position sensor 2. Thus, by performing limitation to zero between time t0 and time t1, it becomes possible to reduce reverse torque and overcurrent in the period since abnormality occurs in the rotational position sensor 2 until the sensor abnormality inversion means determines that the rotational position sensor 2 is abnormal.

However, as described above, in the case where the sensor abnormality determination means 3 detects abnormality of the rotational position sensor 2 but actually the rotational position sensor 2 is not abnormal, current supplied to the AC rotating machine varies to cause torque variation even though the rotational position sensor 2 is not abnormal.

The d-q axis current limiting value idqlim which is a limiting value for limiting the current commands idq1* on d-q axes in the current limiting means 6 may be set so as to gradually decrease with time from the start of limitation as shown in FIG. 6.

In the electric power steering device, if output torque of the AC rotating machine 1 sharply decreases, the applied steering torque suddenly increases.

When such sudden increase in the steering torque occurs during travelling, the driver is hindered from performing desired steering of a vehicle, and thus the driver has an increased strange feeling.

Therefore, if the d-q axis current limiting value idqlim which is a limiting value for limiting the current commands idq1* on d-q axes is set so as to gradually decrease with time from time t2 in the current limiting means 6, a further significant effect is obtained in the electric power steering device. However, if error of the control angle relative to the actual rotational position of the AC rotating machine is great, reverse torque increases as the slope of the decrease becomes milder.

The d-q axis current limiting value idqlim which is a limiting value for limiting the current commands idq1* on d-q axes in the current limiting means 6 may be set so as to perform limitation to a value other than zero as shown in FIG. 7.

For example, in an electric power steering device provided with: an AC rotating machine having such performance that large current at the time of shifting to sensorless control does not lead to failure; and an AC rotating machine drive device, the lower limit value of the d-q axis current limiting value idqlim may be set to be equal to or smaller than 10% of the rated current of the AC rotating machine.

That is, the power limiting means may limit the drive power so that current supplied to the AC rotating machine becomes equal to or smaller than 10% of the rated current of the AC rotating machine.

In a general electric power steering device, as described above, assist torque outputted from the AC rotating machine increases as the steering torque increases, and when the steering torque is about 5 Nm, the rated torque of the AC rotating machine is reached and the assist torque reaches its upper limit value.

That is, when the steering torque is 5 Nm, the assist torque corresponding to the rated current of the AC rotating machine is needed. In other words, the steering torque 5 Nm is considered to be an upper limit value that allows a human to perform comfortable steering.

Therefore, as long as reverse torque is 5 Nm or smaller, a human can steer a vehicle as intended without hampering travelling, and this value corresponds to 10% or smaller of the rated torque of an AC rotating machine in a general electric power steering device.

By limiting power supplied to the AC rotating machine at the time of shifting to sensorless control, if error of the control angle relative to the actual rotational position of the AC rotating machine is great during this period, reverse torque can be reduced and overcurrent can be prevented. Meanwhile, if error of the control angle is small, power to be originally supplied to the AC rotating machine is limited, whereby the functionality deteriorates. Thus, there is a trade-off relationship.

Therefore, in the electric power steering device, if the lower limit value of the d-q axis current limiting value idqlim is set to 10% of the rated current of the AC rotating machine, at the time of shifting to sensorless control, reverse torque in the case where error of the control angle relative to the actual rotational position of the AC rotating machine is great can be suppressed within a tolerable range, and reduction in the assist torque in the case where the error of the control angle is small can be minimized. Thus, optimal functionality can be obtained.

The current limiting means 6 limits the current commands idq1* on d-q axes, to prevent reverse torque and overcurrent of the AC rotating machine 1. However, current commands on arbitrary coordinate axes rotating or at rest with respect to the AC rotating machine may be limited, or current commands for U, V, W phases in a coordinate system at rest with respect to the AC rotating machine may be limited. Thus, the current commands to be limited by the current limiting means may be on any coordinate axes. In such a case, by limiting currents on coordinate axes as in the current command limiting manner by the current limiting means 6 in the present embodiment 1, reverse torque and overcurrent can be prevented irrespective of the coordinate axes of the current commands to be limited, and the same effect can be obtained. However, the rotational position estimation power needs to be added to the current that has been limited by the current limiting means.

In FIG. 18, an electric power steering has been described as an example. However, the steering wheel 34 may be replaced with a moment of inertia other than a steering wheel, and needless to say, the same effect can be obtained even in a control device known as a so-called two-inertia system other than an electric power steering.

It is noted that, within the scope of the present invention, the above embodiments may be freely combined with each other, or each of the above embodiments may be modified or abbreviated as appropriate.

DESCRIPTION OF THE REFERENCE CHARACTERS

1 AC rotating machine
2 rotational position sensor
2a signal line
3 sensor abnormality determination means
4 rotational position calculation means
5 switch unit
6 current limiting means
7 torque detection means
8 rotational position estimation power generating unit
9 rotational position estimation means
10 power feed means
11 high-frequency superimposing unit
12 current control unit
13 coordinate conversion unit
14 power conversion unit
15 current detection unit
16 band pass filter
17 estimated error calculation means
18 estimated error control means
19 multiplication unit
20 integration unit
21 position error estimation unit
22 PI control unit
23 pulse width modulation control unit
24 inverter
25 initial rotational position estimation power generating unit
26 initial rotational position estimation means
27 gate signal generation unit
28 power limiting means
29 induced voltage estimation means
30 position switch unit
31 speed estimation unit
32 rotation speed calculation means
33 drive current calculation means
34 steering wheel
35 front wheel
36 gear
37 transmission shaft
38 to 43 semiconductor switch
44 DC voltage source

The invention claimed is:

1. An AC rotating machine control device comprising:
an AC rotating machine;
a rotational position sensor for detecting a rotational position of the AC rotating machine;
sensor abnormality determination device for performing determination as to abnormality of the rotational position sensor;
rotational position estimator for calculating an estimated rotational position of the AC rotating machine when the rotational position sensor is determined to be abnormal;
power limiting control for limiting drive power supplied for driving the AC rotating machine; and
power feed for, when the sensor abnormality determination device determines that the rotational position sensor is abnormal, on the basis of the estimated rotational position, supplying the AC rotating machine with power obtained by adding rotational position estimation power supplied for the rotational position estimator to estimate the rotational position, to the drive power limited by the power limiting control, wherein
the power limiting control limits the drive power by a predetermined value at least during a predetermined period since the sensor abnormality determination device determines that the abnormality occurs until estimated error of the estimated rotational position falls within a predetermined range, and thereafter, limits the drive power so as to be increased from the predetermined value for limiting the drive power.

2. The AC rotating machine control device according to claim 1, further comprising torque detector for detecting output torque of the AC rotating machine, wherein
the rotational position estimation power is high-frequency power, and
the rotational position estimator calculates the estimated rotational position on the basis of a high-frequency component contained in the output torque and a high-frequency component corresponding to the high-frequency power.

3. The AC rotating machine control device according to claim 1, further comprising current detector for acquiring detected current of the AC rotating machine, wherein
the AC rotating machine has saliency,
the rotational position estimation power is high-frequency power, and
the rotational position estimator calculates the estimated rotational position on the basis of a high-frequency component contained in the detected current.

4. The AC rotating machine control device according to claim 1, further comprising current detector for acquiring detected current of the AC rotating machine, wherein
the rotational position estimation power is such power as to magnetically saturate a winding of the AC rotating machine, and
the rotational position estimator calculates the estimated rotational position on the basis of a relationship between voltage and current of the AC rotating machine.

5. The AC rotating machine control device according to claim 1, further comprising current detector for acquiring detected current of the AC rotating machine, wherein
the rotational position estimation power is such voltage as to short-circuit a winding of the AC rotating machine, and
the rotational position estimator calculates the estimated rotational position on the basis of the detected current.

6. The AC rotating machine control device according to claim 1, wherein
the power limiting control limits the drive power so as to be sharply decreased to a predetermined limiting value.

7. The AC rotating machine control device according to claim 1, wherein
the power limiting control limits the drive power so as to be gradually decreased with time to a predetermined limiting value.

8. The AC rotating machine control device according to claim 1, wherein
the power limiting control limits the drive power so as to be gradually increased with time from a predetermined limiting value.

9. The AC rotating machine control device according to claim 1, wherein
the power limiting control limits the drive power so that current supplied to the AC rotating machine becomes zero.

10. The AC rotating machine control device according to claim 1, further comprising drive power calculator for calculating the drive power, wherein
the drive power calculator calculates the drive power on the basis of at least one of a status amount according to a rotation speed of the AC rotating machine and a status amount according to output torque of the AC rotating machine.

11. The AC rotating machine control device according to claim 10, further comprising rotation speed calculator for calculating a rotation speed of the AC rotating machine, wherein
the drive power calculator that calculates the drive power on the basis of the rotation speed.

12. An electric power steering device comprising:
torque detector for detecting steering torque applied to a steering wheel; and
the AC rotating machine control device according to claim 10, wherein
the drive power calculator that calculates the drive power on the basis of the steering torque.

13. The electric power steering device according to claim 12, wherein
the power limiting control limits the drive power so that current supplied to the AC rotating machine becomes equal to or smaller than 10% of rated current of the AC rotating machine.

14. An electric power steering device comprising the AC rotating machine control device according to claim 1.

15. An AC rotating machine control device comprising:
an AC rotating machine;
a rotational position sensor for detecting a rotational position of the AC rotating machine;
sensor abnormality determination device for determining that the rotational position sensor is abnormal, when abnormality of the rotational position sensor has been continuously detected for a predetermined determination period;
rotational position estimator for calculating an estimated rotational position of the AC rotating machine when the rotational position sensor is determined to be abnormal;
power limiting control for limiting drive power supplied for driving the AC rotating machine; and
power feed for, when the sensor abnormality determination device determines that the rotational position sensor is abnormal, on the basis of the estimated rotational position, supplying the AC rotating machine with power obtained by adding rotational position estimation power supplied for the rotational position estimator to estimate the rotational position, to the drive power limited by the power limiting control, wherein
after the sensor abnormality determination device detects the abnormality, the power limiting control starts to limit the drive power by a time when the sensor abnormality determination device determines that the abnormality occurs, and limits the drive power by a predetermined value at least during a predetermined period that allows estimated error of the estimated rotational position to fall within a predetermined range, and thereafter, limits the drive power so as to be increased from the predetermined value for limiting the drive power.

16. An AC rotating machine control device comprising:
an AC rotating machine;
a rotational position sensor for detecting a rotational position of the AC rotating machine;
sensor abnormality determination device for performing determination as to abnormality of the rotational position sensor;
rotational position estimator for calculating an estimated rotational position of the AC rotating machine when the rotational position sensor is determined to be abnormal;
power limiting control for limiting drive power supplied for driving the AC rotating machine;
induced voltage acquiring device for acquiring induced voltage of the AC rotating machine; and
power feed for, when the sensor abnormality determination device determines that the rotational position sensor is abnormal, on the basis of the estimated rotational position, supplying the AC rotating machine with the drive power limited by the power limiting control, wherein
the power limiting control limits the drive power, below a drive power that would be supplied to the AC rotating machine if no abnormality of the rotational sensor is determined, since the sensor abnormality determination device determines that the abnormality occurs at least until the induced voltage of the AC rotating machine becomes equal to or smaller than a predetermined value.

17. An AC rotating machine control device comprising:
an AC rotating machine;
a rotational position sensor for detecting a rotational position of the AC rotating machine;
sensor abnormality determination device for determining that the rotational position sensor is abnormal, when abnormality of the rotational position sensor has been continuously detected for a predetermined determination period;
rotational position estimator for calculating an estimated rotational position of the AC rotating machine when the rotational position sensor is determined to be abnormal;
power limiting control for limiting drive power supplied for driving the AC rotating machine;
induced voltage acquiring device for acquiring induced voltage of the AC rotating machine; and
power feed for, when the sensor abnormality determination device determines that the rotational position sensor is abnormal, on the basis of the estimated rotational position, supplying the AC rotating machine with the drive power limited by the power limiting control, wherein
after the sensor abnormality determination device detects the abnormality, the power limiting control starts to limit the drive power, below a drive power that would be supplied to the AC rotating machine if no abnormality of the rotational sensor is determined, by a time when the sensor abnormality determination device determines that the abnormality occurs, and limits the drive power at least until the induced voltage of the AC rotating machine becomes equal to or smaller than a predetermined value.

* * * * *